US012757783B2

(12) United States Patent
Su

(10) Patent No.: US 12,757,783 B2
(45) Date of Patent: Oct. 6, 2026

(54) SEMICONDUCTOR DEVICE WITH SLANTED CONDUCTIVE LAYERS AND METHOD FOR FABRICATING THE SAME

(71) Applicant: NANYA TECHNOLOGY CORPORATION, New Taipei City (TW)

(72) Inventor: Kuo-Hui Su, Taipei City (TW)

(73) Assignee: NANYA TECHNOLOGY CORPORATION, New Taipei City (TW)

( * ) Notice: Subject to any disclaimer, the term of this patent is extended or adjusted under 35 U.S.C. 154(b) by 364 days.

(21) Appl. No.: 18/536,605

(22) Filed: Dec. 12, 2023

(65) Prior Publication Data

US 2025/0140675 A1 May 1, 2025

Related U.S. Application Data

(62) Division of application No. 18/385,979, filed on Nov. 1, 2023.

(51) Int. Cl.
*H10W 70/65* (2026.01)
*H10W 70/685* (2026.01)
(Continued)

(52) U.S. Cl.
CPC ......... *H10W 70/65* (2026.01); *H10W 70/685* (2026.01); *H10W 90/00* (2026.01); *H10W 90/297* (2026.01); *H10W 90/734* (2026.01)

(58) Field of Classification Search
CPC ... H10W 70/65; H10W 70/685; H10W 90/00; H10W 90/297; H10W 90/734
See application file for complete search history.

(56) References Cited

U.S. PATENT DOCUMENTS 7,169,676 B1 * 1/2007 Zhong .................. H10P 30/222 257/E21.507
2001/0017400 A1 * 8/2001 Sasaki .................. H10D 64/112 257/652

(Continued)

FOREIGN PATENT DOCUMENTS

TW 200428577 A 12/2004
TW 200507037 A 2/2005

(Continued)

OTHER PUBLICATIONS

Office Action and and the search report mailed on Jan. 10, 2025 related to Taiwanese Application No. 113102753.

(Continued)

*Primary Examiner* — Mekonnen D Dagnew
(74) *Attorney, Agent, or Firm* — Xuan Zhang

(57) ABSTRACT

The present application discloses a semiconductor device including a first die and a second die. The first die includes a first dielectric layer disposed over a first substrate, a second dielectric layer disposed over the first dielectric layer, a first metal layer disposed in the first dielectric layer, and a first conductive via disposed in the second dielectric layer. The first conductive via includes conductive layers and a top conductive layer electrically coupled to the conductive layers. Each of the plurality of conductive layers are extended along a direction. The direction and a top surface of the first die form an acute angle greater than 0 degrees. The second die is bonded to the first die by bonding the second conductive via to the first conductive via.

11 Claims, 50 Drawing Sheets

(51) Int. Cl.
*H10W 90/00* (2026.01)
*H10W 90/20* (2026.01)

(56) References Cited

U.S. PATENT DOCUMENTS

| | | | | |
|---|---|---|---|---|
| 2010/0221889 | A1* | 9/2010 | Youn .................... | H10B 12/312<br>257/E21.011 |
| 2020/0365479 | A1 | 11/2020 | Chiu et al. | |
| 2022/0093456 | A1 | 3/2022 | Wang et al. | |
| 2023/0260978 | A1 | 8/2023 | Kuo et al. | |
| 2023/0282514 | A1 | 9/2023 | Peng et al. | |

FOREIGN PATENT DOCUMENTS

| | | | |
|---|---|---|---|
| TW | 202010020 | A | 3/2020 |
| TW | 202127620 | A | 7/2021 |
| TW | 202211465 | A | 3/2022 |
| TW | 202211480 | A | 3/2022 |
| TW | 202226605 | A | 7/2022 |
| TW | 202243126 | A | 11/2022 |
| TW | 202301547 | A | 1/2023 |
| TW | 202310288 | A | 3/2023 |

OTHER PUBLICATIONS

Summary translation of Office Action and and the search report mailed on Jan. 10, 2025 related to Taiwanese Application No. 113102753.

Office Action and and the search report mailed on Apr. 23, 2025 related to Taiwanese Application No. 113120779.

Summary translation of Office Action and and the search report mailed on Apr. 23, 2025 related to Taiwanese Application No. 113120779.

* cited by examiner

SEMICONDUCTOR DEVICE WITH SLANTED CONDUCTIVE LAYERS AND METHOD FOR FABRICATING THE SAME

CROSS-REFERENCE TO RELATED APPLICATION

This application is a divisional application of U.S. Non-Provisional application Ser. No. 18/385,979 filed Nov. 1, 2023, which is incorporated herein by reference in its entirety.

TECHNICAL FIELD

The present disclosure relates to a semiconductor device and a method for fabricating a semiconductor device, and more particularly, to a semiconductor device and a method for fabricating a semiconductor device with slanted conductive layers.

DISCUSSION OF THE BACKGROUND

Semiconductor devices are used in a variety of electronic applications, such as personal computers, cellular telephones, digital cameras, and other electronic equipment. The dimensions of semiconductor devices are continuously being scaled down to meet the increasing demand of computing ability. However, a variety of issues arise during the scaling-down process, and such issues are continuously increasing. Therefore, challenges remain in achieving improved quality, yield, performance, and reliability and reduced complexity.

This Discussion of the Background section is provided for background information only. The statements in this Discussion of the Background are not an admission that the subject matter disclosed in this section constitutes prior art to the present disclosure, and no part of this Discussion of the Background section may be used as an admission that any part of this application, including this Discussion of the Background section, constitutes prior art to the present disclosure.

SUMMARY

One aspect of the present disclosure provides a semiconductor device including a first die and a second die. The first die includes a first dielectric layer disposed over a first substrate, a second dielectric layer disposed over the first dielectric layer, a first metal layer disposed in the first dielectric layer, and a first conductive via disposed in the second dielectric layer. The firs conductive via includes conductive layers and a top conductive layer electrically coupled to the conductive layers. Each of the plurality of conductive layers are extended along a direction. The direction and a top surface of the first die form an acute angle greater than 0 degrees. The second die is bonded to the first die by bonding the second conductive via to the first conductive via.

Another aspect of the present disclosure provides a semiconductor device including a bottom portion and an upper portion. The bottom portion includes a first stack structure, a first impurity region, and a conductive plug. The upper portion is disposed over the bottom portion, and includes a second stack structure and a second impurity region. The first stack structure includes gate assemblies coupled to the first impurity region, and the second stack structure includes capacitor sub-units coupled to the second impurity region. The first impurity region is electrically coupled to the second impurity region through the conductive plug. The conductive plug includes conductive layer and a top conductive layer electrically coupled to the conductive layers. Each of the plurality of conductive layers are extended along a direction. The direction and a top surface of the top conductive layer form an acute angle.

Another aspect of the present disclosure provides a method for fabricating a semiconductor device including: forming a first die, forming a second die; and bonding the second die to the first die. Forming the first die includes: forming a first dielectric layer over a first substrate; forming a first metal layer in the first dielectric layer; forming a second dielectric layer over the first dielectric; and forming a first conductive via in the second dielectric layer. Forming the first conductive via in the second dielectric layer includes: forming a third dielectric layer in the second dielectric layer; performing a first slanted etch process to form a plurality of first openings in the third dielectric; forming a plurality of first conductive layers in the plurality of first openings; and forming a first top conductive layer over the plurality of first conductive layers and the third dielectric layer. The first conductive layers are extended along a first direction, wherein the first direction and a top surface of the first die form a first acute angle greater than 0 degrees.

Due to the design of the semiconductor device of the present disclosure, the first slanted conductive layers may provide more contact surface to the substrate. Therefore, the electrical characteristics of the semiconductor device may be improved. That is, the performance of the semiconductor device may be improved. In addition, the narrower first slanted recesses may be formed using first hard mask layer having wider first hard mask openings. In other words, the requirements of photolithography process for forming the narrower first slanted recesses may be alleviated. As a result, the yield of the semiconductor device may be improved.

The foregoing has outlined rather broadly the features and technical advantages of the present disclosure in order that the detailed description of the disclosure that follows may be better understood. Additional features and advantages of the disclosure will be described hereinafter and form the subject of the claims of the disclosure. It should be appreciated by those skilled in the art that the conception and specific embodiment disclosed may be readily utilized as a basis for modifying or designing other structures or processes for carrying out the same purposes of the present disclosure. It should also be realized by those skilled in the art that such equivalent constructions do not depart from the spirit and scope of the disclosure as set forth in the appended claims.

BRIEF DESCRIPTION OF THE DRA WINGS

Aspects of the present disclosure are best understood from the following detailed description when read with the accompanying figures. It should be noted that, in accordance with the standard practice in the industry, various features are not drawn to scale. In fact, the dimensions of the various features may be arbitrarily increased or reduced for clarity of discussion.

DETAILED DESCRIPTION

Figure 1:
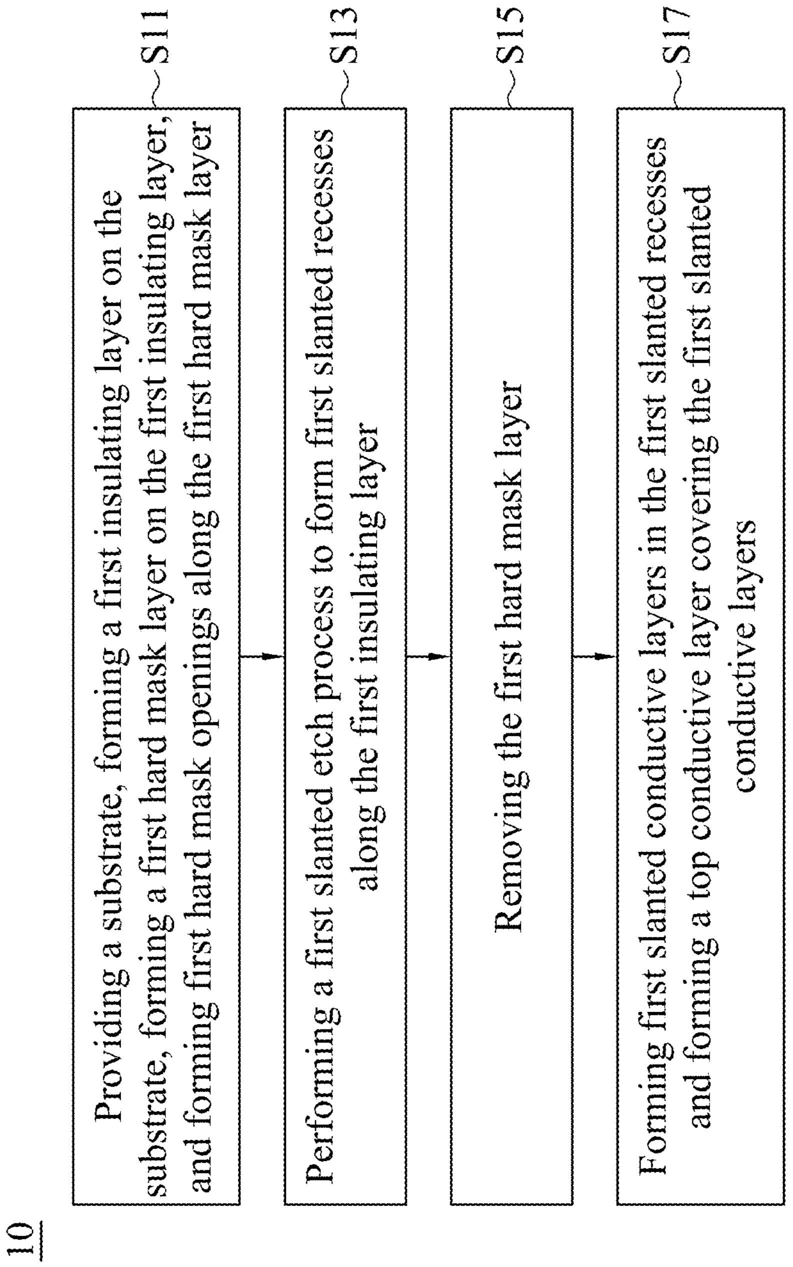
FIG. 1 illustrates, in a flowchart diagram form, a method for fabricating a semiconductor device in accordance with one embodiment of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as “beneath,” “below,” “lower,” “above,” “upper” and the like, may be used herein for ease of description to describe one element or feature’s relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

It should be understood that when an element or layer is referred to as being “connected to” or “coupled to” another element or layer, it can be directly connected to or coupled to another element or layer, or intervening elements or layers may be present.

It should be understood that, although the terms first, second, etc. may be used herein to describe various elements, these elements should not be limited by these terms. Unless indicated otherwise, these terms are only used to distinguish one element from another element. Thus, for example, a first element, a first component or a first section discussed below could be termed a second element, a second component or a second section without departing from the teachings of the present disclosure.

Unless the context indicates otherwise, terms such as “same,” “equal,” “planar,” or “coplanar,” as used herein when referring to orientation, layout, location, shapes, sizes, amounts, or other measures do not necessarily mean an exactly identical orientation, layout, location, shape, size, amount, or other measure, but are intended to encompass nearly identical orientation, layout, location, shapes, sizes, amounts, or other measures within acceptable variations that may occur, for example, due to manufacturing processes. The term “substantially” may be used herein to reflect this meaning. For example, items described as “substantially the same,” “substantially equal,” or “substantially planar,” may be exactly the same, equal, or planar, or may be the same, equal, or planar within acceptable variations that may occur, for example, due to manufacturing processes.

In the present disclosure, a semiconductor device generally means a device which can function by utilizing semiconductor characteristics, and an electro-optic device, a light-emitting display device, a semiconductor circuit, and an electronic device are all included in the category of the semiconductor device.

It should be noted that, in the description of the present disclosure, above (or up) corresponds to the direction of the arrow of the axis Z, and below (or down) corresponds to the opposite direction of the arrow of the axis Z.

Figure 2:
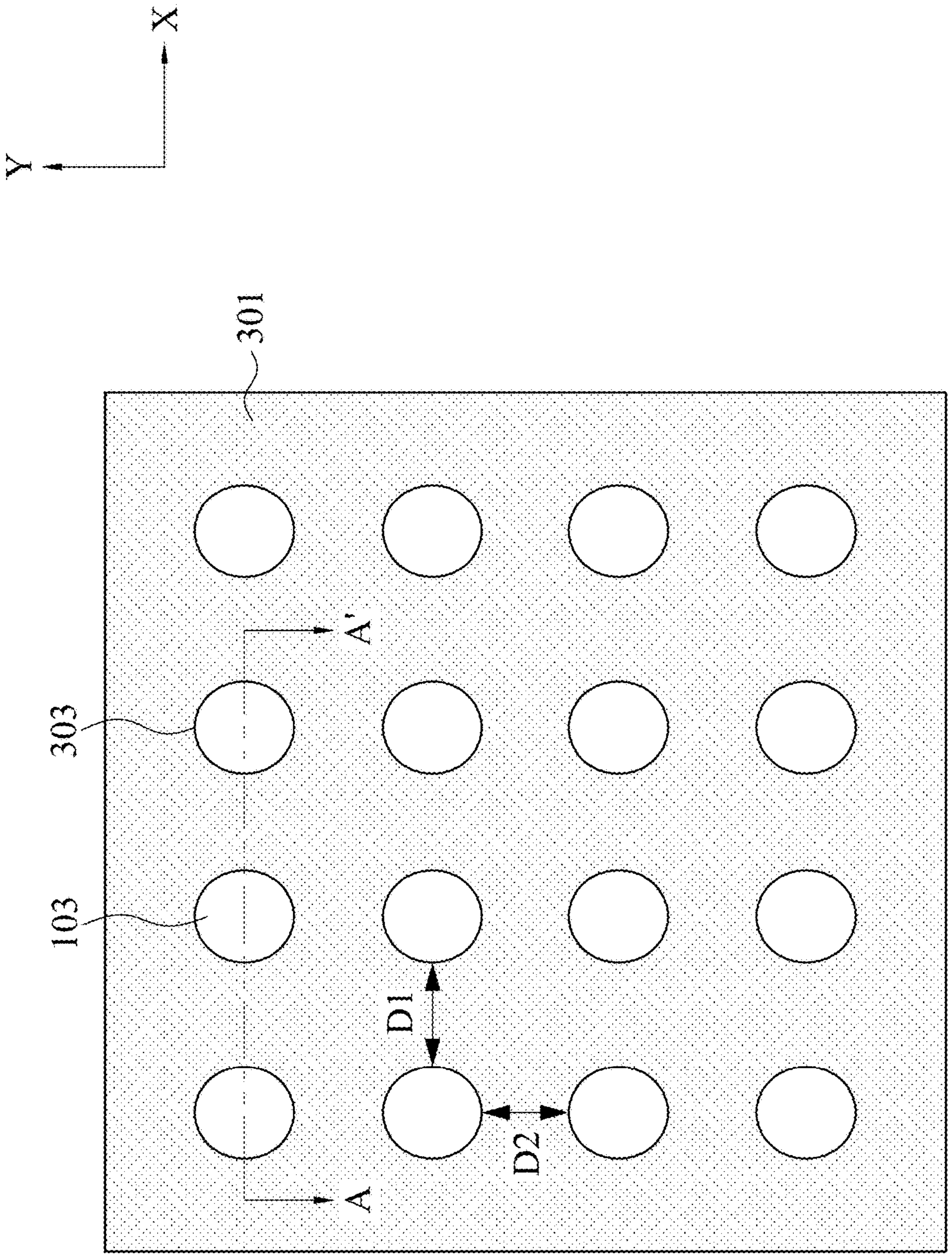
FIG. 2 illustrates, in a schematic top-view diagram, an intermediate semiconductor device in accordance with one embodiment of the present disclosure.
Figure 3:
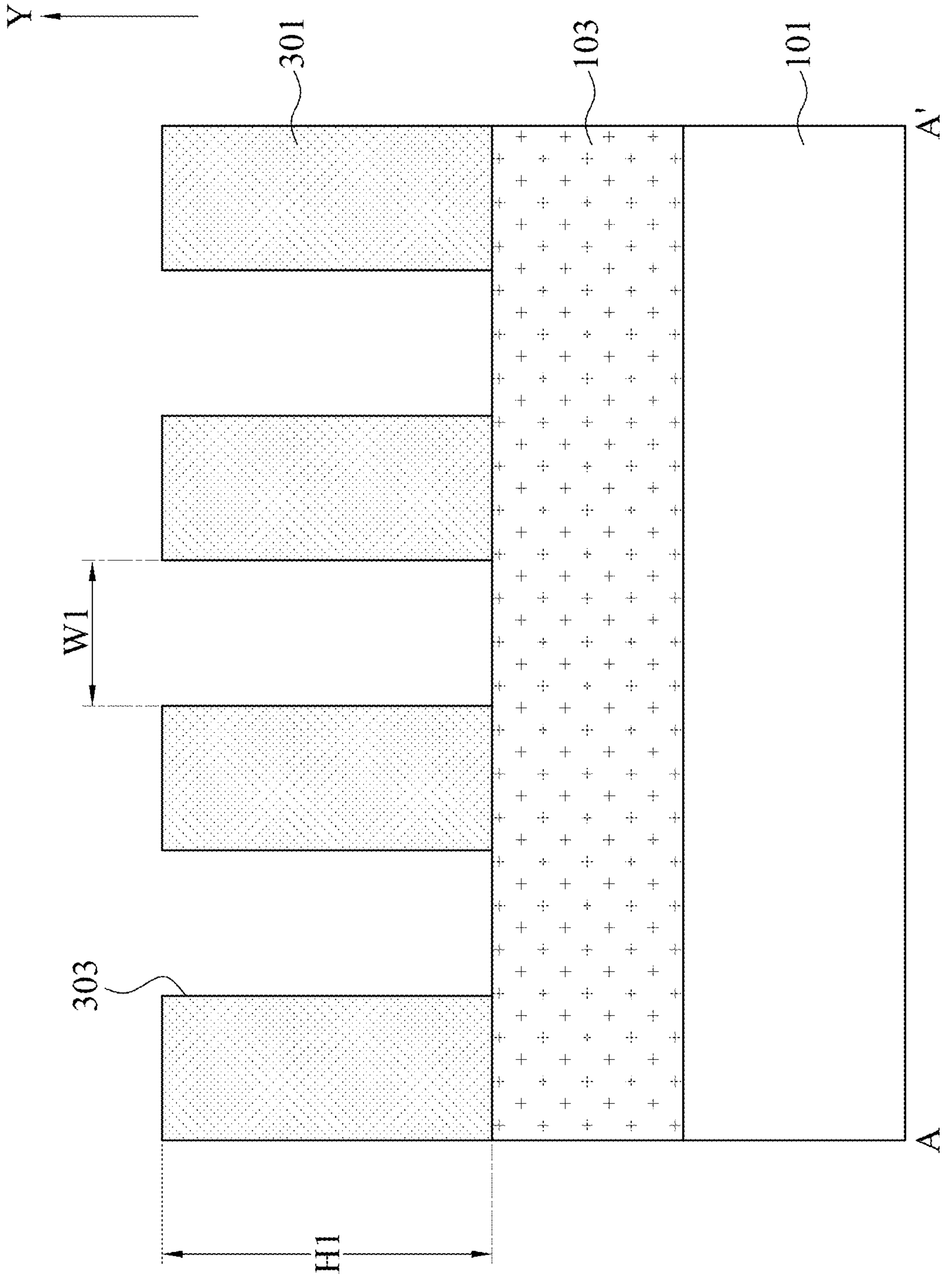
FIG. 3 is a schematic cross-sectional view diagram taken along a line A-A' in FIG. 2 in accordance with one embodiment of the present disclosure.

FIG. 1 illustrates, in a flowchart diagram form, a method 10 for fabricating a semiconductor device 1A in accordance with one embodiment of the present disclosure. FIG. 2 illustrates, in a schematic top-view diagram, an intermediate semiconductor device in accordance with one embodiment of the present disclosure. FIG. 3 is a schematic cross-sectional view diagram taken along a line A-A' in FIG. 2 in accordance with one embodiment of the present disclosure.

With reference to FIGS. 1 to 3, at step S11, a substrate 101 may be provided, a first insulating layer 103 may be formed on the substrate 101, a first hard mask layer 301 may be formed on the first insulating layer 103, and first hard mask openings 303 may be formed along the first hard mask layer 301.

With reference to FIGS. 2 and 3, in some embodiments, the substrate 101 may include a semiconductor-on-insulator structure which consisting of, from bottom to top, a handle substrate, an insulator layer, and a topmost semiconductor layer. The handle substrate and the topmost semiconductor layer may be formed of, for example, an elementary semiconductor, such as silicon or germanium; a compound semiconductor, such as silicon germanium, silicon carbide, gallium arsenide, gallium phosphide, indium phosphide, indium arsenide, indium antimonide, or other III-V compound semiconductor or II-VI compound semiconductor; or combinations thereof. The insulator layer may be a crystalline or non-crystalline dielectric material such as an oxide and/or nitride. The insulator layer may have a thickness between about 10 nm and 200 nm.

In some embodiments, the substrate 101 may include dielectrics, insulating layers, or conductive features formed on the topmost semiconductor layer. The dielectrics or the insulating layers may include, for example, a semiconductor oxide, a semiconductor nitride, semiconductor oxynitride, semiconductor carbide, tetraethyl orthosilicate oxide, phosphosilicate glass, borophosphosilicate glass, fluorinated silica glass, carbon doped silicon oxide, amorphous fluorinated carbon, or combinations thereof. The conductive features may be conductive lines, conductive vias, conductive contacts, or the like. The dielectrics or the insulating layers may act as an insulator that supports and electrically isolates the conductive features.

In some embodiments, device elements (not shown) may be formed in the substrate 101. The device elements may be, for example, bipolar junction transistors, metal-oxide-semiconductor field effect transistors, diodes, system large-scale integration, flash memories, dynamic random-access memories, static random-access memories, electrically erasable programmable read-only memories, image sensors, micro-electro-mechanical system, active devices, or passive devices. The device elements may be electrically insulated from neighboring device elements by insulating structures such as shallow trench isolation.

With reference to FIGS. 2 and 3, in some embodiments, the first insulating layer 103 may be formed of, for example, silicon nitride, silicon oxide, silicon oxynitride, silicon nitride oxide, flowable oxide, tonen silazen, undoped silica glass, borosilica glass, phosphosilica glass, borophosphosilica glass, plasma-enhanced tetra-ethyl orthosilicate, fluoride silicate glass, carbon-doped silicon oxide, organo silicate glass, low-k dielectric material, or a combination thereof.

In some embodiments, the first insulating layer 103 may be formed of, for example, silicon oxide, silicon nitride, silicon oxynitride, silicon oxide nitride, polyimide, polybenzoxazole, phosphosilicate glass, undoped silica glass, or fluoride silicate glass. The first insulating layer 103 may be referred to as a passivation layer.

In some embodiments, the first insulating layer 103 may include a bottom passivation layer (not shown for clarity) and a top passivation layer (not shown for clarity). The bottom passivation may be formed on the substrate 101. The top passivation layer may be formed on the bottom passivation layer. The bottom passivation layer may be formed of, for example, silicon oxide or phosphosilicate glass. The top passivation layer may be formed of, for example, silicon nitride, silicon oxynitride, or silicon oxide nitride. The bottom passivation layer may serve as a stress buffer between the top passivation layer and the substrate 101. The top passivation layer may serve as a high vapor barrier in order to prevent moisture from entering from above.

In some embodiments, the first insulating layer 103 may be formed of a material different from the first hard mask layer 301. Specifically, the first insulating layer 103 may be formed of a material having etch selectivity to the first hard mask layer 301.

With reference to FIGS. 2 and 3, in some embodiments, the first hard mask layer 301 may be formed of, for example, silicon oxide, silicon nitride, silicon oxynitride, silicon nitride oxide, the like, or a combination thereof. The first hard mask layer 301 may be formed by a deposition process such as chemical vapor deposition, plasma enhanced chemical vapor deposition, low pressure chemical vapor deposition, or the like.

It should be noted that, in description of the present disclosure, silicon oxynitride refers to a substance which contains silicon, nitrogen, and oxygen and in which a proportion of oxygen is greater than that of nitrogen. Silicon nitride oxide refers to a substance which contains silicon, oxygen, and nitrogen and in which a proportion of nitrogen is greater than that of oxygen.

Alternatively, in some embodiments, the first hard mask layer 301 may be formed of, for example, a carbon film. The terms "carbon film" is used herein to describe materials whose mass is primarily carbon, whose structure is defined primarily by carbon atoms, or whose physical and chemical properties are dominated by its carbon content. The term "carbon film" is meant to exclude materials that are simply mixtures or compounds that include carbon, for example dielectric materials such as carbon-doped silicon oxynitride, carbon-doped silicon oxide or carbon-doped polysilicon. These terms do include, for example, graphite, charcoal and halocarbons.

In some embodiments, the carbon film may be deposited by a process including introducing a processing gas mixture, consisting of one or more hydrocarbon compounds, into a processing chamber. The hydrocarbon compound has a formula $C_xH_y$, where x has a range of between 2 and 4 and y has a range of between 2 and 10. The hydrocarbon compounds may be, for example, propylene ($C_3H_6$), propyne ($C_3H_4$), propane ($C_3H_8$), butane ($C_4H_{10}$), butylene ($C_4H_8$), butadiene ($C_4H_6$), or acetylene ($C_2H_2$), or a combination thereof. In some embodiments, partially or completely fluorinated derivatives of the hydrocarbon compounds may be used. The doped derivatives include boron-containing derivatives of the hydrocarbon compounds as well as fluorinated derivatives thereof.

In some embodiments, the carbon film may be deposited from the processing gas mixture by maintaining a substrate temperature between about 100° C. and about 700° C.; specifically, between about 350° C. and about 550° C. In some embodiments, the carbon film may be deposited from the processing gas mixture by maintaining a chamber pressure between about 1 Torr and about 20 Torr. In some embodiments, the carbon film may be deposited from the processing gas mixture by introducing the hydrocarbon gas, and any inert, or reactive gases respectively, at a flow rate between about 50 sccm and about 2000 sccm.

In some embodiments, the processing gas mixture may further include an inert gas, such as argon. However, other inert gases, such as nitrogen or other noble gases, such as helium may also be used. Inert gases may be used to control the density and deposition rate of the carbon film. Additionally, a variety of gases may be added to the processing gas mixture to modify properties of the carbon film. The gases may be reactive gases, such as hydrogen, ammonia, a mixture of hydrogen and nitrogen, or a combination thereof. The addition of hydrogen or ammonia may be used to control the hydrogen ratio of the carbon film to control layer properties, such as etch selectivity, chemical mechanical polishing resistance properties, and reflectivity. In some embodiments, a mixture of reactive gases and inert gases may be added to the processing gas mixture to deposit the carbon film.

The carbon film may include carbon and hydrogen atoms, which may be an adjustable carbon:hydrogen ratio that ranges from about 10% hydrogen to about 60% hydrogen. Controlling the hydrogen ratio of the carbon film may tune the respective etch selectivity and chemical mechanical polishing resistance properties. As the hydrogen content decreases, the etch resistance, and thus the selectivity, of the carbon film increases. The reduced rate of removal of the carbon film may make the carbon film suitable for being a mask layer when performing an etch process to transfer desire pattern onto the underlying layers.

Alternatively, in some embodiments, the first hard mask layer 301 may be formed of, for example, boron nitride, silicon boron nitride, phosphorus boron nitride, or boron carbon silicon nitride. In some embodiments, the first hard mask layer 301 may be formed with an assistant of a plasma process, an UV cure process, a thermal anneal process, or a combination thereof. A substrate temperature of the formation of the first hard mask layer 301 may be between about 20° C. and about 1000° C. A process pressure of the formation of the first hard mask layer 301 may be between about 10 mTorr and about 760 Torr.

When the first hard mask layer 301 is formed with the assistant of the plasma process. Plasma of the plasma process may be provided by the RF power. In some embodiments, the RF power may be between about 2 W and about 5000 W at a single low frequency of between about 100 kHz up to about 1 MHz. In some embodiments, the RF power may be between about 30 W and about 1000 W at a single high frequency of greater than about 13.6 MHz.

When the first hard mask layer 301 is formed with the assistant of UV cure process, the UV cure may be provided by any UV source, such as mercury microwave arc lamps, pulsed xenon flash lamps, or high-efficiency UV light emitting diode arrays. The UV source may have a wavelength of between about 170 nm and about 400 nm. The UV source may provide a photon energy between about 0.5 eV and about 10 eV; specifically, between about 1 eV and about 6 eV. The assistant of the UV cure process may remove hydrogen from the first hard mask layer 301. As hydrogen may diffuse through into other areas of the semiconductor device 1A and may degrade the reliability of the semiconductor device 1A, the removal of hydrogen by the assistant of UV cure process may improve the reliability of the semiconductor device 1A. In addition, the UV cure process may increase the density of the first hard mask layer 301.

With reference to FIGS. 2 and 3, the first hard mask openings 303 may be formed along the first hard mask layer 301. Portions of the first insulating layer 103 may be exposed through the first hard mask openings 303. In a top-view perspective, the first hard mask openings 303 may be arranged in a grid dot pattern. The first hard mask openings 303 may be equidistantly disposed along a first axis X and a second axis Y. The first axis X and the second axis Y are perpendicular to each other. Specifically, the distance D1 between an adjacent pair of the first hard mask openings 303 along the first axis X may be equal to the distance D2 between an adjacent pair of the first hard mask openings 303 along the second axis Y. In a cross-sectional perspective, a ratio of the width W1 of the first hard mask openings 303 to the height H1 of the first hard mask openings 303 may be between about 5:1 and about 1:15, between about 3:1 and about 1:13, between about 1:1 and about 1:11, and between about 5:1 and about 1:8.

Figure 4:
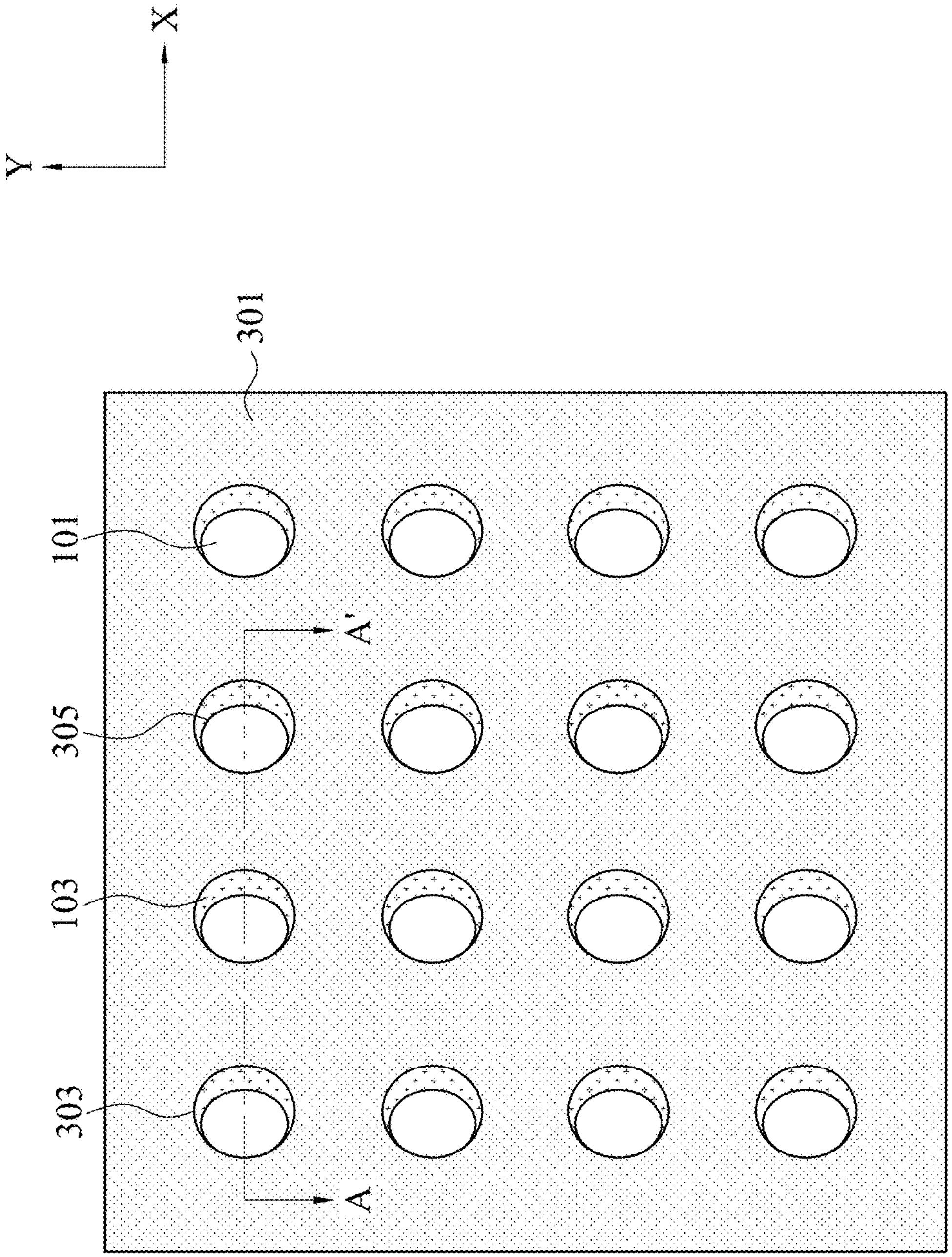
FIG. 4 illustrates, in a schematic top-view diagram, an intermediate semiconductor device in accordance with one embodiment of the present disclosure.
Figure 5:
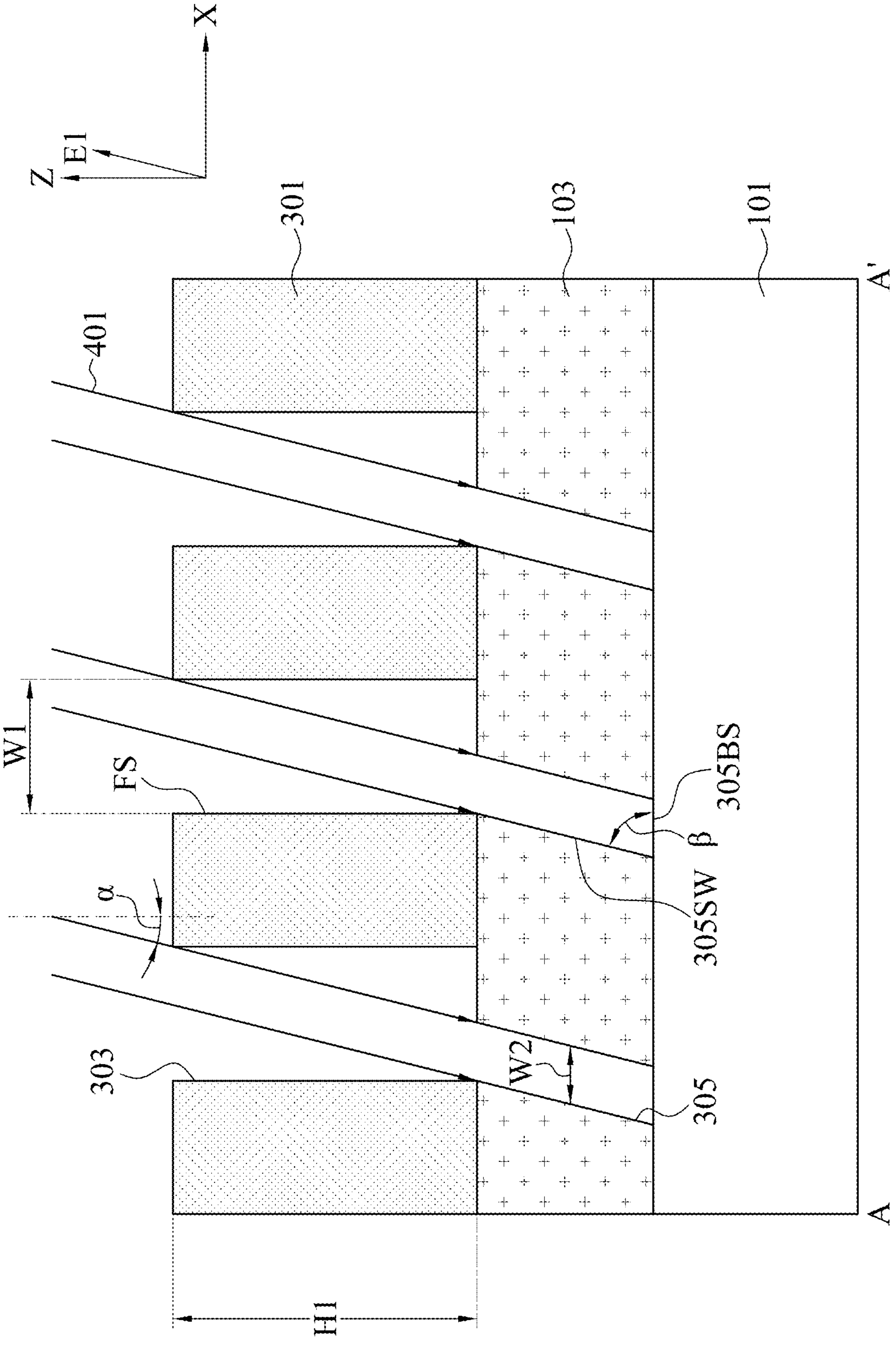
FIG. 5 is a schematic cross-sectional view diagram taken along a line A-A' in FIG. 4 in accordance with one embodiment of the present disclosure.

FIG. 4 illustrates, in a schematic top-view diagram, an intermediate semiconductor device in accordance with one embodiment of the present disclosure. FIG. 5 is a schematic cross-sectional view diagram taken along a line A-A' in FIG. 4 in accordance with one embodiment of the present disclosure.

With reference to FIGS. 1, 4, and 5, at step S13, a first slanted etch process 401 may be performed to form first slanted recesses 305 along the first insulating layer 103.

With reference to FIGS. 4 and 5, the first slanted etch process 401 may use the first hard mask layer 301 as pattern guides to remove portions of the first insulating layer 103 and concurrently form the first slanted recesses 305 along the first insulating layer 103. The first slanted recesses 305 may be formed adjacent to the first sides FS of the first hard mask layer 301 in a cross-sectional perspective.

In some embodiments, the angle of incidence a of the first slanted etch process 401 may be define by the width W1 of the first hard mask openings 303 and the height H1 of the first hard mask openings 303.

In some embodiments, the angle of incidence a of the first slanted etch process 401 may be between about 5 degree and about 80 degree. In some embodiments, the angle of incidence a of the first slanted etch process 401 may be between about 20 degree and about 60 degree. In some embodiments, the angle of incidence a of the first slanted etch process 401 may be between about 20 degree and about 40 degree.

In some embodiments, the first slanted etch process 401 may be an anisotropic etch process such as a reactive ion etching process. The reactive ion etching process may include etchant gases and passivation gases which may suppress the isotropic effect to limit the removal of material in the horizontal direction. The etchant gases may include chlorine gas and boron trichloride. The passivation gases may include fluoroform or other suitable halocarbons. In some embodiments, the first hard mask layer 301 formed of carbon film may serve as a halocarbon source for the passivation gases of the reactive ion etching process.

In some embodiments, the etch rate of the first insulating layer 103 of the first slanted etch process 401 may be faster than the etch rate of the first hard mask layer 301 of the first slanted etch process 401. For example, an etch rate ratio of the first insulating layer 103 to the first hard mask layer 301 may be between about 100:1 and about 1.05:1, between about 100:1 and about 10:1, between about 50:1 and about 10:1, between about 30:1 and about 10:1, between about 20:1 and about 10:1, or between about 15:1 and about 10:1 during the first slanted etch process 401.

With reference to FIGS. 4 and 5, the width W2 of the first slanted recesses 305 may be less than the width W1 of the first hard mask openings 303. The acute angles β between the bottom surfaces 305BS of the first slanted recesses 305 and the sidewalls 305SW of the first slanted recesses 305 may be between about 10 degrees and about 85 degrees, between about 20 degrees and about 80 degrees, between about 45 degrees and about 80 degrees, between about 60 degrees and about 80 degrees, and between about 70 degrees and about 80 degrees. In some embodiments, the first slanted recesses 305 may be extended in a first direction E1. The first direction E1 may be slanted with respect to the axis Z and the first axis X.

Figure 6:
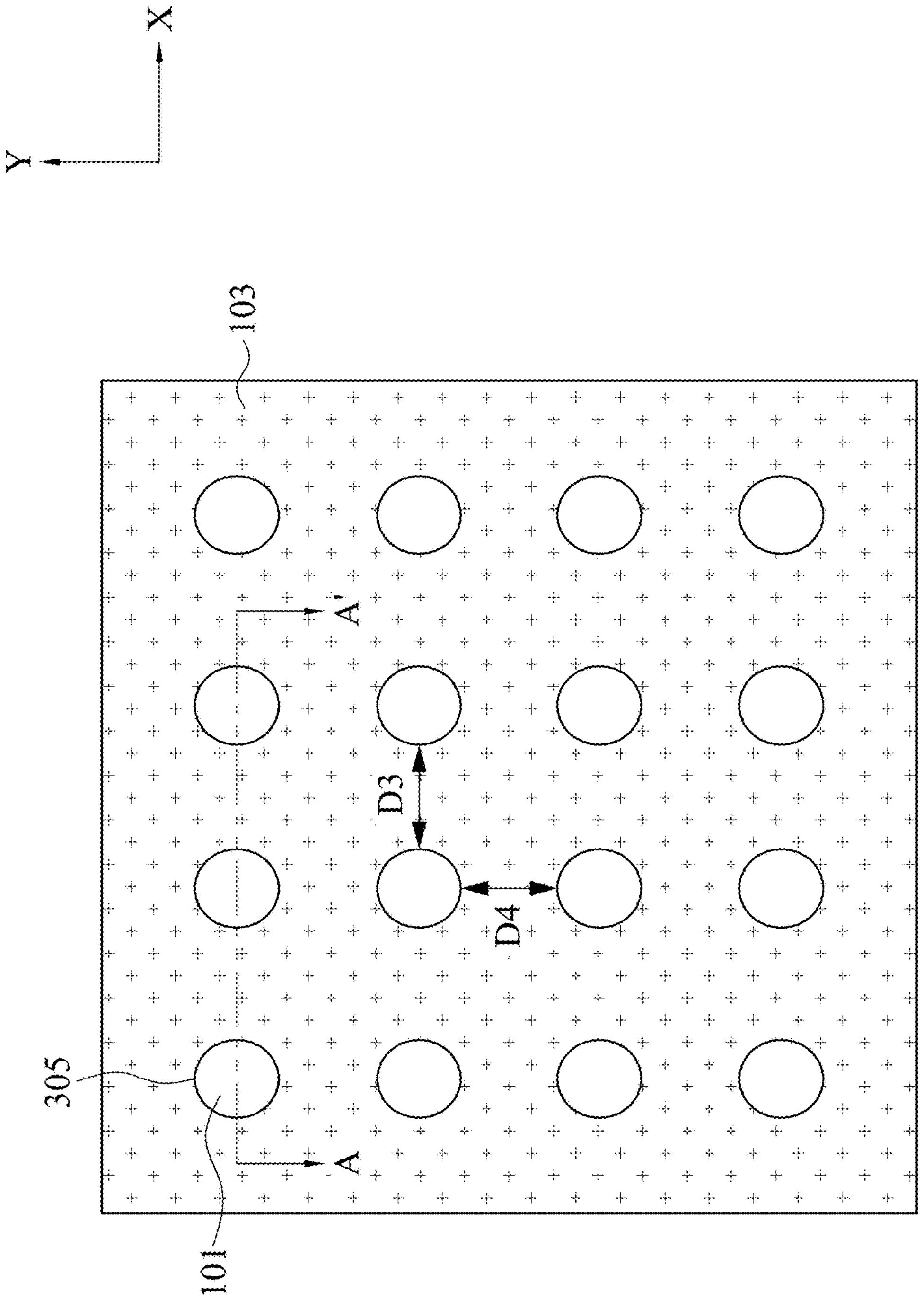
FIG. 6 illustrates, in a schematic top-view diagram, an intermediate semiconductor device in accordance with one embodiment of the present disclosure.
Figure 7:
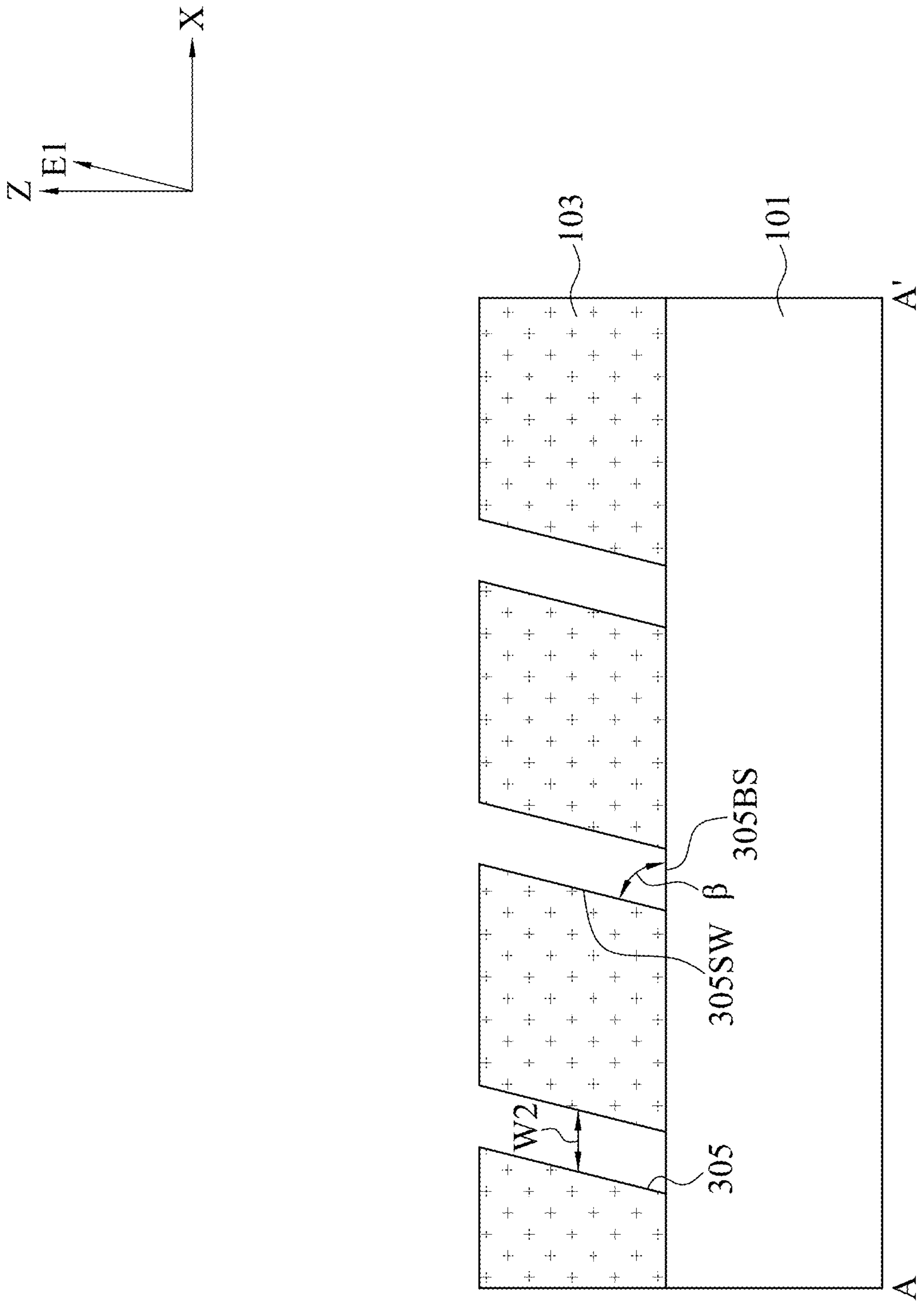
FIGS. 7 to 9 are schematic cross-sectional view diagrams taken along a line A-A' in FIG. 6 in accordance with one embodiment of the present disclosure.
Figure 8:
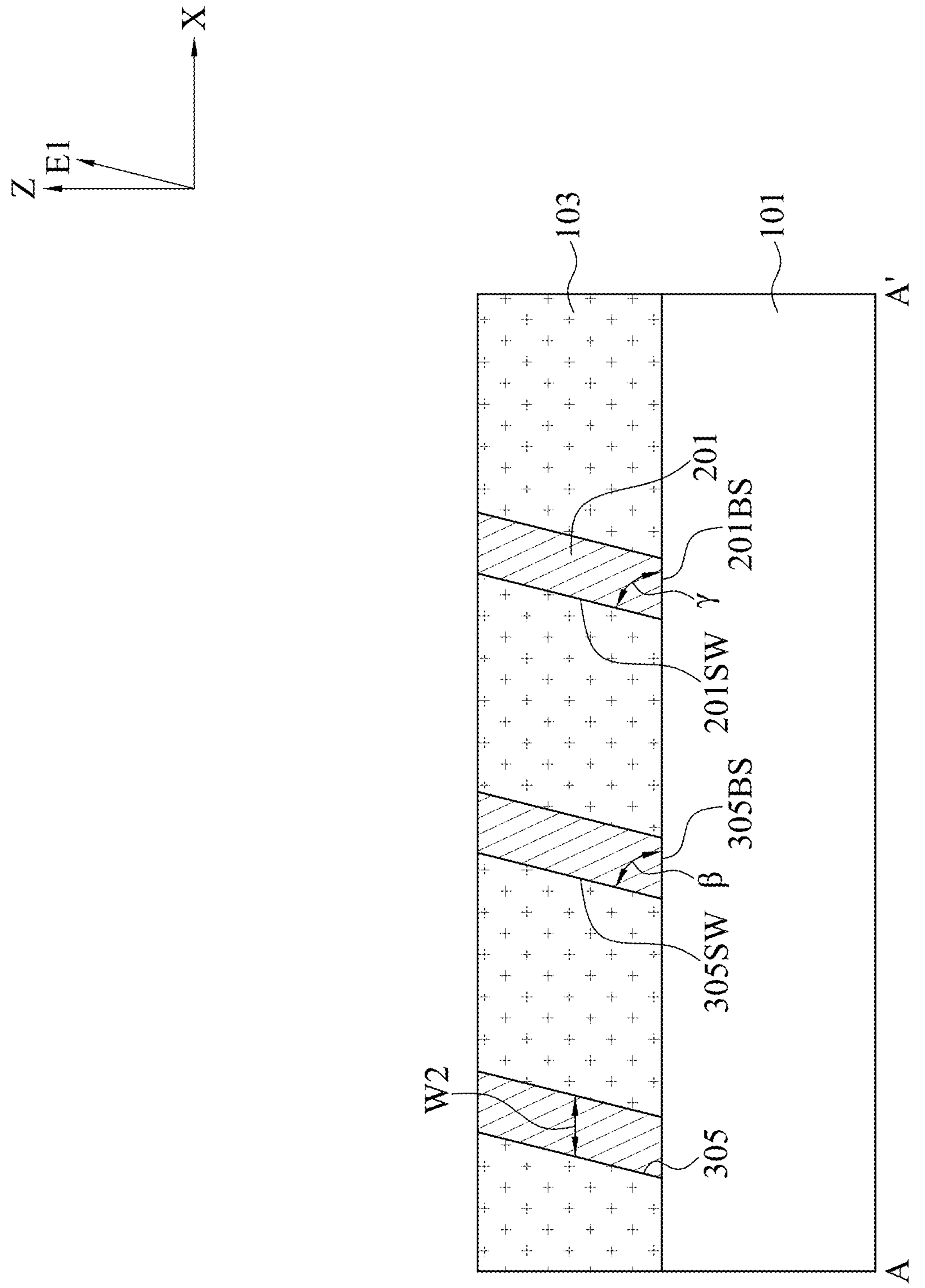
Figure 9:
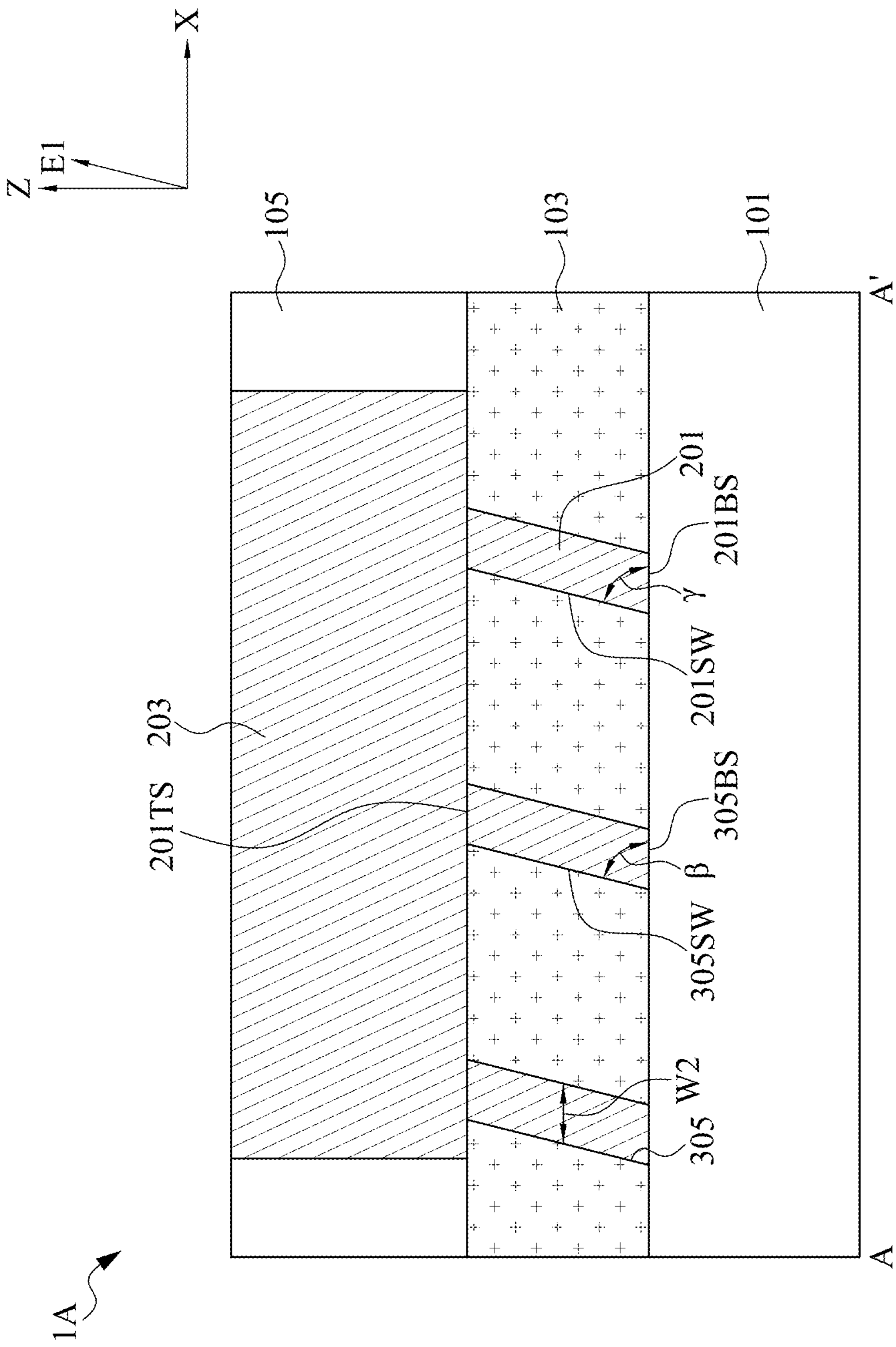

FIG. 6 illustrates, in a schematic top-view diagram, an intermediate semiconductor device in accordance with one embodiment of the present disclosure. FIGS. 7 to 9 are schematic cross-sectional view diagrams taken along a line A-A' in FIG. 6 in accordance with one embodiment of the present disclosure. Some elements are not shown in FIG. 6 for clarity.

With reference to FIGS. 1, 6, and 7, at step S15, the first hard mask layer 301 may be removed.

With reference to FIGS. 6 and 7, the first hard mask layer 301 may be removed by a hard mask etch process. The hard mask etch process may be an anisotropic dry etch process or a wet etch process. In some embodiments, the etch rate of the first hard mask layer 301 of the hard mask etch process may be faster than the etch rate of the first insulating layer 103 of the hard mask etch process. For example, an etch rate ratio of the first hard mask layer 301 to the first insulating layer 103 may be between about 100:1 and about 1.05:1, between about 100:1 and about 10:1, between about 50:1 and about 10:1, between about 30:1 and about 10:1, between about 20:1 and about 10:1, or between about 15:1 and about 10:1 during the hard mask etch process.

With reference to FIG. 6, in a top-view perspective, the first slanted recesses 305 may be arranged in a grid dot pattern. The first slanted recesses 305 may be equidistantly disposed along the first axis X and the second axis Y. Specifically, the distance D3 between an adjacent pair of the first slanted recesses 305 along the first axis X may be equal to the distance D4 between an adjacent pair of the first slanted recesses 305 along the second axis Y. Portions of the substrate 101 may be exposed through the first slanted recesses 305.

In some embodiments, a cleaning process and a passivation process may be performed on the first slanted recesses 305 after the removal of the first hard mask layer 301. The cleaning process may remove oxide, originating from oxidation by oxygen in the air, from the top surface of the topmost conductive feature in the substrate 101 without damaging the topmost conductive feature in the substrate 101. The cleaning process may include applying a mixture of hydrogen and argon as a remote plasma source onto the first slanted recesses 305. A process temperature of the cleaning process may be between about 250° C. and about 350° C. A process pressure of the cleaning process may be between about 1 Torr and about 10 Torr. A bias energy may be applied to the equipment performing the cleaning process. The bias energy may be between about 0 W and 200 W.

The passivation process may include soaking the intermediate semiconductor device after the cleaning process with a precursor such as dimethylaminotrimethylsilane, tetramethylsilane, or the like at a process temperature between about 200° C. and about 400° C. An ultraviolet radiation may be used to facilitate the passivation process. The passivation process may passivate the sidewalls of the first insulating layer 103 exposed through the first slanted recesses 305 by sealing surface pores thereof. Undesirable sidewall growth, which may affect the electric characteristics of the semiconductor device 1A, may be reduced by the passivation process. As a result, the performance and reliability of the semiconductor device 1A may be increased.

With reference to FIGS. 1, 8, and 9, at step S17, first slanted conductive layers 201 may be formed in the first slanted recesses 305 and a top conductive layer 203 may be formed covering the first slanted conductive layers 201.

With reference to FIG. 8, the first slanted conductive layers 201 may be formed to completely fill the first slanted recesses 305 and cover the top surface of the first insulating layer 103. In some embodiments, the first slanted conductive layers 201 may be formed of, for example, tungsten, cobalt, zirconium, tantalum, titanium, aluminum, ruthenium, copper, metal carbides (e.g., tantalum carbide, titanium carbide, tantalum magnesium carbide), metal nitrides (e.g., titanium nitride), transition metal aluminides, or combinations thereof. The first slanted conductive layers 201 may be formed by a deposition process such as physical vapor deposition, chemical vapor deposition, atomic layer deposition, or sputtering. A planarization process, such as chemical mechanical polishing, may be performed until the top surface of the first insulating layer 103 is exposed to remove excess material and provide a substantially flat surface for subsequent processing steps.

With reference to FIG. 8, in a cross-sectional perspective, the shape of the first slanted conductive layers 201 may be defined by the first slanted recesses 305. That is, the acute angles γ between the bottom surfaces 201BS of the first slanted conductive layers 201 and the sidewalls 201SW of the first slanted conductive layers 201 may be between about 10 degrees and about 85 degrees, between about 20 degrees and about 80 degrees, between about 45 degrees and about 80 degrees, between about 60 degrees and about 80 degrees, and between about 70 degrees and about 80 degrees. In some embodiments, the first slanted conductive layers 201 may be extended in the first direction E1.

With reference to FIG. 9, a second insulating layer 105 may be formed on the first insulating layer 103. The second insulating layer 105 may be formed of, for example, silicon oxide, borophosphosilicate glass, undoped silicate glass, fluorinated silicate glass, low-k dielectric materials, the like, or a combination thereof. The low-k dielectric materials may have a dielectric constant less than 3.0 or even less than 2.5. In some embodiments, the low-k dielectric materials may have a dielectric constant less than 2.0. The second insulating layer 105 may be formed by deposition processes such as chemical vapor deposition, plasma enhanced chemical vapor deposition, evaporation, or spin-on coating.

With reference to FIG. 9, the top conductive layer 203 may be formed in the second insulating layer 105 and covering the top surfaces 201TS of the first slanted conductive layers 201. In some embodiments, the top conductive layer 203 may be formed of, for example, copper, aluminum, titanium, tungsten, the like, or a combination thereof. The top conductive layer 203 may be formed by a damascene process. The first slanted conductive layers 201 may be referred to as conductive vias of the semiconductor device 1A and the top conductive layer 203 may be referred to as a conductive line of the semiconductor device 1A.

Figure 10:
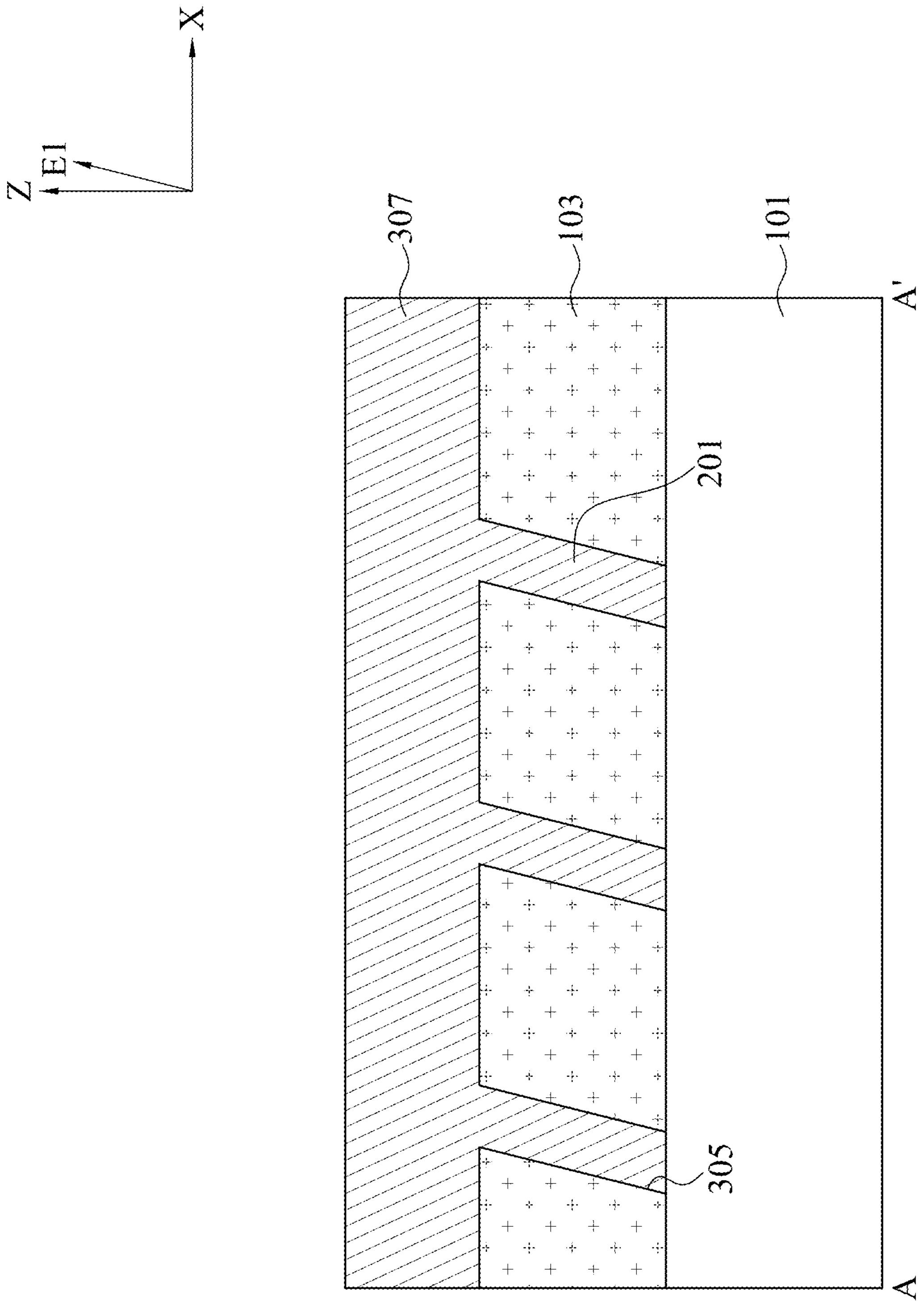
FIGS. 10 to 15 are schematic cross-sectional view diagrams taken along a line A-A' in FIG. 6 in accordance with some embodiments of the present disclosure.
Figure 11:
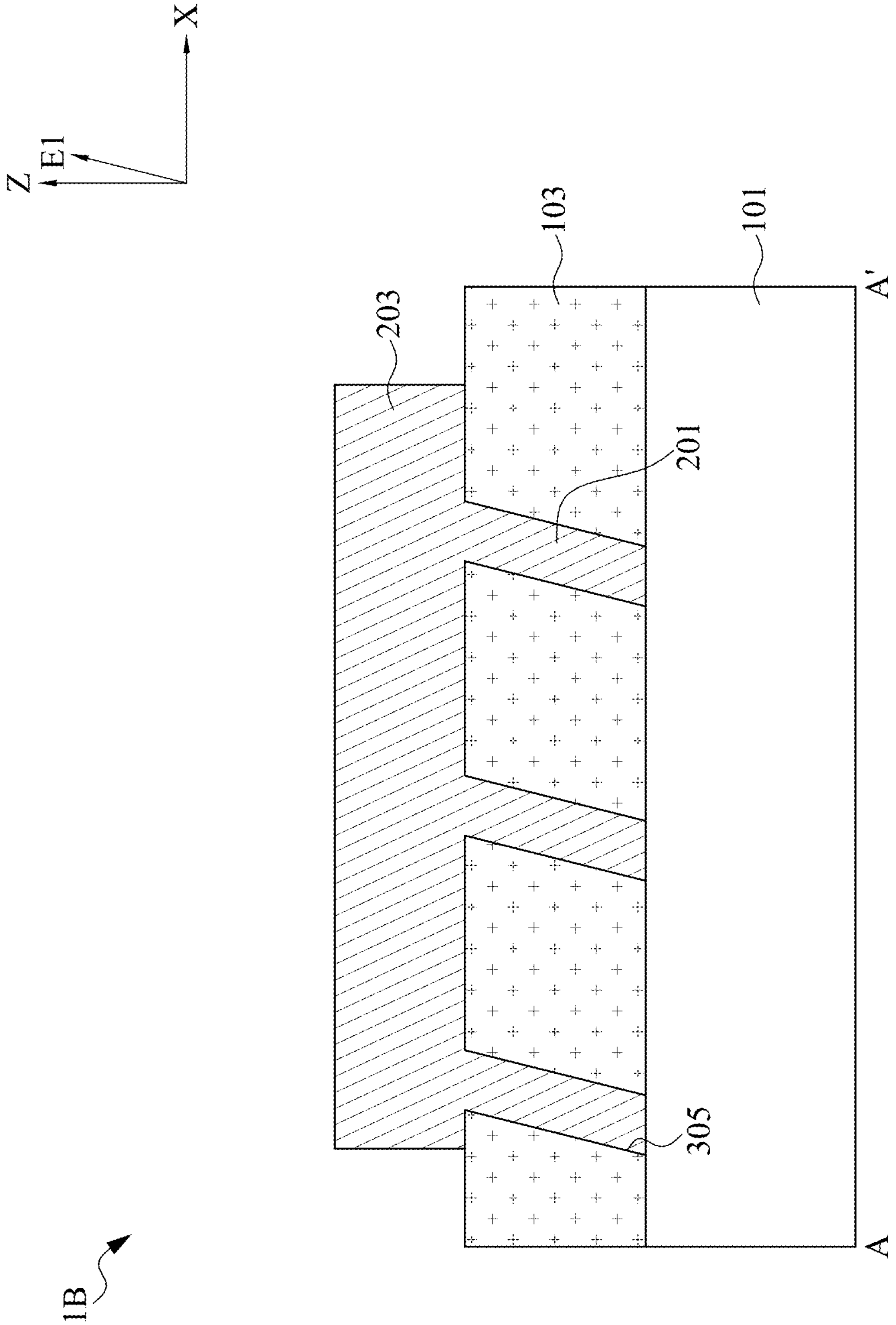

FIGS. 10 and 11 are schematic cross-sectional view diagrams taken along a line A-A' in FIG. 6 in accordance with another embodiment of the present disclosure.

With reference to FIG. 10, for fabrication of a semiconductor device 1B, an intermediate semiconductor device may be fabricating with a procedure similar to that illustrated in FIGS. 2 to 7. A layer of first conductive material 307 may completely fill the first slanted recesses 305 and cover the top surface of the first insulating layer 103. The first conductive material 307 may be aluminum, copper, aluminum-copper alloy, aluminum alloy, or copper alloy. The layer of first conductive material 307 may be formed by a deposition process such as physical vapor deposition, chemical vapor deposition, or sputtering. A planarization process, such as chemical mechanical polishing, may be performed to provide a substantially flat surface for subsequent processing steps. The layer of first conductive material 307 filled in the first slanted recesses 305 may be referred to as conductive vias of the semiconductor device 1B.

With reference to FIG. 11, a photolithography process may be performed to define a desire pattern for the layer of first conductive material 307. An etch process may be subsequently performed to remove portions of the layer of first conductive material 307 and concurrently form the top conductive layer 203 with the desire pattern. The top conductive layer 203 may be referred to as a pad layer of the semiconductor device 1B.

Figure 12:
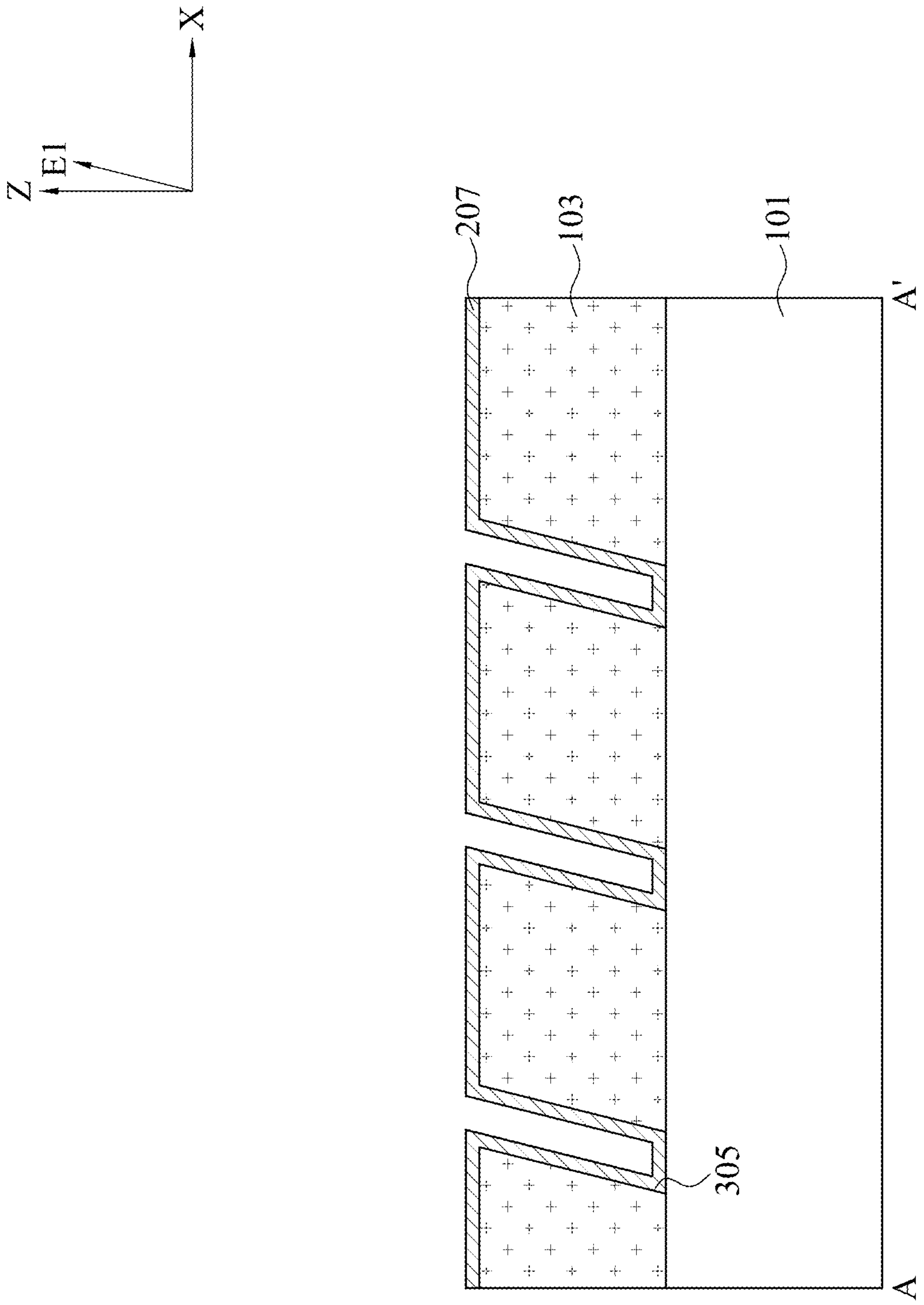
Figure 13:
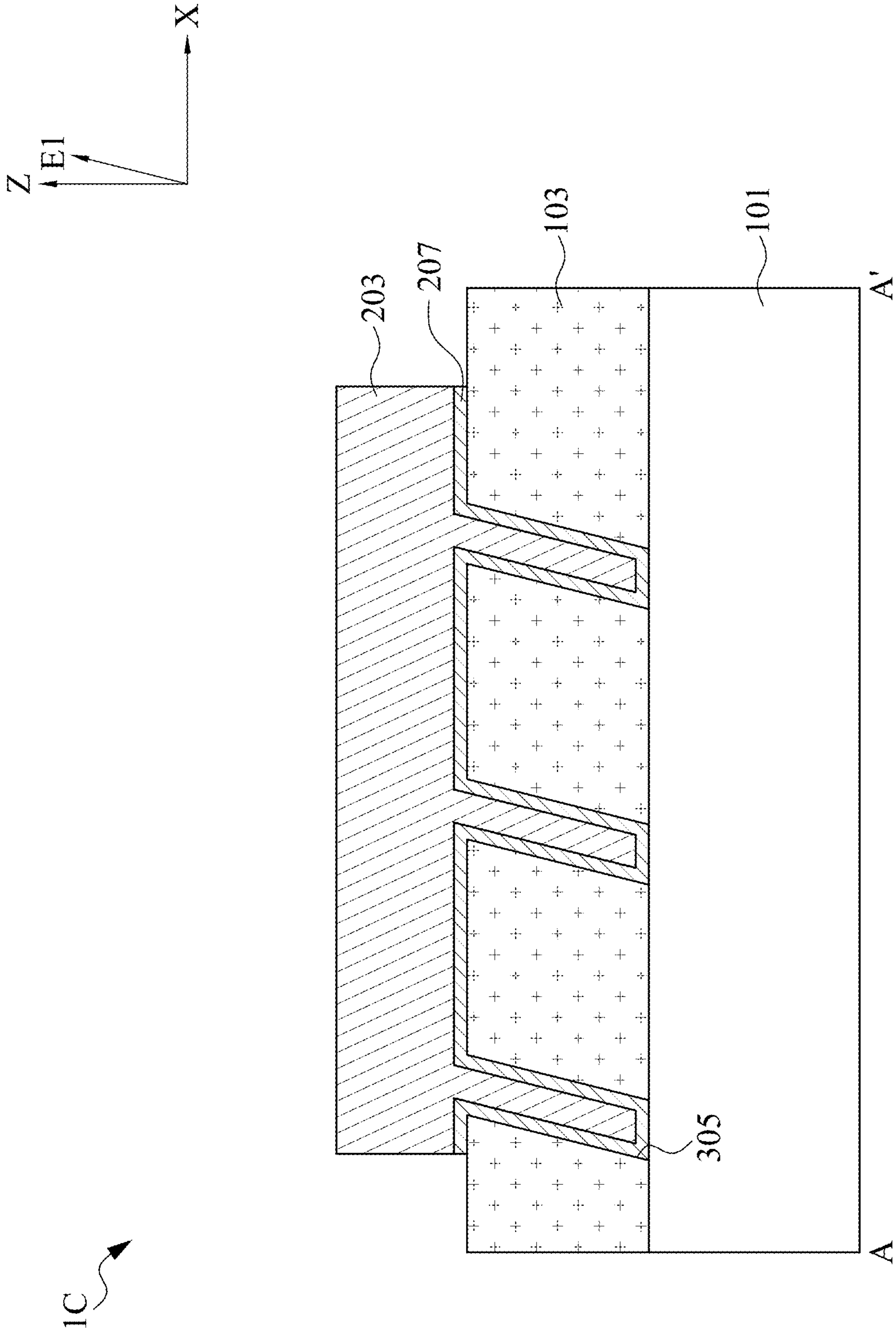

FIGS. 12 and 13 are schematic cross-sectional view diagrams taken along a line A-A' in FIG. 6 in accordance with another embodiment of the present disclosure.

With reference to FIG. 12, for fabrication of a semiconductor device 1C, an intermediate semiconductor device may be fabricating with a procedure similar to that illustrated in FIGS. 2 to 7. A barrier layer 207 may conformally formed in the first slanted recesses 305. The barrier layer 207 may be formed of, for example, titanium, titanium nitride, titanium silicon nitride, tantalum, tantalum nitride, tantalum silicon nitride, or a combination thereof. The barrier layer 207 may be formed by a deposition process such as physical vapor deposition, chemical vapor deposition, atomic layer deposition, or sputtering. In some embodiments, the barrier layer 207 may have a thickness between about 10 angstroms and about 15 angstroms. In some embodiments, the barrier layer 207 may have a thickness between about 11 angstroms and about 13 angstroms.

With reference to FIG. 13, the top conductive layer 203 may be formed on the barrier layer 207 with a procedure similar to that illustrated in FIGS. 10 and 11. The barrier layer 207 may serve as an adhesive layer between the first slanted conductive layers 201 and the topmost conductive line in the substrate 101. The barrier layer 207 may also prevent metal ions of the first slanted conductive layers 201 or the top conductive layer 203 diffusing into the first insulating layer 103 or the substrate 101.

Figure 14:
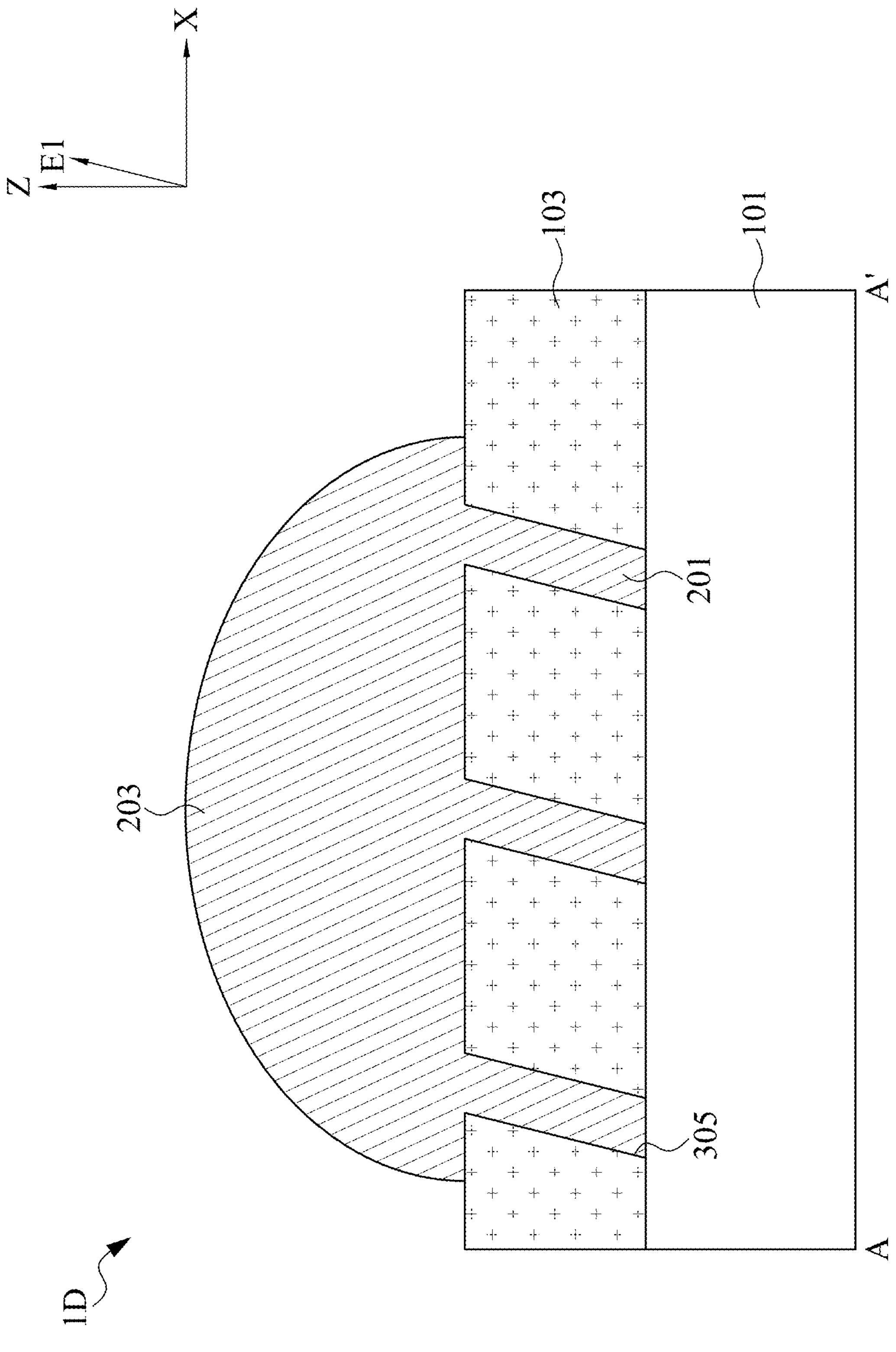

FIG. 14 is a schematic cross-sectional view diagrams taken along a line A-A' in FIG. 6 in accordance with another embodiment of the present disclosure.

With reference to FIG. 14, for fabrication of a semiconductor device 1D, an intermediate semiconductor device may be fabricating with a procedure similar to that illustrated in FIGS. 2 to 7. A top conductive layer 203 may completely fill the first slanted recesses 305 and cover a portion of the top surface of the first insulating layer 103. The top conductive layer 203 may be formed of, for example, a material including tin, silver, copper, gold, alloy or a combination thereof. The top conductive layer 203 may be referred to as a solder unit of the semiconductor device 1D.

During a wiring process, a process of forming a solder unit, or a packaging process, stress may be applied to semiconductor device and the stress may cause delamination of the first insulating layer 103. To reduce the effect of the stress of the aforementioned processes, the first slanted recesses 305 may serve as buffer spaces to reduce the stress of the aforementioned processes, reduce the semiconductor device 1D warpage, and prevent layers underneath the first insulating layer 103 from delaminating.

Figure 15:
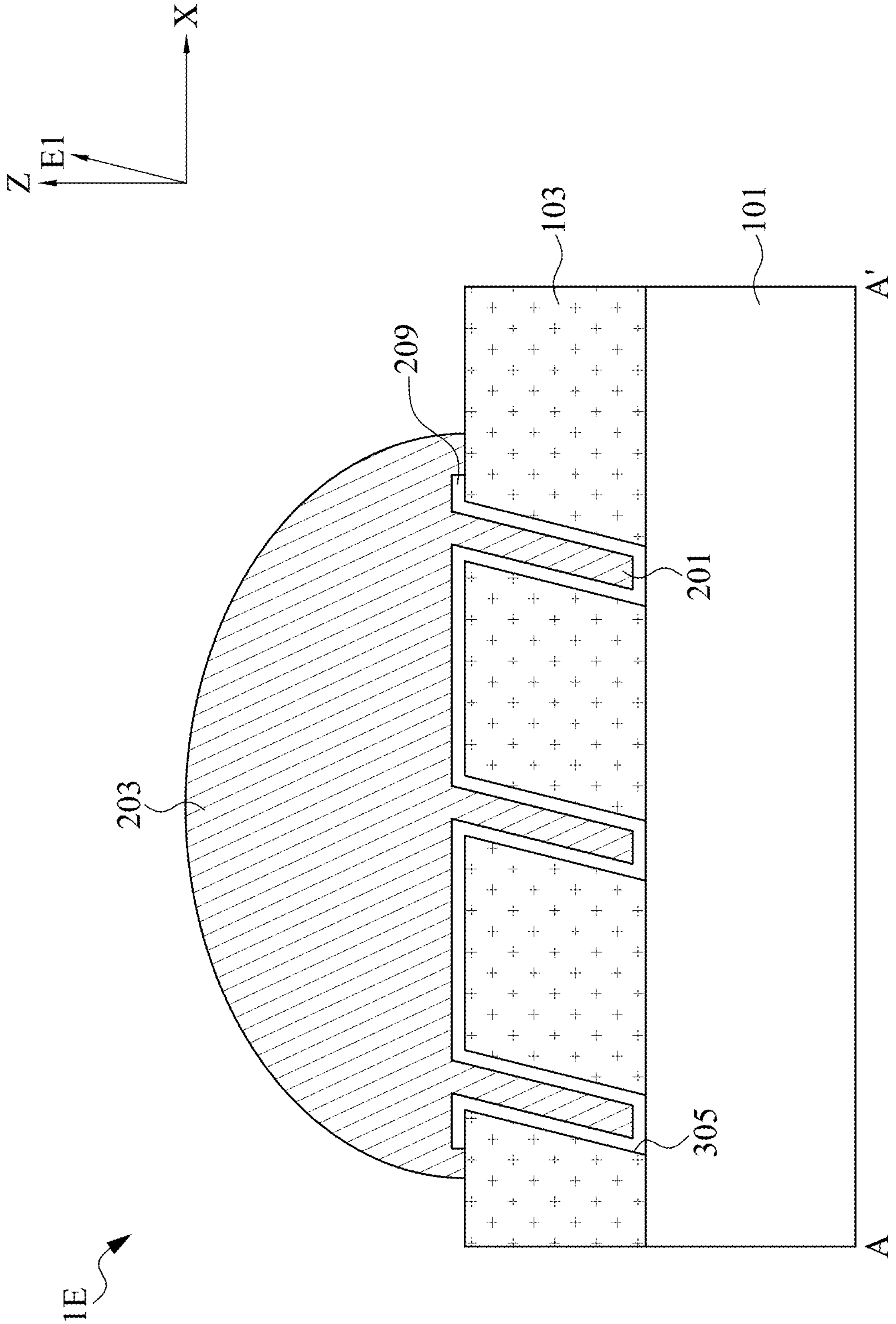

FIG. 15 is a schematic cross-sectional view diagrams taken along a line A-A' in FIG. 6 in accordance with another embodiment of the present disclosure.

With reference to FIG. 15, for fabrication of a semiconductor device 1E, an intermediate semiconductor device may be fabricating with a procedure similar to that illustrated in FIGS. 2 to 7. A under bump metallization layer 209 may be conformally formed in the first slanted recesses 305. The under bump metallization layer 209 may be a single layer structure or a stacked structure of multiple layers. For example, the under bump metallization layer 209 may include a first conductive layer, a second conductive layer, and a third conductive layer stacked sequentially. The first conductive layer may serve as an adhesive layer for stably attaching the top conductive layer 203 to the substrate 101 and the first insulating layer 103. For example, the first conductive layer may include at least one of titanium, titanium-tungsten, chromium, and aluminum. The second conductive layer may serve as a barrier layer for preventing a conductive material contained in the under bump metallization layer 209 from diffusing into the substrate 101 or the first insulating layer 103. The second conductive layer may include at least one of copper, nickel, chromium-copper, and nickel-vanadium. The third conductive layer may serve as a seed layer for forming the top conductive layer 203 or as a wetting layer for improving wetting characteristics of the top conductive layer 203. The third conductive layer may include at least one of nickel, copper, and aluminum. The top conductive layer 203 may be formed with a procedure similar to that illustrated in FIG. 14.

Figure 16:
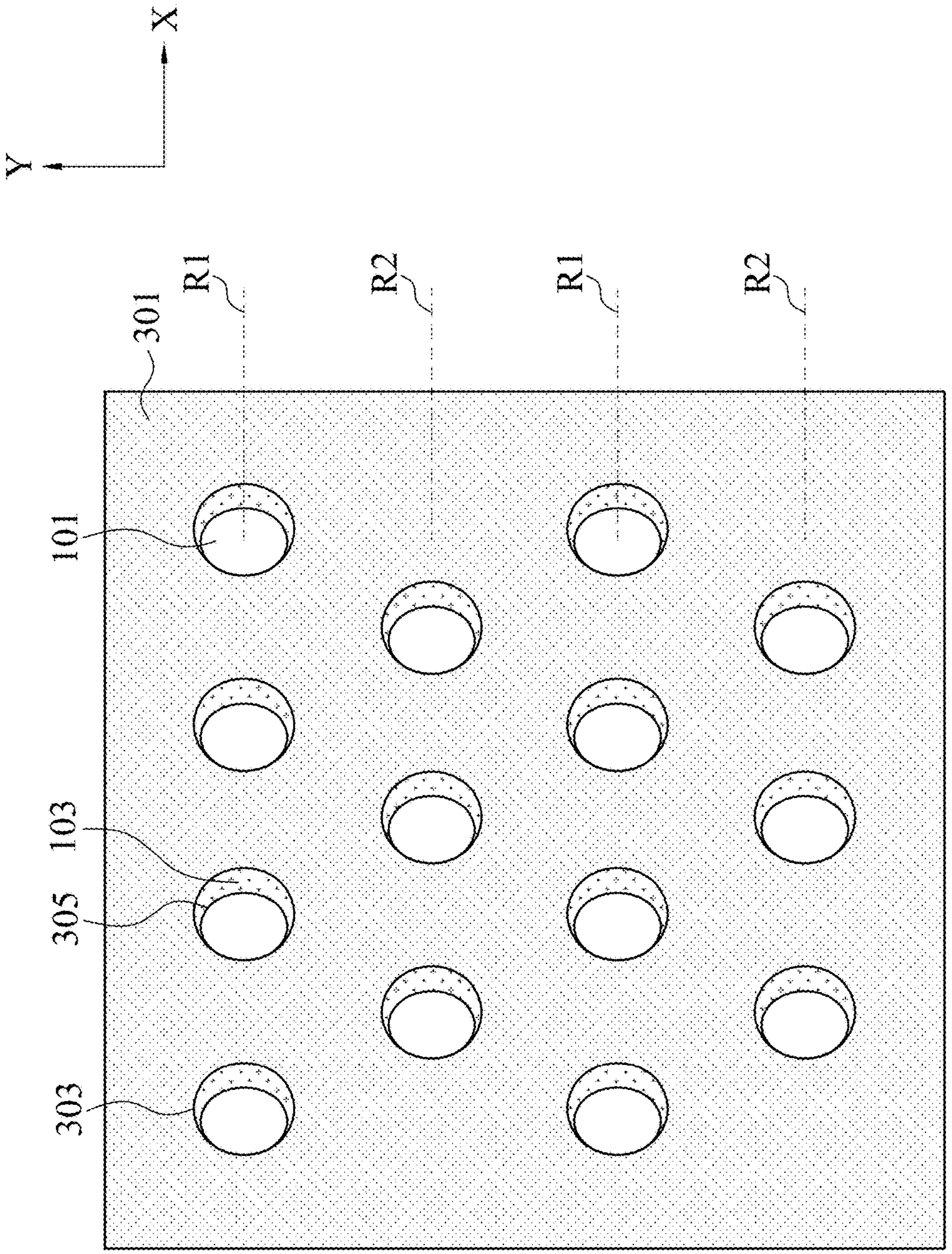
FIGS. 16 and 17 illustrate, in schematic top-view diagrams, intermediate semiconductor devices in accordance with another embodiment of the present disclosure.
Figure 17:
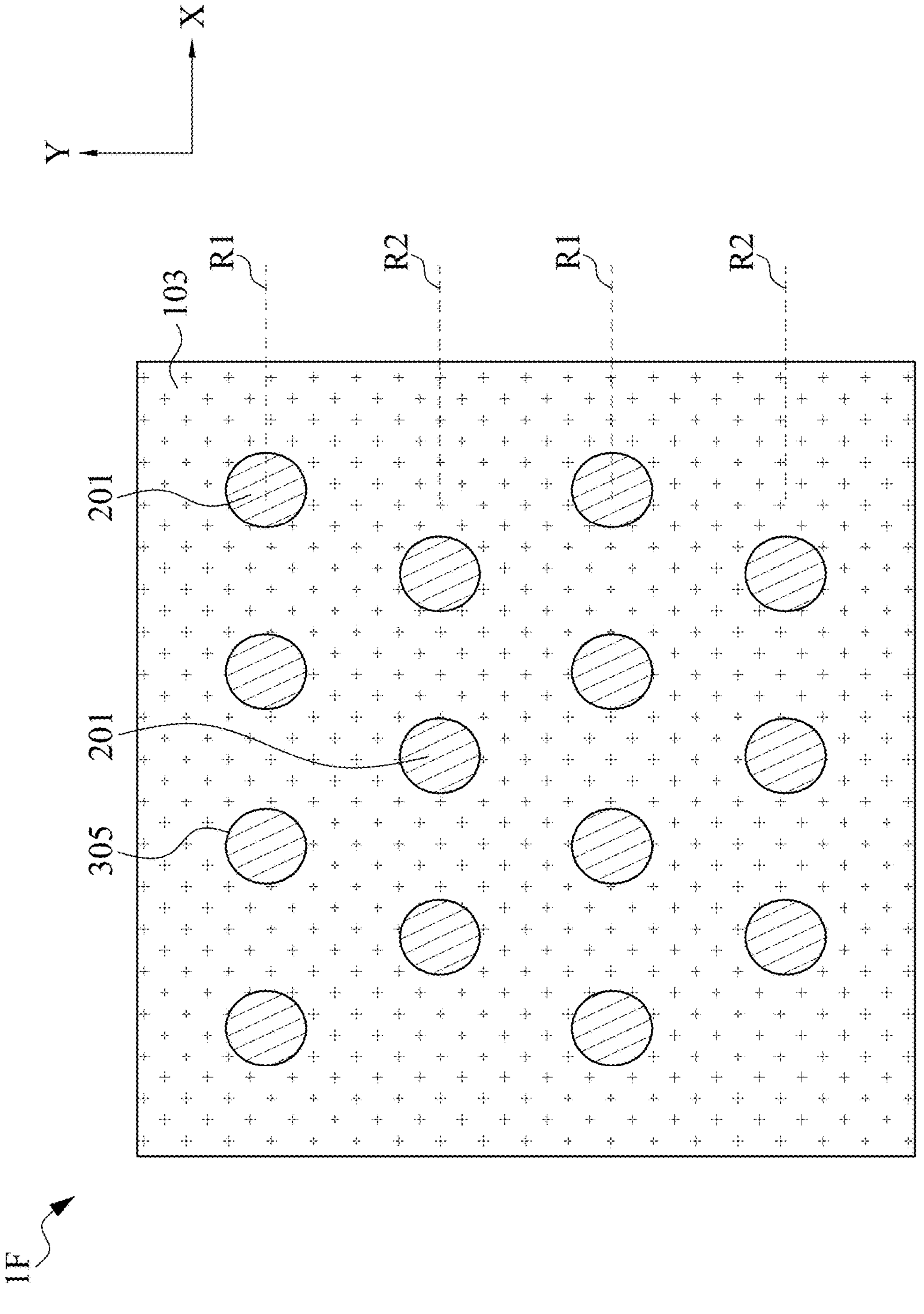

FIGS. 16 and 17 illustrate, in schematic top-view diagrams, intermediate semiconductor devices in accordance with another embodiment of the present disclosure.

With reference to FIG. 16, for fabrication a semiconductor device 1F, an intermediate semiconductor device may be fabricating with a procedure similar to that illustrated in FIGS. 2 to 5. The first hard mask openings 303 may be arranged in a diagonal dot pattern. The first hard mask openings 303 may be categorized into two groups. The first group of the first hard mask openings 303 may be disposed along a first set of rows R1. The second group of the first hard mask openings 303 may be disposed along a second set of rows R2. The first set of rows R1 and the second set of row R2 may be parallel to the first axis X. The first set of rows R1 and the second set of row R2 may be alternatively arranged. With respect to the second axis Y, the first hard mask openings 303 disposed along the second set of rows R2 may offset from the first hard mask openings 303 disposed along the first set of rows R1. Due to the first slanted recesses 305 may be formed using the first hard mask layer 301 and the first hard mask openings 303 as the pattern guides. Therefore, the arrangement of the first slanted recesses 305 may be similar to the arrangement of the first hard mask openings 303.

With reference to FIG. 17, a procedure similar to that illustrated in FIGS. 6 to 8 may be performed to the intermediate semiconductor device illustrated in FIG. 16. Due to the arrangement of the first slanted conductive layers 201 may be defined by the arrangement of the first slanted recesses 305. That is, the first slanted conductive layers 201 may be also arranged in a diagonal dot pattern. Specifically, the first slanted conductive layers 201 may also be categorized into two groups. The first group of the first slanted conductive layers 201 may be disposed along the first set of rows R1. The second group of the first slanted conductive layers 201 may be disposed along the second set of rows R2. The first set of rows R1 and the second set of row R2 may be parallel to the first axis X. The first set of rows R1 and the second set of row R2 may be alternatively arranged. With respect to the second axis Y, the first slanted conductive layers 201 disposed along the second set of rows R2 may offset from the first slanted conductive layers 201 disposed along the first set of rows R1.

The first slanted conductive layers 201 arranged in the diagonal dot pattern may make the distance between any two adjacent first slanted conductive layers 201 maximized. Therefore, the parasitic capacitance among the first slanted conductive layers 201 may be minimized.

Figure 18:
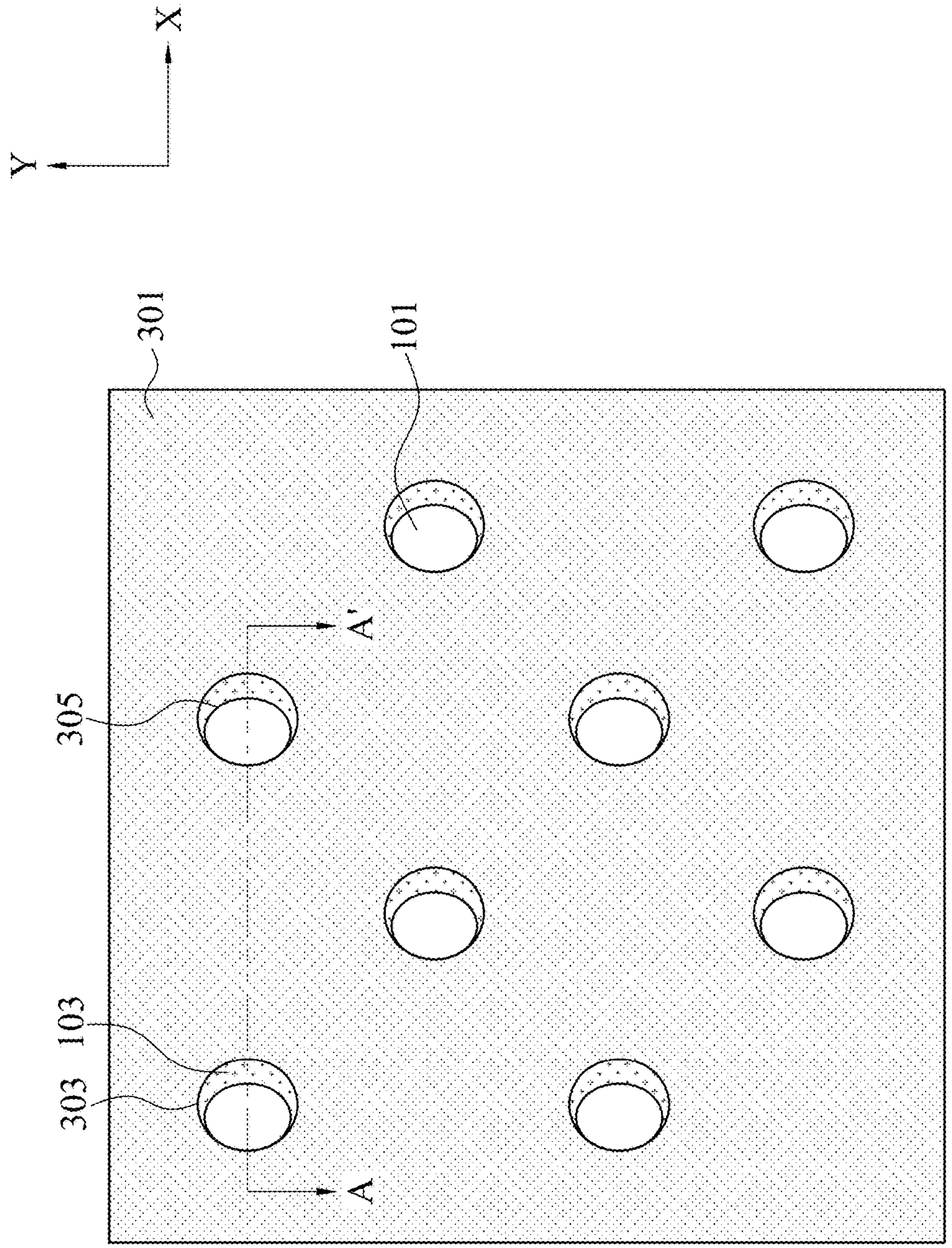
FIG. 18 illustrates, in a schematic top-view diagram, an intermediate semiconductor device in accordance with another embodiment of the present disclosure.
Figure 19:
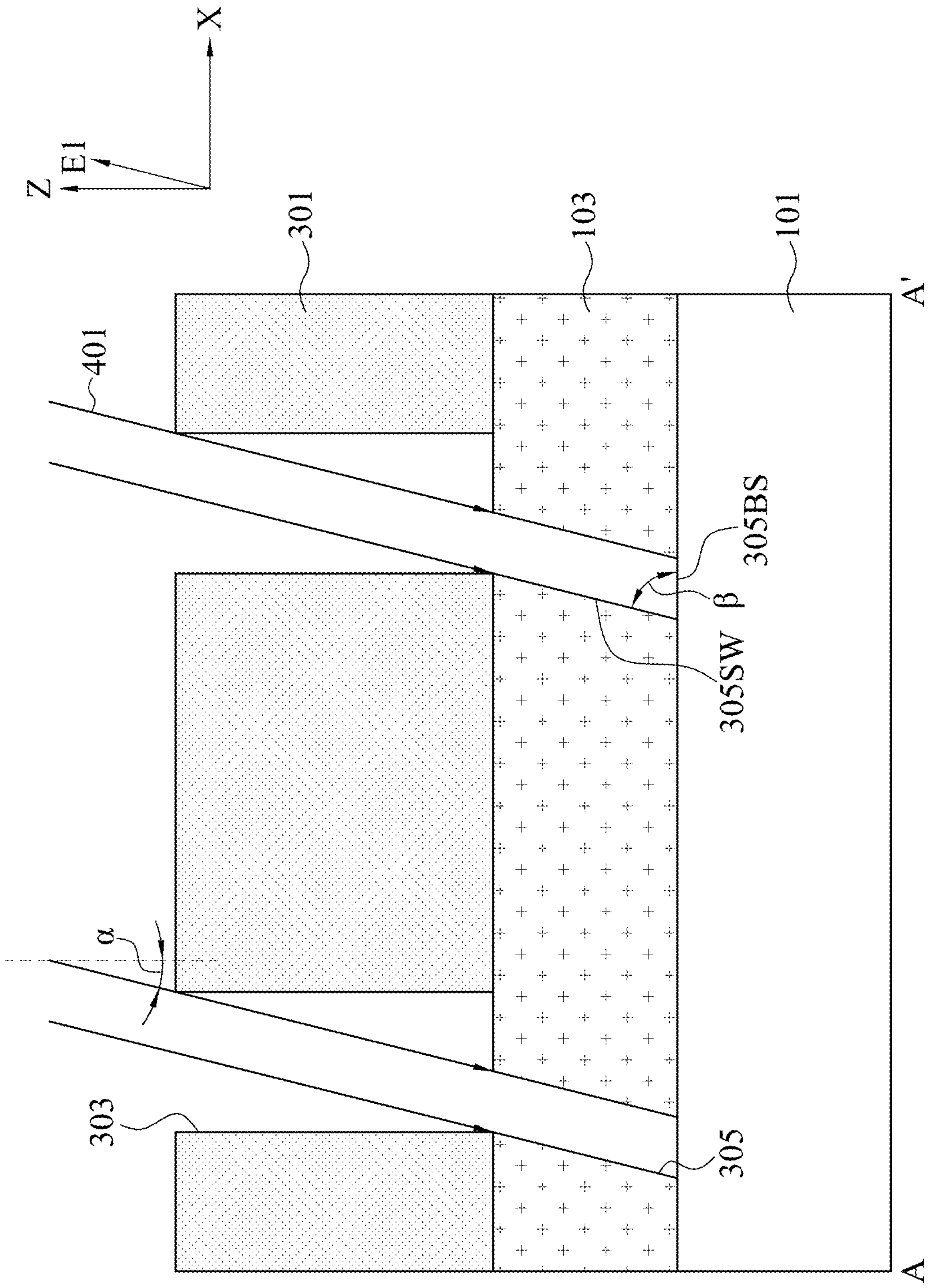
FIG. 19 is a schematic cross-sectional view diagram taken along a line A-A' in FIG. 18 in accordance with another embodiment of the present disclosure.

FIG. 18 illustrates, in a schematic top-view diagram, an intermediate semiconductor device in accordance with another embodiment of the present disclosure. FIG. 19 is a schematic cross-sectional view diagram taken along a line A-A' in FIG. 18 in accordance with another embodiment of the present disclosure.

With reference to FIGS. 18 and 19, for fabrication of a semiconductor device 1G, an intermediate semiconductor device may be fabricating with a procedure similar to that illustrated in FIGS. 2 to 5. In a top-view perspective, the first hard mask openings 303 may be arranged in a diagonal dot pattern and the first slanted recesses 305 may be arranged in a pattern similar to the first hard mask openings 303. In a cross-sectional perspective, the first slanted recesses 305 may have acute angles β similar to that illustrated in FIG. 5 and the first slanted recesses 305 may extended in the first direction E1. After formation of the first slanted recesses 305, the first hard mask layer 301 may be removed.

Figure 20:
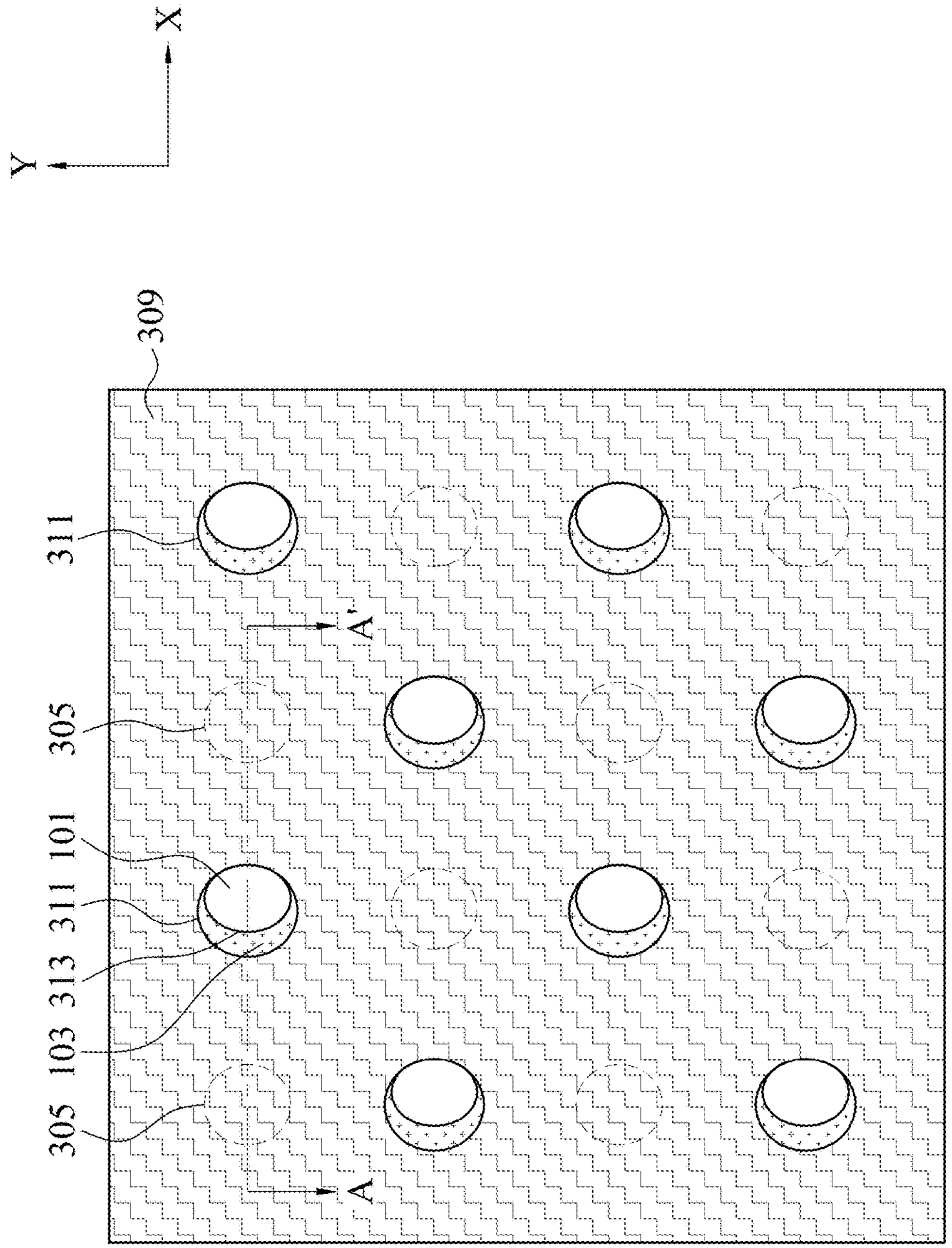
FIG. 20 illustrates, in a schematic top-view diagram, an intermediate semiconductor device in accordance with another embodiment of the present disclosure.
Figure 21:
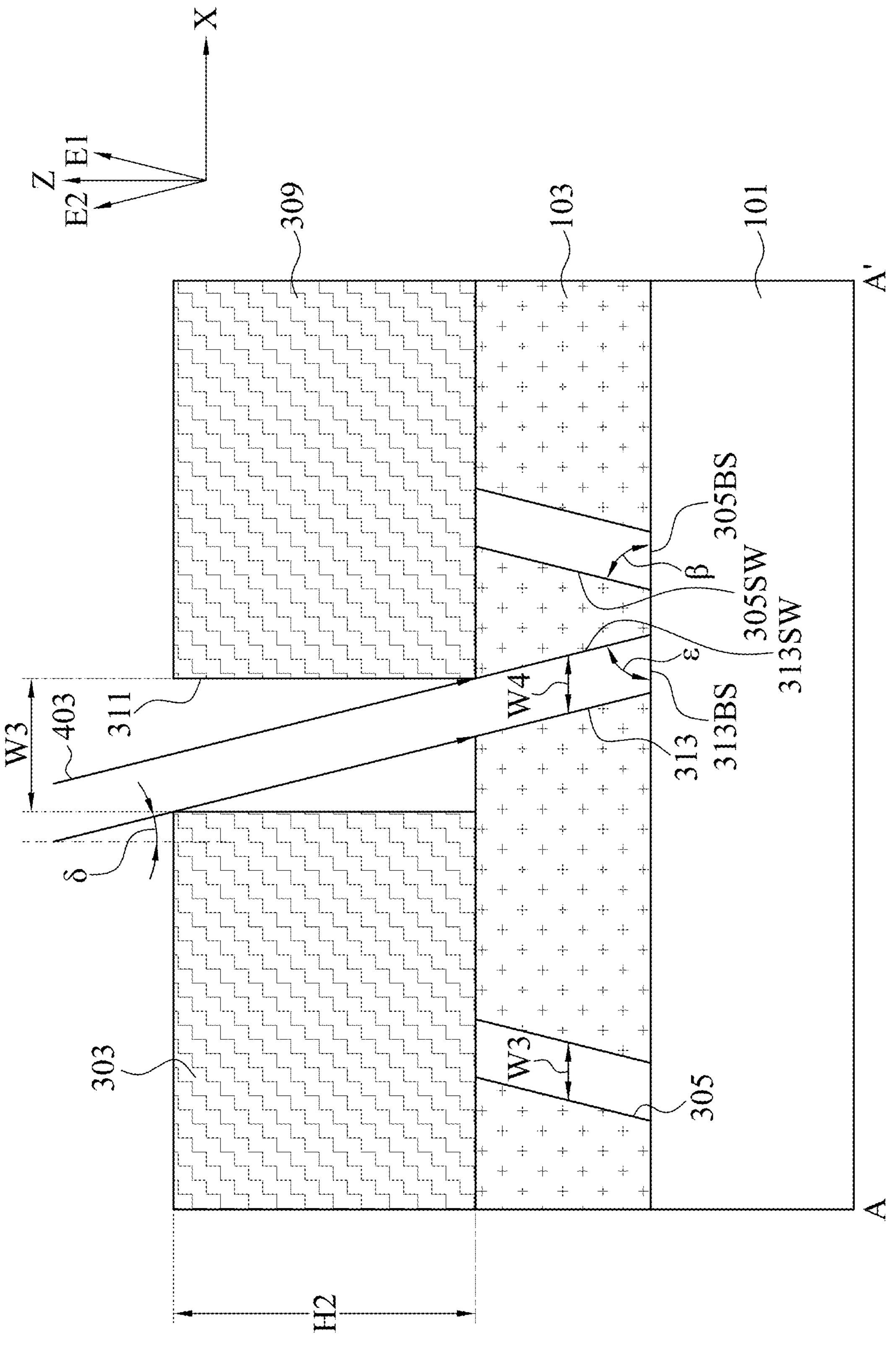
FIG. 21 is a schematic cross-sectional view diagram taken along a line A-A' in FIG. 20 in accordance with another embodiment of the present disclosure.

FIG. 20 illustrates, in a schematic top-view diagram, an intermediate semiconductor device in accordance with another embodiment of the present disclosure. FIG. 21 is a schematic cross-sectional view diagram taken along a line A-A' in FIG. 20 in accordance with another embodiment of the present disclosure.

With reference to FIGS. 20 and 21, a second hard mask layer 309 may be formed on the first insulating layer 103 with a procedure similar to the first hard mask layer 301 illustrated in FIGS. 2 and 3. The second hard mask layer 309 may be formed of a same material as the first hard mask layer 301 but is not limited thereto. Second hard mask openings 311 may be formed along the second hard mask layer 309. In a top-view perspective, the second hard mask openings 311 may be disposed in a diagonal pattern. The second hard mask openings 311 may be vertically or horizontally disposed between adjacent pairs of the first slanted recesses 305. In other words, the first slanted recesses 305 and the second hard mask openings 311 may be alternatively disposed along the first axis X and the second axis Y. That is, the first slanted recesses 305 and the second hard mask openings 311 may be staggered. In a cross-sectional perspective, a ratio of the width W3 of the second hard mask openings 311 to the height H2 of the second hard mask openings 311 may be between about 5:1 and about 1:15, between about 3:1 and about 1:13, between about 1:1 and about 1:11, and between about 5:1 and about 1:8.

With reference to FIGS. 20 and 21, a second slanted etch process 403 may use the second hard mask layer 309 as pattern guides to remove portions of the first insulating layer 103 and concurrently form second slanted recesses 313 along the first insulating layer 103. In some embodiments, the angle of incidence 8 of the second slanted etch process 403 may have a same value as the angle of incidence a of the first slanted etch process 401, but the incidence direction of the second slanted etch process 403 may be opposite to the incidence direction of the first slanted etch process 401. In other words, the angle of incidence 8 of the second slanted etch process 403 may be opposite to the angle of incidence a of the first slanted etch process 401.

In some embodiments, the second slanted etch process 403 may be an anisotropic etch process such as a reactive ion etching process. The process parameters of the second slanted etch process 403 may be the same to the first slanted etch process 401 but only the angles of incidence are different.

In some embodiments, the angle of incidence 8 of the second slanted etch process 403 may be between about-5 degree and about-80 degree, between about-20 degree and about-60 degree, and between about −20 degree and about-40 degree.

In some embodiments, the angle of incidence 8 of the second slanted etch process 403 may be define by the width W3 of the second hard mask layer 309 and the height H2 of the second hard mask openings 311.

In some embodiments, the etch rate of the first insulating layer 103 of the second slanted etch process 403 may be faster than the etch rate of the second hard mask layer 309 of the second slanted etch process 403. For example, an etch rate ratio of the first insulating layer 103 to the second hard mask layer 309 may be between about 100:1 and about 1.05:1, between about 100:1 and about 10:1, between about 50:1 and about 10:1, between about 30:1 and about 10:1, between about 20:1 and about 10:1, or between about 15:1 and about 10:1 during the second slanted etch process 403.

With reference to FIGS. 20 and 21, the width W4 of the second slanted recesses 313 may be less than the width W3 of the second hard mask openings 311. In some embodiments, the acute angles & between the bottom surfaces 313BS of the second slanted recesses 313 and the sidewalls 313SW of the second slanted recesses 313 may be different from or opposite to the acute angles β between the bottom surfaces 305BS of the first slanted recesses 305 and the sidewalls 305SW of the first slanted recesses 305. In some embodiments, the acute angles & between the bottom surfaces 313BS of the second slanted recesses 313 and the sidewalls 313SW of the second slanted recesses 313 may be between about-10 degree and about-85 degree, between about-20 degree and about-80 degree, between about-45 degree and about-80 degree, between about-60 degree and about-80 degree, and between about-70 degree and about-80 degree.

In some embodiments, the second slanted recesses 313 may be extended in a direction different from the first direction E1. In some embodiments, the second slanted recesses 313 may be extended in a second direction E2. The second direction E2 may be slanted with respect to the axis Z and the first axis X. The second direction E2 may be opposite to the first direction E1 with respect to the axis Z.

Figure 22:
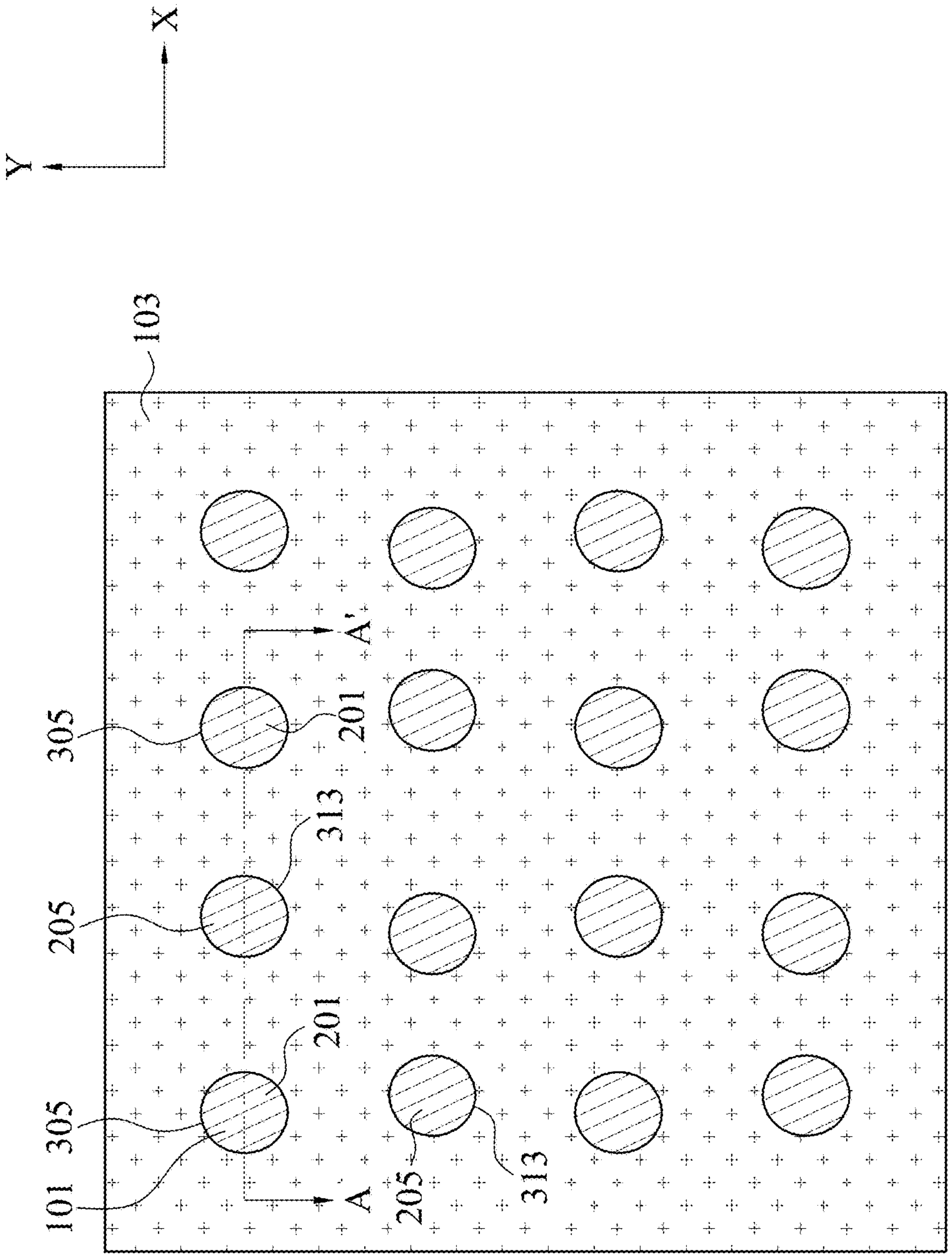
FIG. 22 illustrates, in a schematic top-view diagram, an intermediate semiconductor device in accordance with another embodiment of the present disclosure.
Figure 23:
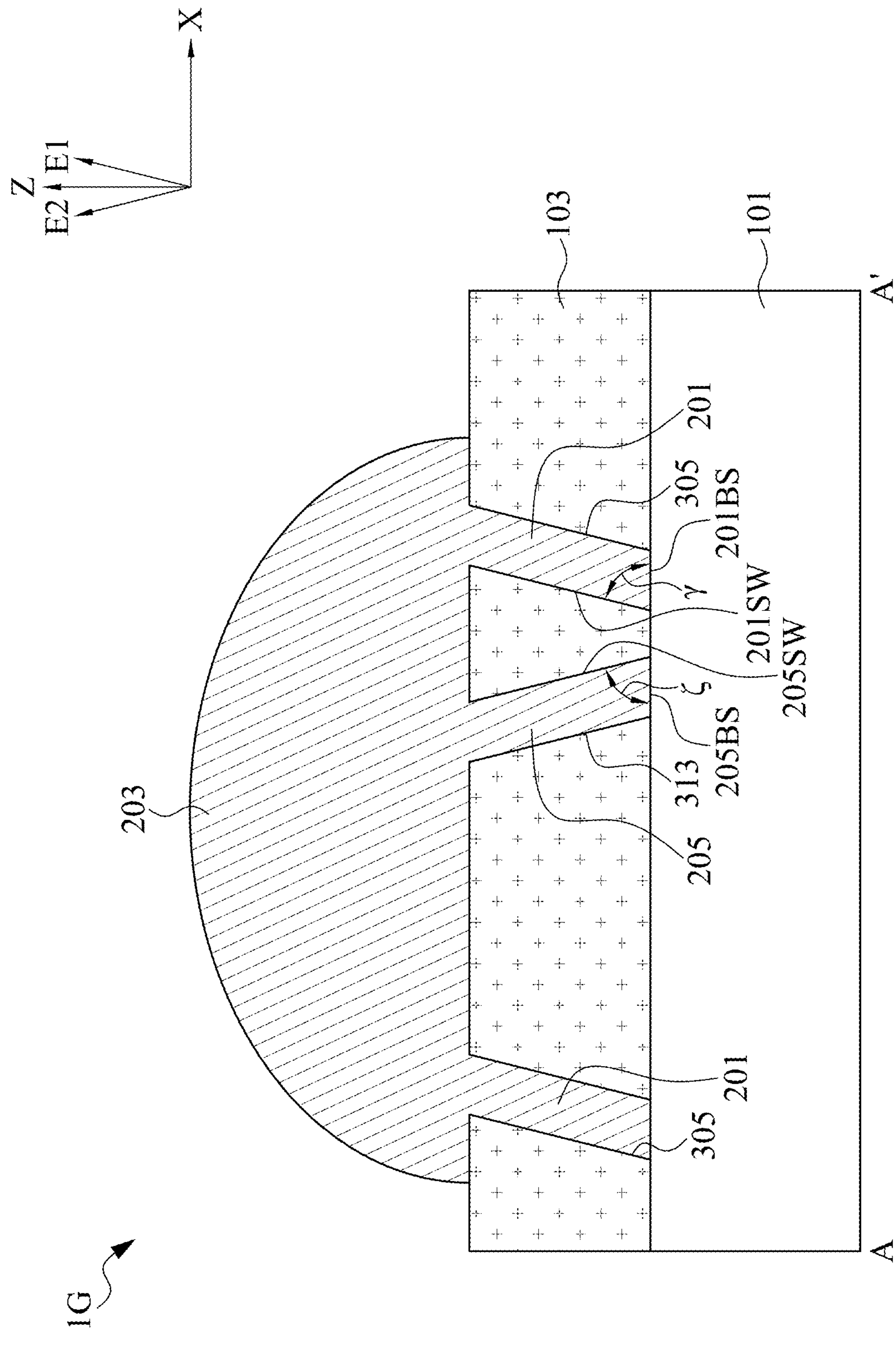
FIG. 23 is a schematic cross-sectional view diagram taken along a line A-A' in FIG. 22 in accordance with another embodiment of the present disclosure.

FIG. 22 illustrates, in a schematic top-view diagram, an intermediate semiconductor device in accordance with another embodiment of the present disclosure. FIG. 23 is a schematic cross-sectional view diagram taken along a line A-A' in FIG. 22 in accordance with another embodiment of the present disclosure.

With reference to FIGS. 22 and 23, a procedure similar to that illustrated in FIGS. 6, 7, and 14 may be performed to remove the second hard mask layer 309 and form the first slanted conductive layers 201, the second slanted conductive layers 205, and the top conductive layer 203. The first slanted conductive layers 201 may be formed in the first slanted recesses 305 and may have same acute angles γ and extension direction as illustrated in FIG. 8.

The second slanted conductive layers 205 may be formed in the second slanted recesses 313. In a cross-sectional perspective, the shape of the second slanted conductive layers 205 may be defined by the second slanted recesses 313. That is, in some embodiments, the acute angles ¿ between the bottom surfaces 205BS of the second slanted conductive layers 205 and the sidewalls 205SW of the second slanted conductive layers 205 may be between about-10 degree and about-85 degree, between about-20 degree and about-80 degree, between about-45 degree and about-80 degree, between about-60 degree and about-80 degree, and between about-70 degree and about-80 degree. In some embodiments, one of the first slanted conductive layers 201 and an adjacent one of the second slanted conductive layers 205 may be extended in different directions. In some embodiments, the second slanted conductive layers 205 may be extended in the second direction E2.

The top conductive layer 203 may formed on the first insulating layer 103 and covering the first slanted conductive layers 201 and the second slanted conductive layers 205.

Figure 24:
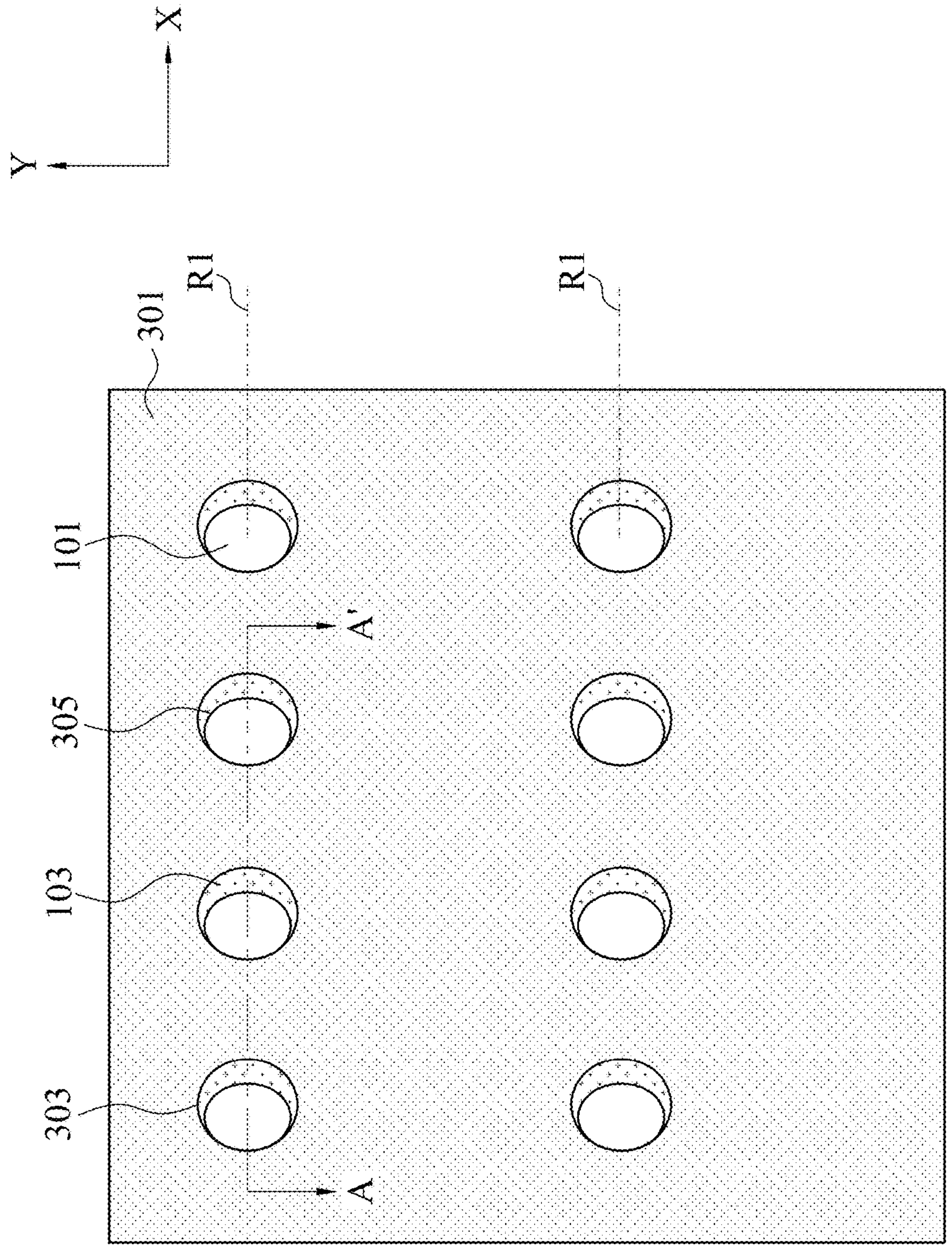
FIG. 24 illustrates, in a schematic top-view diagram, an intermediate semiconductor device in accordance with another embodiment of the present disclosure.
Figure 25:
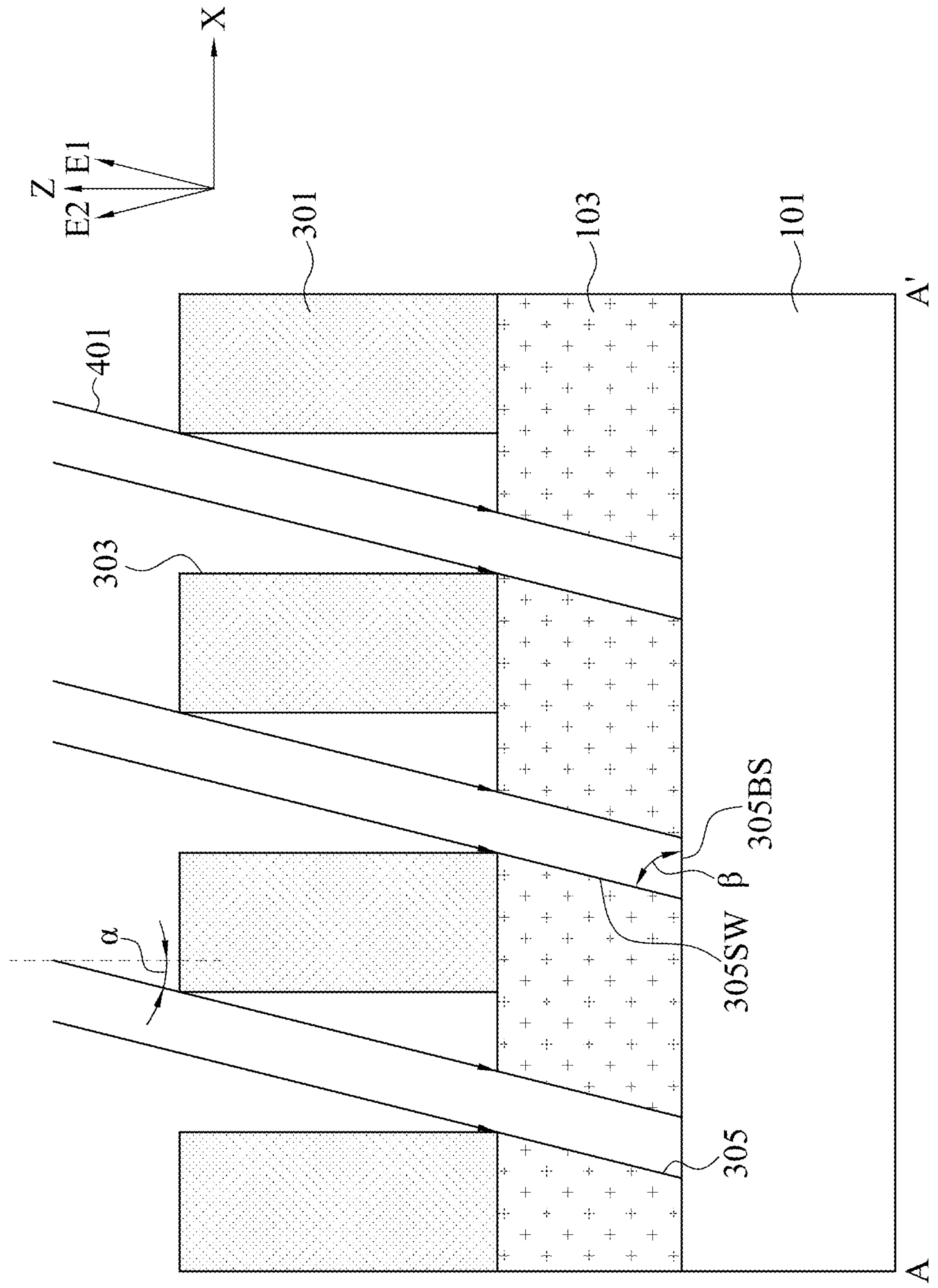
FIG. 25 is a schematic cross-sectional view diagrams taken along a line A-A' in FIG. 24 in accordance with another embodiment of the present disclosure.

FIG. 24 illustrates, in a schematic top-view diagram, an intermediate semiconductor device in accordance with another embodiment of the present disclosure. FIG. 25 is a schematic cross-sectional view diagrams taken along a line A-A' in FIG. 24 in accordance with another embodiment of the present disclosure.

With reference to FIGS. 24 and 25, for fabrication of a semiconductor device 1H, an intermediate semiconductor device may be fabricating with a procedure similar to that illustrated in FIGS. 2 to 5. In a top-view perspective, the first hard mask openings 303 may be disposed along a first set of rows R1. The first set of rows R1 may be parallel to the first axis X. The arrangement of the first slanted recesses 305 may be similar to the arrangement of the first hard mask openings 303. In a cross-sectional perspective, the first slanted recesses 305 may have similar acute angles and extension direction as illustrated in FIG. 5. After the formation of the first slanted recesses 305, the first hard mask layer 301 may be removed.

Figure 26:
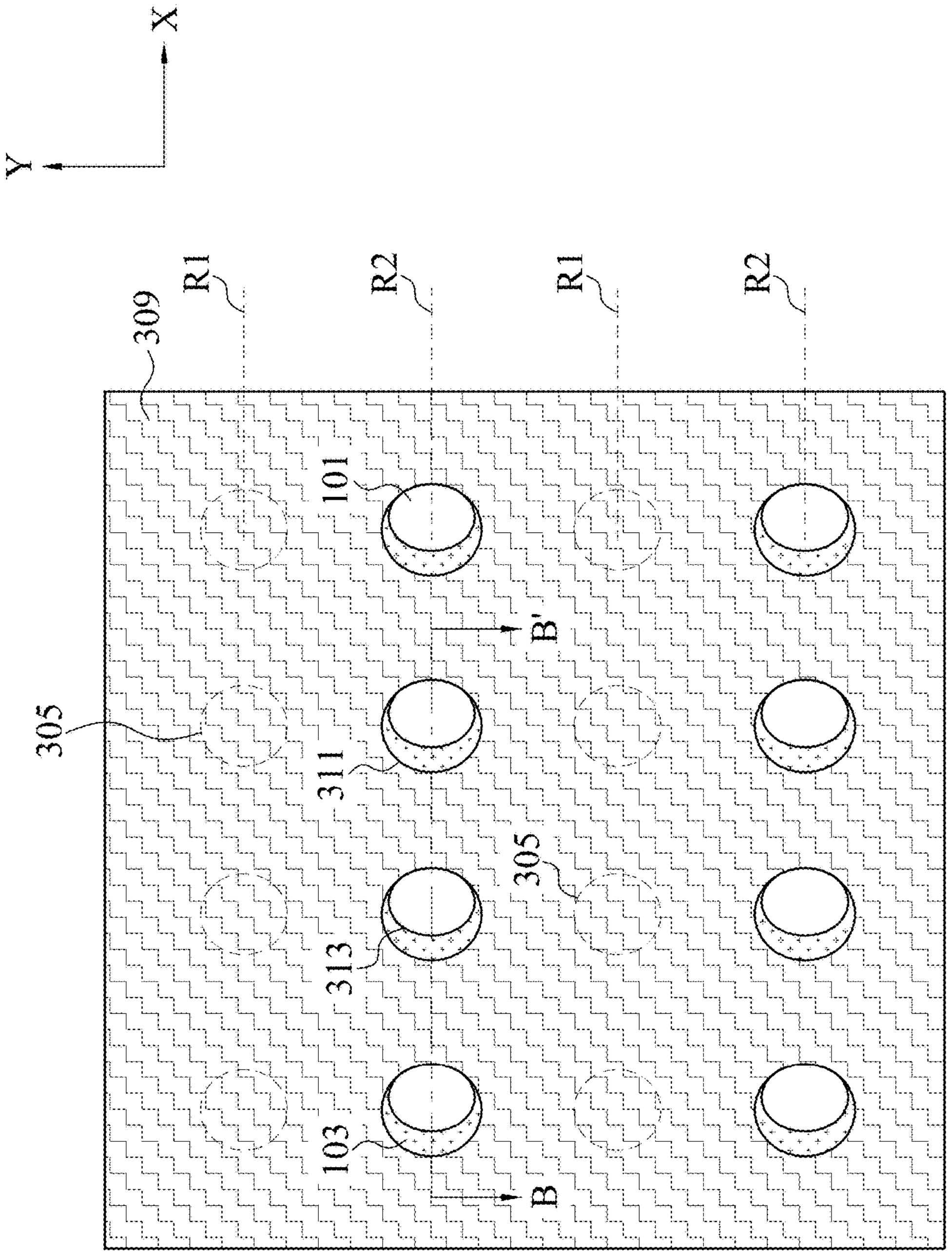
FIG. 26 illustrates, in a schematic top-view diagram, an intermediate semiconductor device in accordance with another embodiment of the present disclosure.
Figure 27:
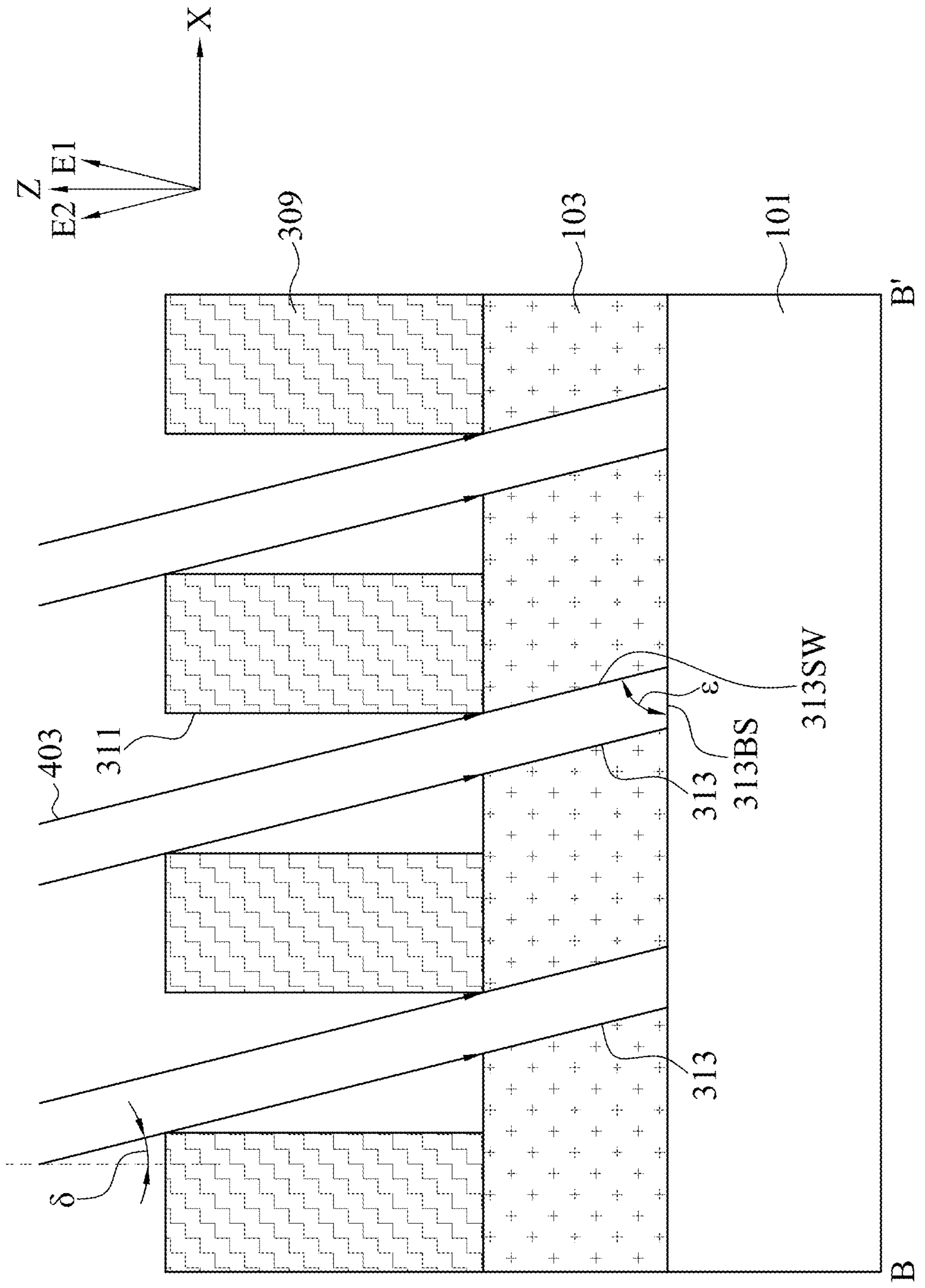
FIG. 27 is a schematic cross-sectional view diagrams taken along a line B-B' in FIG. 26 in accordance with another embodiment of the present disclosure.

FIG. 26 illustrates, in a schematic top-view diagram, an intermediate semiconductor device in accordance with another embodiment of the present disclosure. FIG. 27 is a schematic cross-sectional view diagrams taken along a line B-B' in FIG. 26 in accordance with another embodiment of the present disclosure.

With reference to FIGS. 26 and 27, a procedure similar to that illustrated in FIGS. 20 and 21 may be performed. In a top-view perspective, the second hard mask openings 311 may be disposed along a second set of rows R2. The second set of rows R2 may be parallel to the first axis X. The first set of rows R1 and the second set of row R2 may be alternatively arranged; in other words, the first set of rows R1 and the second set of row R2 may be staggered. The arrangement of the second slanted recesses 313 may be similar to the arrangement of the second hard mask openings 311. In a cross-sectional perspective, the second slanted recesses 313 may have similar acute angles and extension direction as illustrated in FIG. 21.

Figure 28:
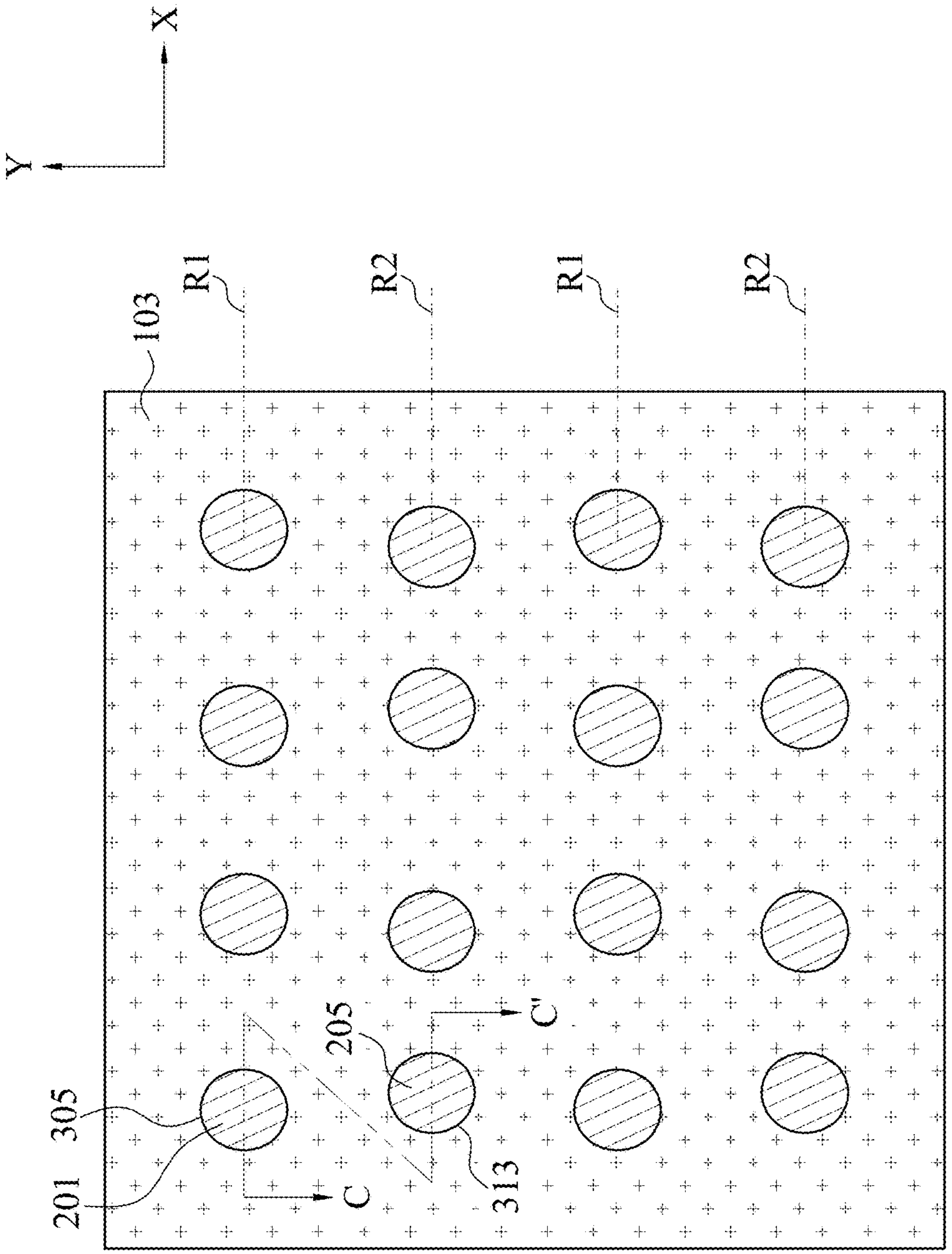
FIG. 28 illustrates, in a schematic top-view diagram, an intermediate semiconductor device in accordance with another embodiment of the present disclosure.
Figure 29:
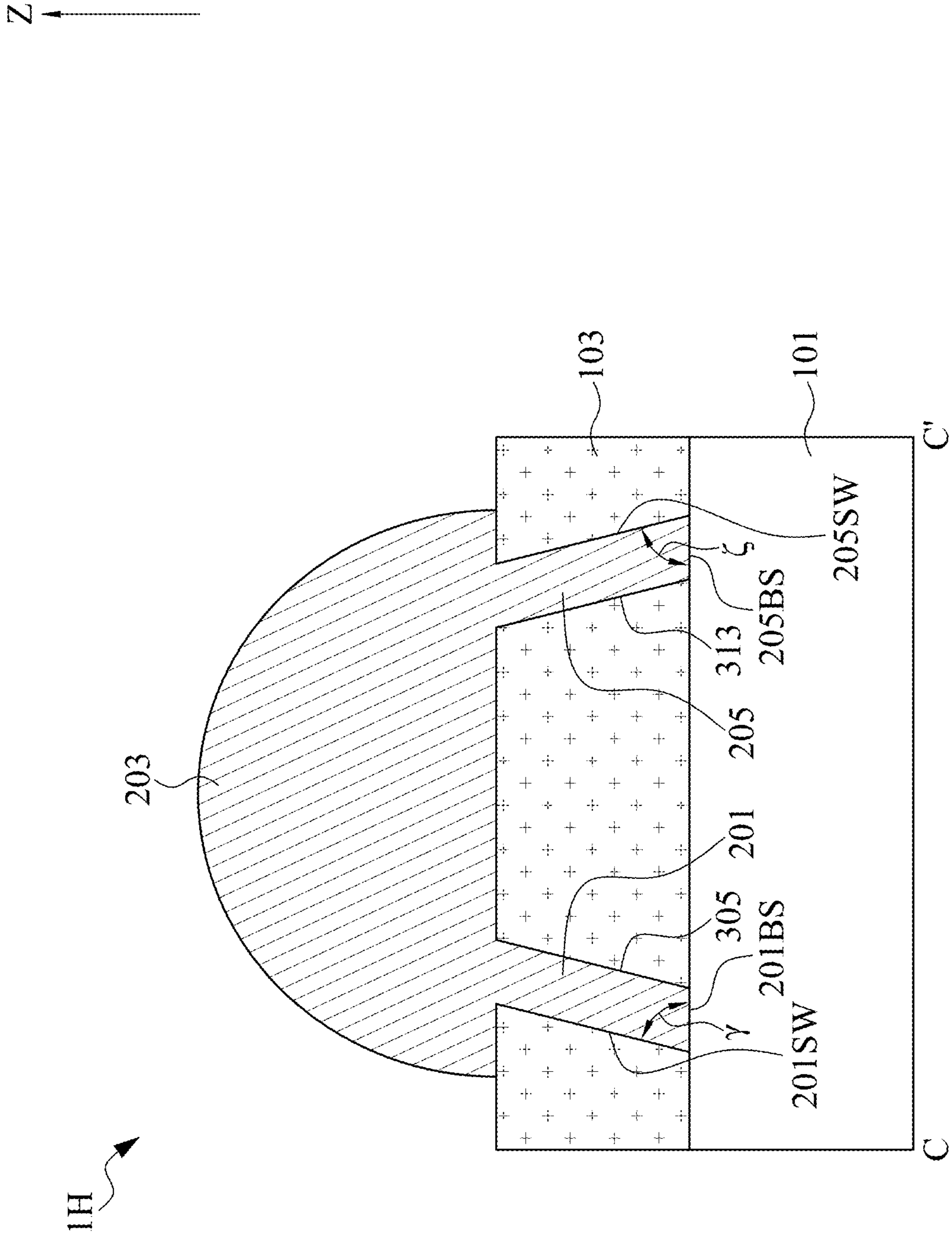
FIG. 29 is a schematic cross-sectional view diagrams taken along a line C-C' in FIG. 28 in accordance with another embodiment of the present disclosure.

FIG. 28 illustrates, in a schematic top-view diagram, an intermediate semiconductor device in accordance with another embodiment of the present disclosure. FIG. 29 is a schematic cross-sectional view diagrams taken along a line C-C' in FIG. 28 in accordance with another embodiment of the present disclosure.

With reference to FIGS. 28 and 29, a procedure similar to that illustrated in FIGS. 22 and 23 may be performed to remove the second hard mask layer 309 and form the first slanted conductive layers 201, the second slanted conductive layers 205, and the top conductive layer 203. In a cross-sectional perspective, the first slanted conductive layers 201 may be formed in the first slanted recesses 305 and may have same acute angles γ and extension direction as illustrated in FIG. 23. The second slanted conductive layers 205 may be formed in the second slanted recesses 313 and may have same acute angles (and extension direction as illustrated in FIG. 23. In a top-view perspective, the first slanted conductive layers 201 may be disposed along the first set of rows R1 and the second slanted conductive layers 205 may be disposed along the second set of rows R2. Due to the different incidence direction of the first slanted etch process 401 and the second slanted etch process 403, the second slanted conductive layers 205 may be offset from the first slanted conductive layers 201 with respect to the second axis Y.

The top conductive layer 203 may formed on the first insulating layer 103 and covering the first slanted conductive layers 201 and the second slanted conductive layers 205.

Figure 49:
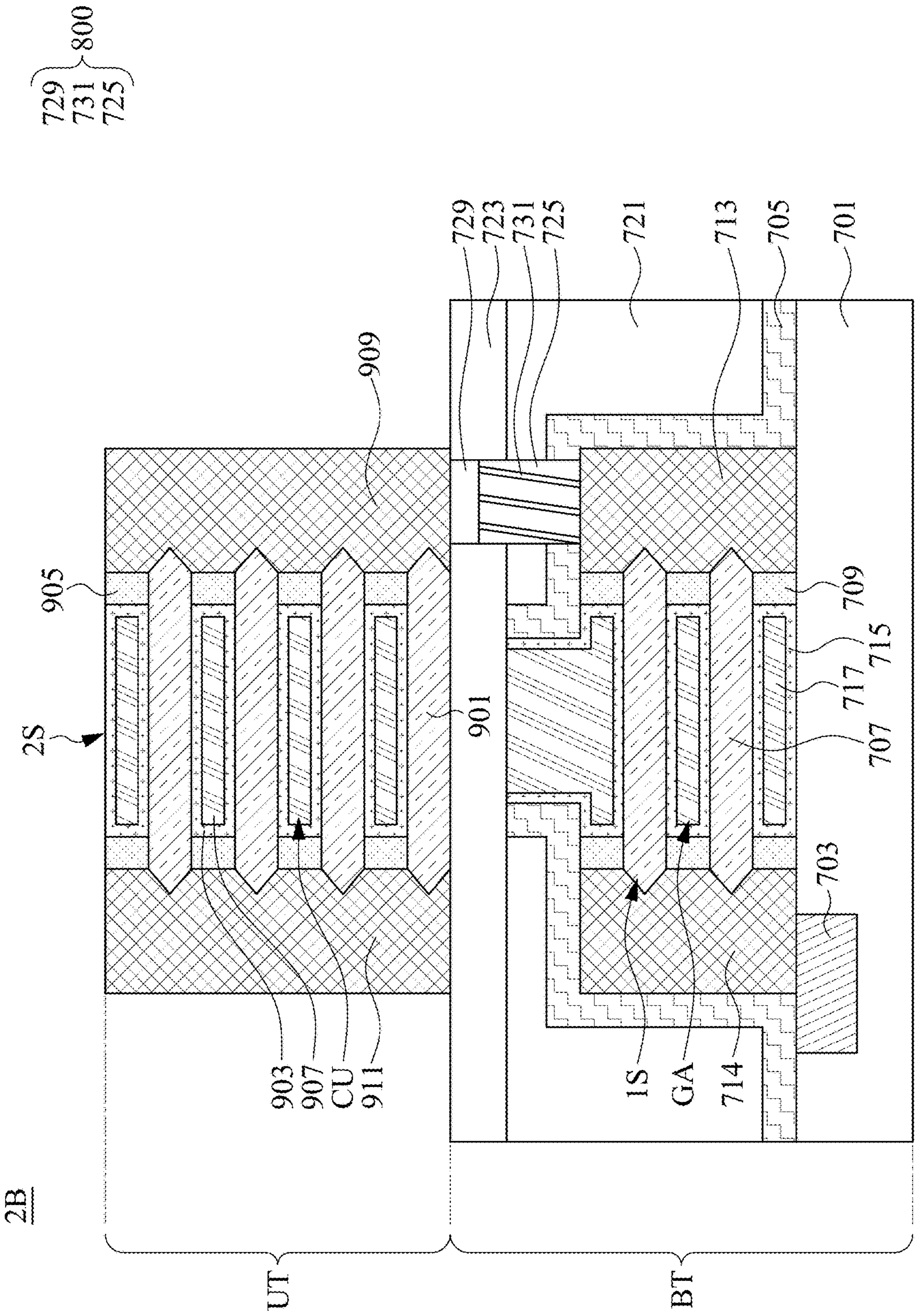
FIG. 49 is a schematic diagram of the semiconductor device according to some embodiments of the present disclosure.

In some embodiments, the aforementioned semiconductor devices 1A to semiconductor device 1H may be applied to other semiconductor device, such as the semiconductor device 2A shown in FIG. 39 and the semiconductor device 2B shown in FIG. 49.

Figure 37:
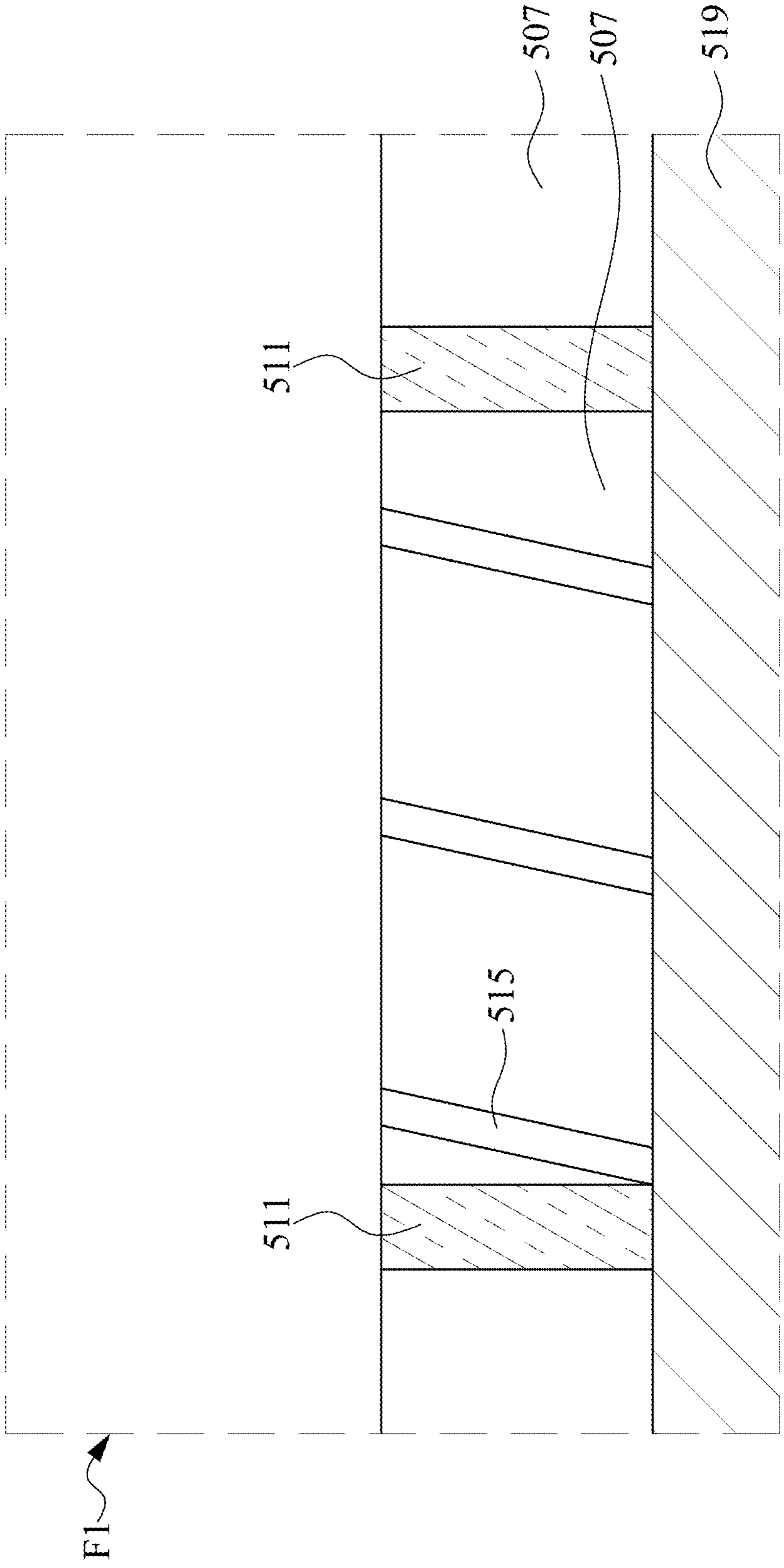
Figure 38:
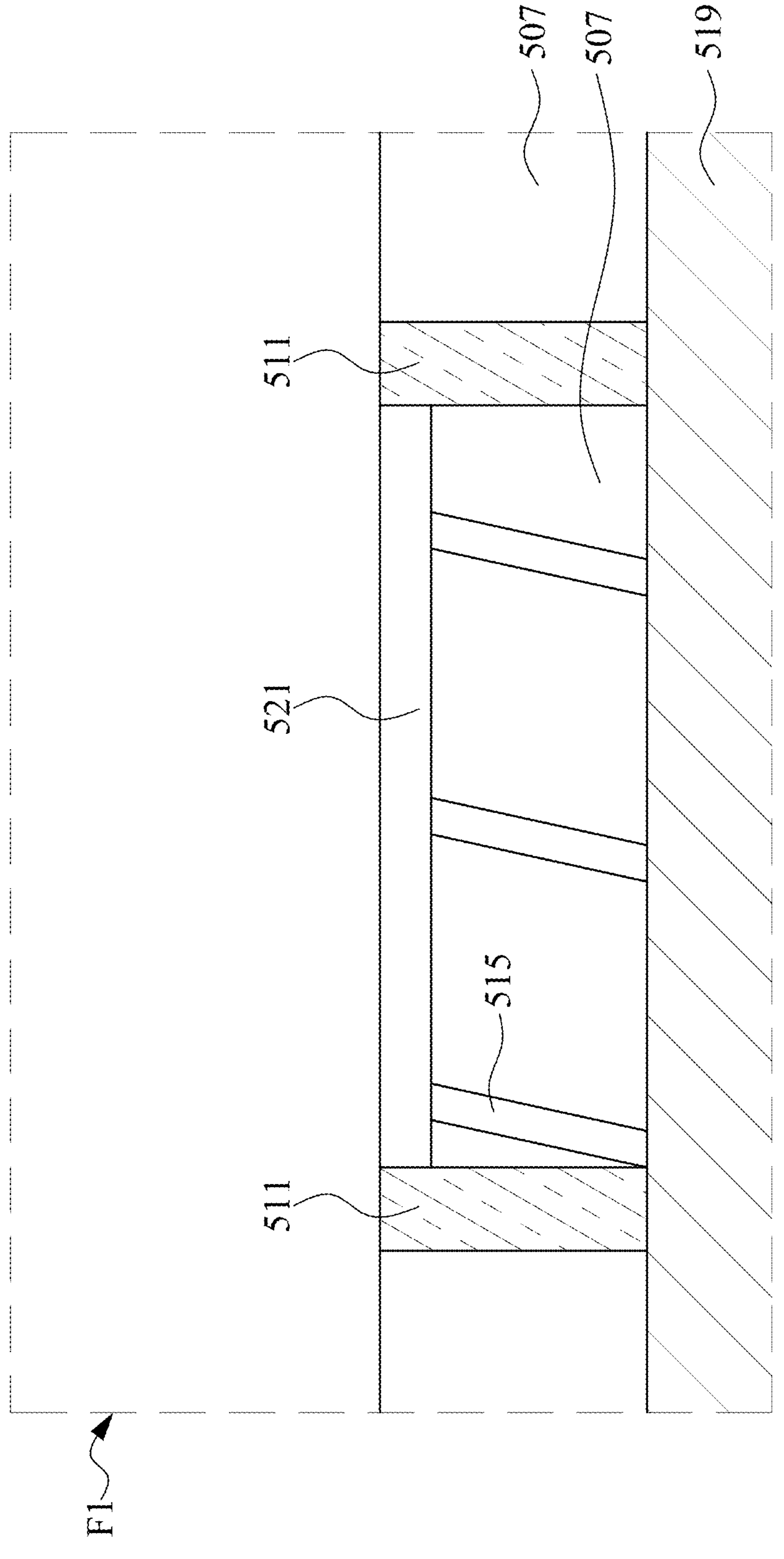
Figure 39A:
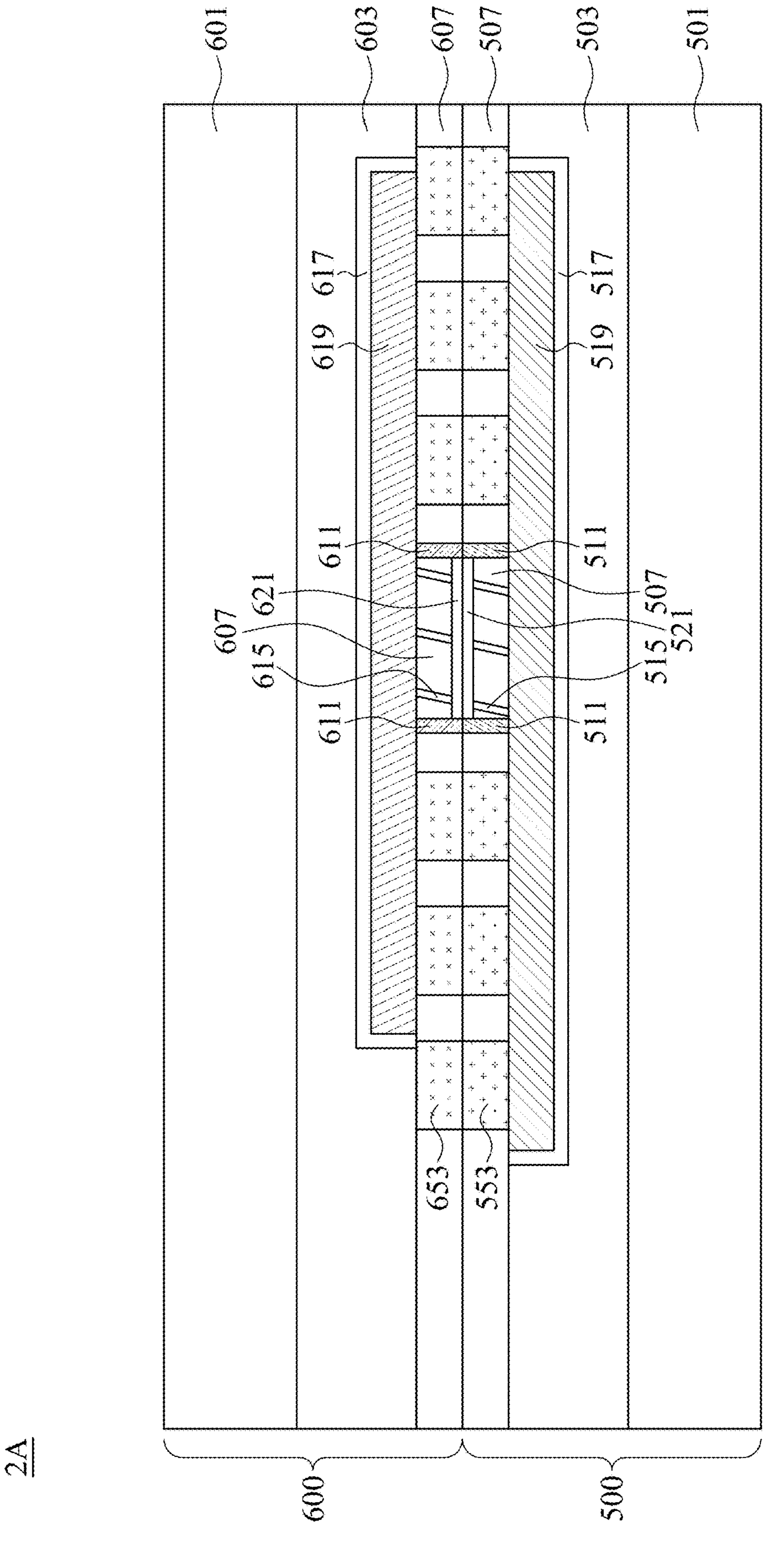
FIG. 39A is a schematic diagram of the semiconductor device according to some embodiments of the present disclosure.
Figure 39B:
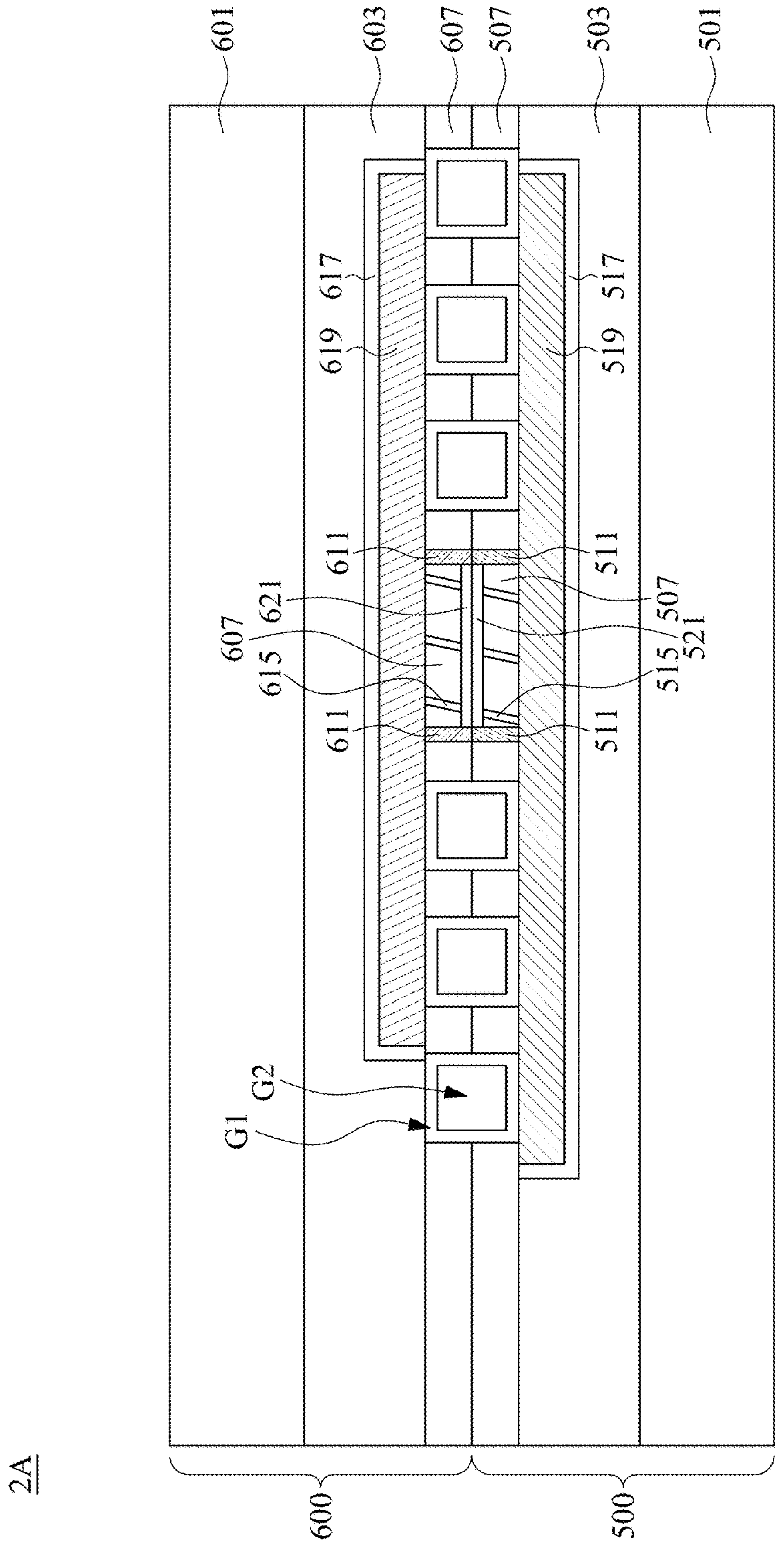
FIG. 39B is a schematic diagram of the semiconductor device according to other embodiments of the present disclosure.
Figure 40:
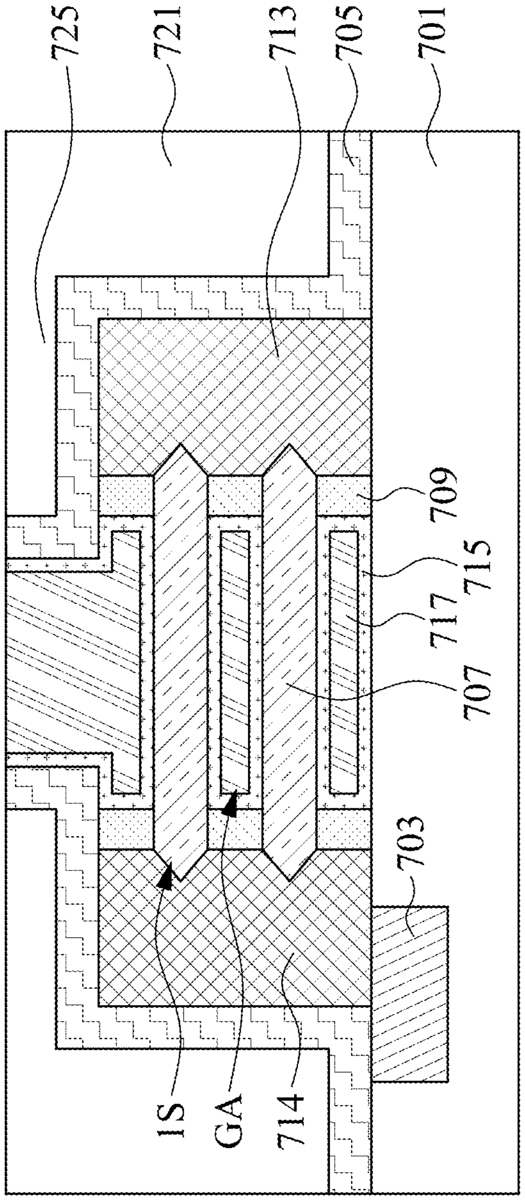
FIG. 40 to FIG. 48 are schematic diagrams of intermediate semiconductor device according to some embodiments of the present disclosure.

Reference is made to FIG. 30 to FIG. 39A and FIG. 39B. FIG. 30 to FIG. 38 are schematic diagrams of intermediate semiconductor device 2A according to some embodiments of the present disclosure. FIG. 39A is a schematic diagram of the semiconductor device 2A according to some embodiments of the present disclosure. FIG. 39B is a schematic diagram of the semiconductor device 2A according to other embodiments of the present disclosure.

The semiconductor device 2A includes a first semiconductor die 500 and a second semiconductor die 600 bonded on the first semiconductor die. In some embodiments, the configurations of first semiconductor die 500 and the second semiconductor die 600 are substantially mirror symmetry. In addition, the manufacturing processes of the first semiconductor die 500 and the second semiconductor die 600 are similar. For the sake of brevity, only the first semiconductor die 500 is described below.

Figure 30:
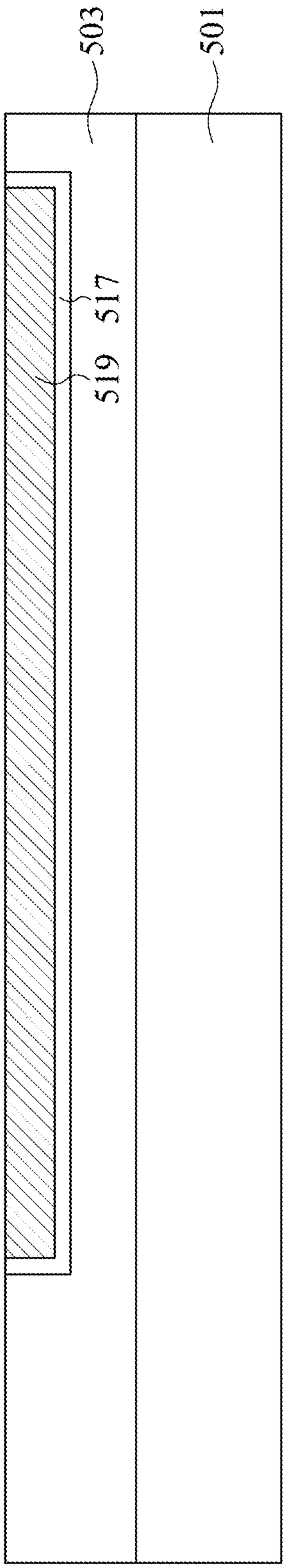
FIG. 30 to FIG. 38 are schematic diagrams of intermediate semiconductor device according to some embodiments of the present disclosure.

In FIG. 30, a dielectric layer 503 is disposed over a semiconductor substrate 501, and a metal layer 519 is disposed in the dielectric layer 503. The metal layer 519 is separated from the dielectric layer 503 by a barrier layer 517. The dielectric layer 503, the barrier layer 517, and the metal layer 519 are coplanar.

Figure 31:
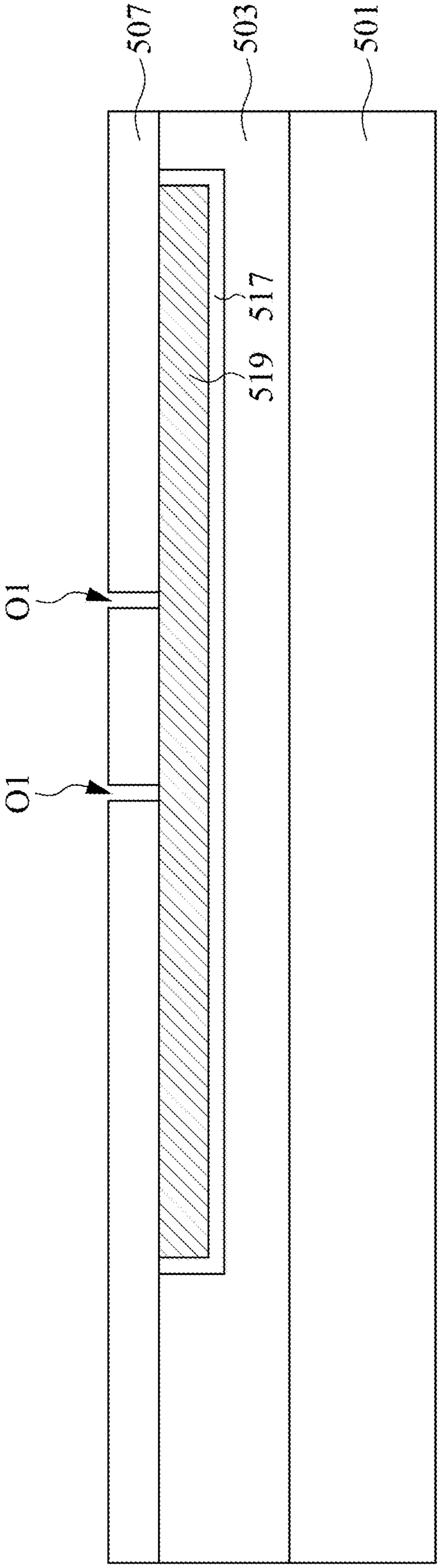

In FIG. 31, a dielectric layer 507 is formed over the dielectric layer 503, the barrier layer 517, and the metal layer 519. The dielectric layer 507 is then etched by using a pattern mask (not shown) to formed openings O1. A portion of the top surface of the metal layer 519 is exposed by the openings O1. The opening O1 may be formed by a wet etching process, a dry etching process, or a combination thereof. The patterned mask is removed after the opening O1 is formed.

Figure 32:
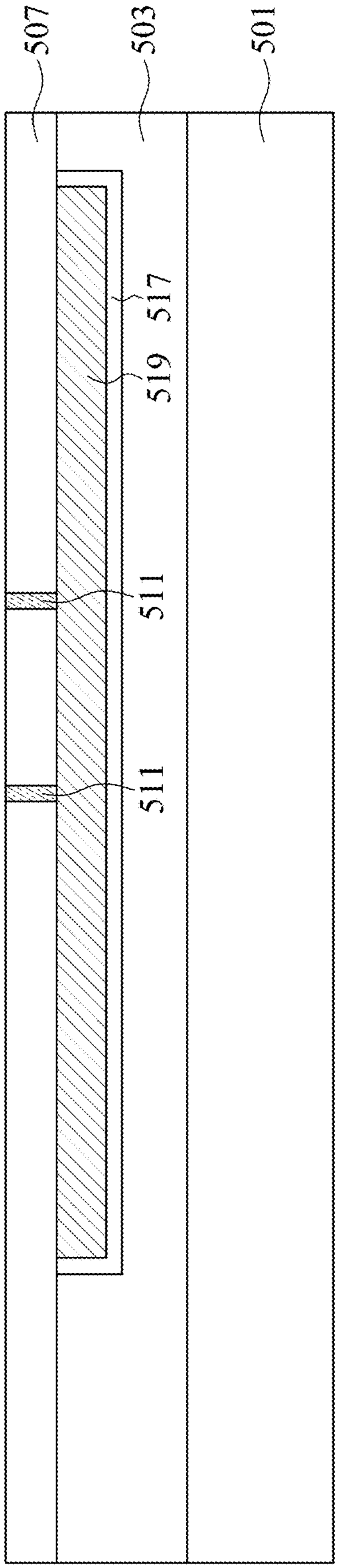

In FIG. 32, a conductive polymer material 511 is filled into the openings O1. In some embodiments, the conductive polymer material 511 includes graphene or conjugated polymer, such as poly (3,4-ethylenedioxythiophene) (PEDOT), or polyaniline (PANI). In some embodiments, the conductive polymer material 511 is formed by a CVD process, a PVD process, an ALD process, a spin-on coating process, or another applicable process. After the conductive polymer material 511 is filled into the openings O1, an etching process and/or a planarization process are performed to remove excess conductive polymer material 511 over the top surface of the dielectric layer 507. Therefore, the top surface of the dielectric layer 507 and the top surface of the conductive polymer material 511 are coplanar with each other.

Figure 33:
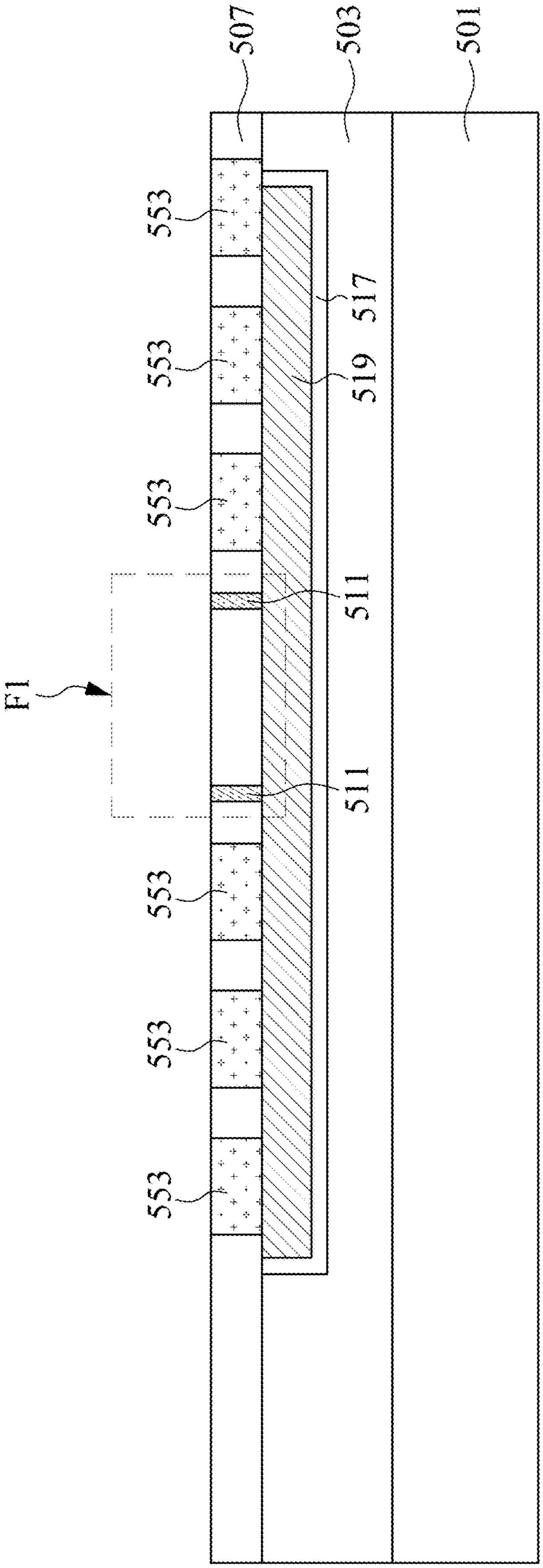

In FIG. 33, an energy removable material 553 is formed in the dielectric layer 507. The dielectric layer 507 is etched by using a pattern mask (not shown) to forms openings, in which the openings are not disposed between the conductive polymer materials 511. After the openings are formed, the energy removable material 553 are filled into the openings. Next, the pattern mask is removed. As illustrated in FIG. 33, each of the energy removable material 553 is in contact with the metal layer 519, and at least one of the energy removable material 553 is further in contact with the barrier layer 517 and the dielectric layer 503.

In some embodiments, the energy removable material 553 includes a thermal decomposable material. In some other embodiments, the energy removable material 553 includes a photonic decomposable material, an e-beam decomposable material, or another applicable energy decomposable material. In some embodiments, the energy removable material 553 includes a base material and a decomposable porogen material that is substantially removed once being exposed to an energy source (e.g., heat). In some embodiments, the base material includes hydrogen silsesquioxane (HSQ), methylsilsesquioxane (MSQ), porous polyarylether (PAE), porous SiLK, or porous silicon oxide ($SiO_2$), and the decomposable porogen material includes a porogen organic compound, which can provide porosity to the space originally occupied by the energy removable material 553 in the subsequent processes.

Figure 34:
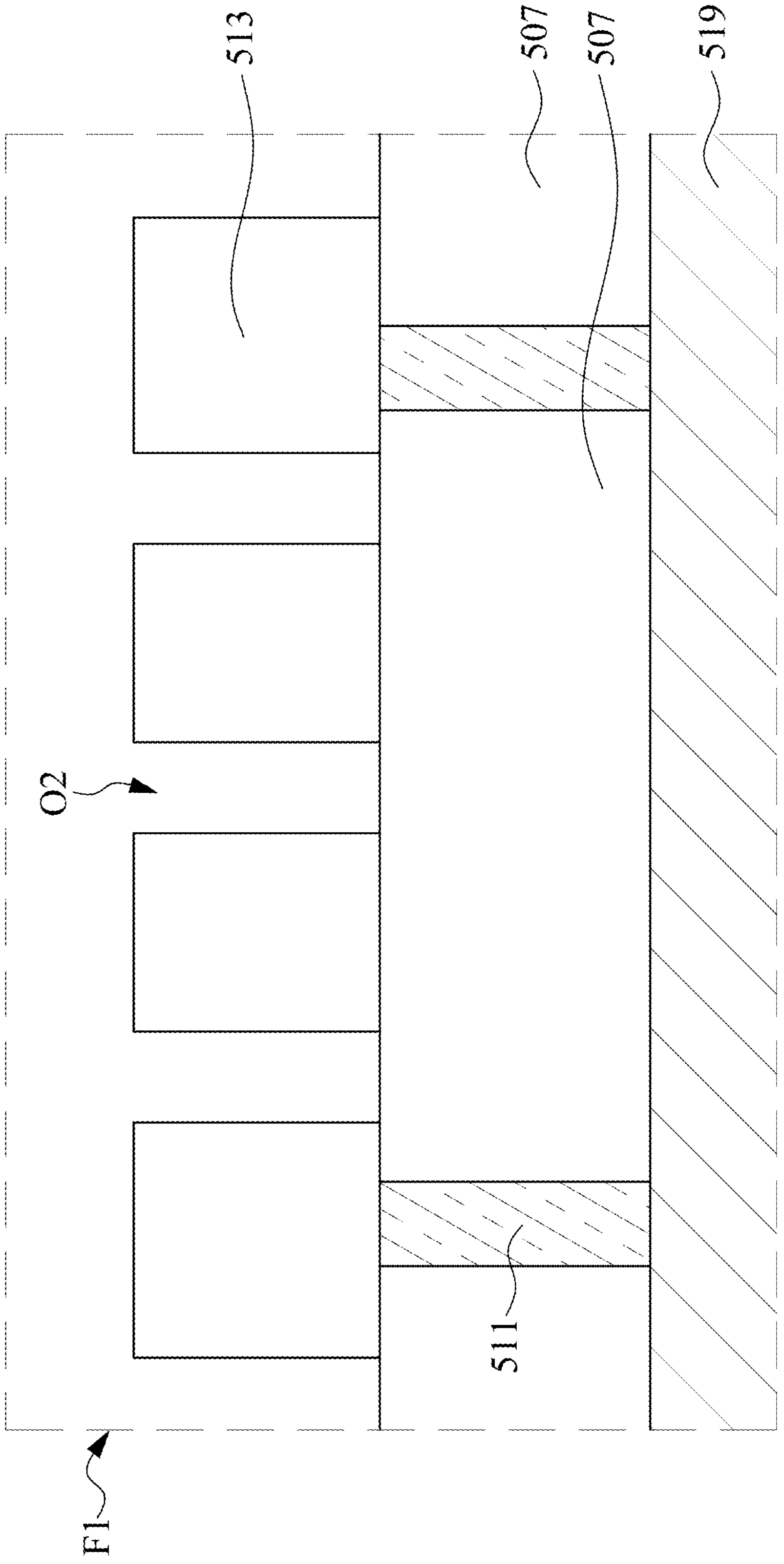

In FIG. 34, a region enclosed by a virtual frame F1 shown in FIG. 33 is illustrated. In the virtual frame F1, a hard mask layer 513 is formed over the dielectric layer 507. The hard mask layer 513 is patterned to have openings O2 arranged between the conductive polymer materials 511, and a portion of the top surface of the dielectric layer 507 is exposed by the openings O2.

It should be noted that the dielectric layer 507 out of the region enclosed by the virtual frame F1 is fully covered by the hard mask layer 513. In other words, there is no openings O2 formed out of the region enclosed by the virtual frame F1.

Figure 35:
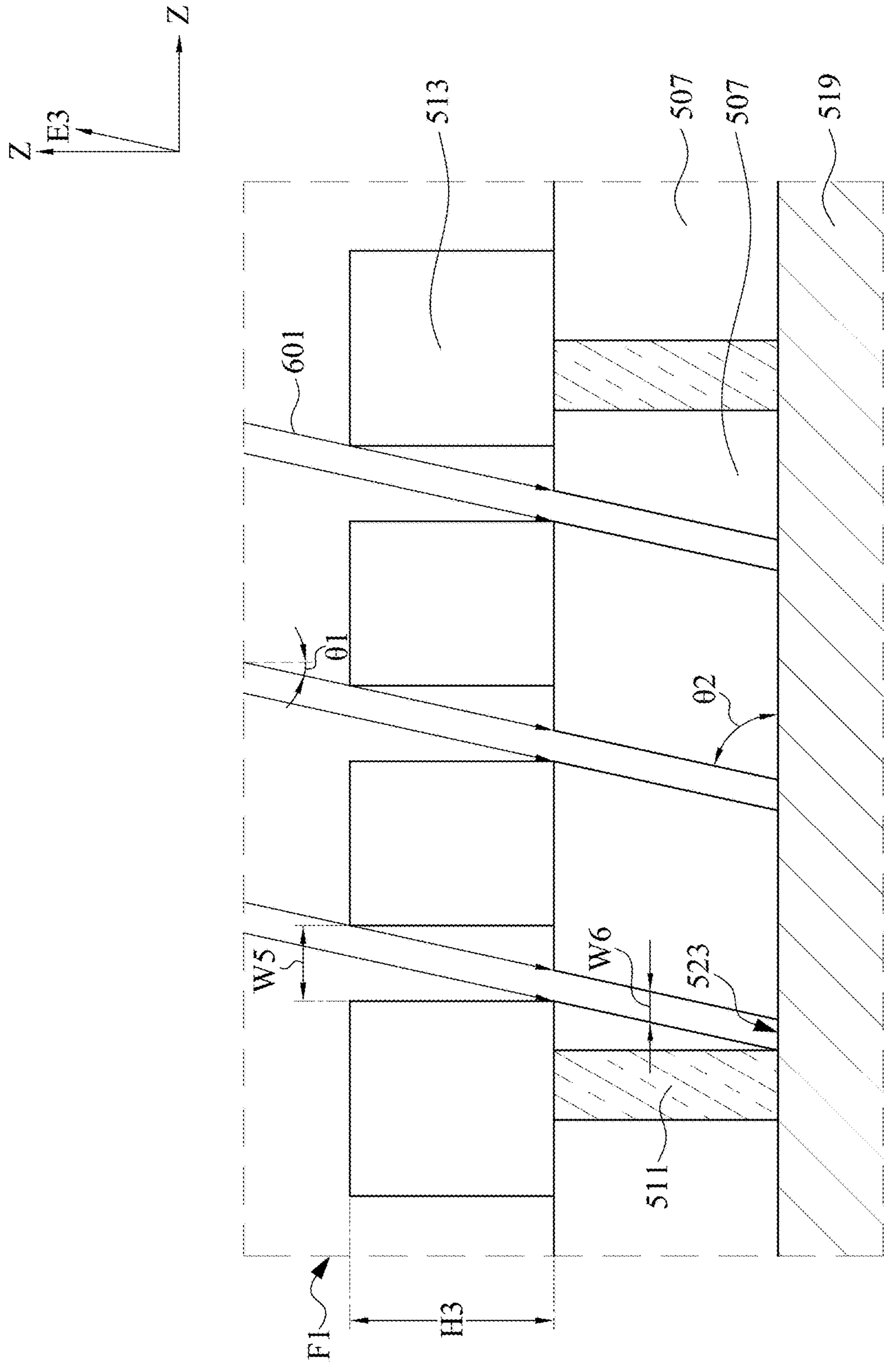

In FIG. 35, a slanted etch process 601 is performed to form slanted recesses O3 (shown in FIG. 36) in the dielectric layer 507. The slanted etch process 601 may use the hard mask layer 513 as pattern guides to remove portions of the dielectric layer 507 and concurrently form the slanted recesses O3 along the dielectric layer 507. The angle of incidence O1 of the slanted etch process 601 may be defined by a width W5 of the openings O2 and a height H3 of the dielectric layer 507.

In some embodiments, the angle of incidence O1 of the slanted etch process 601 may be between about 5 degrees and about 80 degrees. In some embodiments, the angle of incidence O1 may be between about 20 degrees and about 60 degrees. In some embodiments, the angle of incidence O1 may be between about 20 degrees and about 40 degrees.

In some embodiments, the slanted etch process 601 may be an anisotropic etch process such as a reactive ion etching process. The reactive ion etching process may include etchant gases and passivation gases which may suppress the isotropic effect to limit the removal of material in the horizontal direction. The etchant gases may include chlorine gas and boron trichloride. The passivation gases may include fluoroform or other suitable halocarbons. In some embodiments, the hard mask layer 513 formed of carbon film may serve as a halocarbon source for the passivation gases of the reactive ion etching process.

In some embodiments, the etch rate of the dielectric layer 507 of the slanted etch process 601 may be faster than the etch rate of the hard mask layer 513 of the slanted etch process 601. For example, an etch rate ratio of the dielectric layer 507 to the hard mask layer 513 may be between about 100:1 and about 1.05:1, between about 100:1 and about 10:1, between about 50:1 and about 10:1, between about 30:1 and about 10:1, between about 20:1 and about 10:1, or between about 15:1 and about 10:1 during the slanted etch process 601.

A width W6 of the slanted recesses O3 is less than the width W5 of the openings O2. The acute angles θ2 between a bottom surface 523 and a sidewall of the slanted recesses O3 may be between about 10 degrees and about 85 degrees, between about 20 degrees and about 80 degrees, between about 45 degrees and about 80 degrees, between about 60 degrees and about 80 degrees, and between about 70 degrees and about 80 degrees. In some embodiments, the bottom surface 523 is also a top surface of the metal layer 519.

Figure 36:
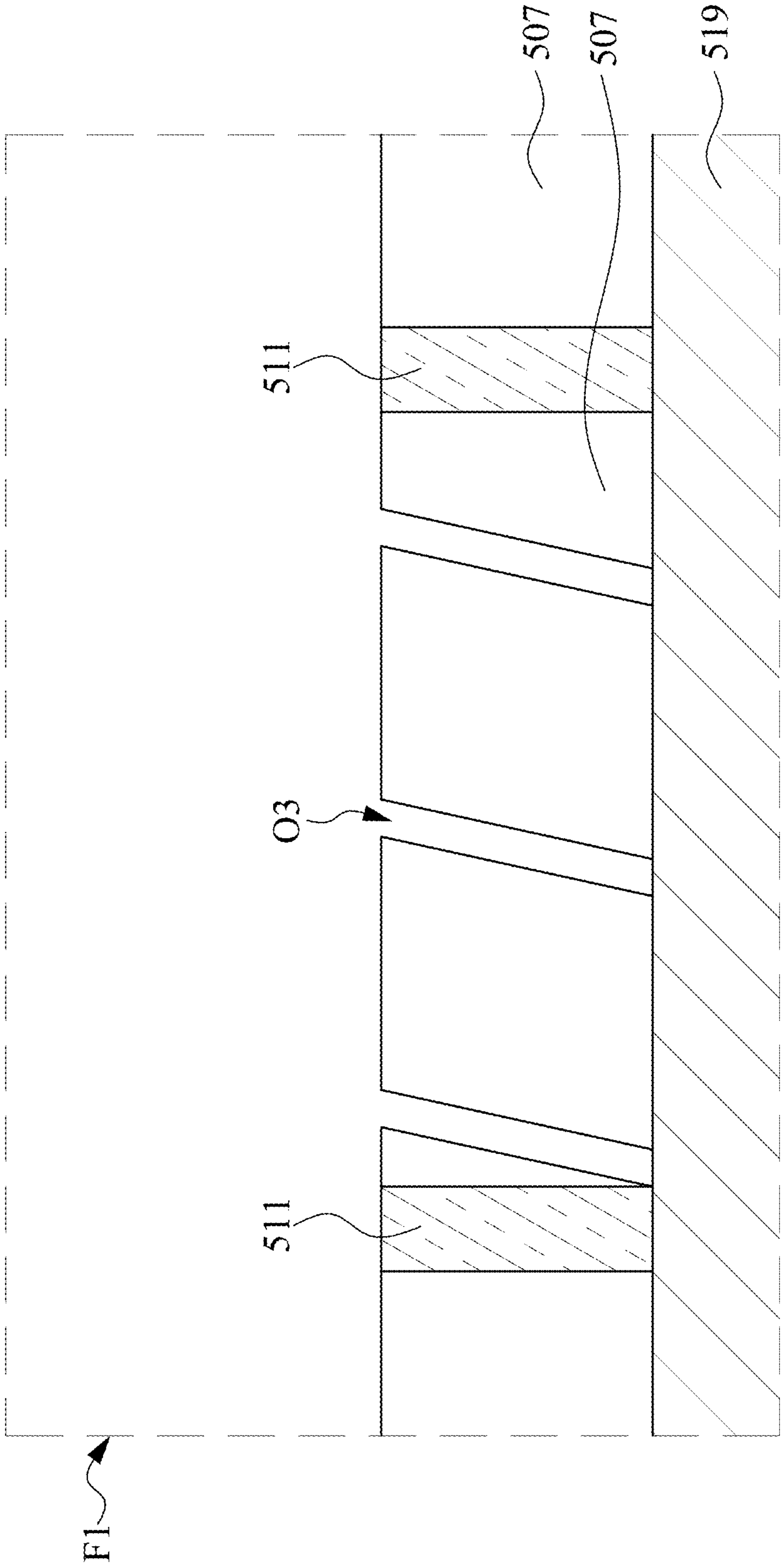

In FIG. 36, the hard mask layer 513 is removed by a hard mask etch process. The hard mask etch process may be an anisotropic dry etch process or a wet etch process. In some embodiments, the etch rate of the hard mask layer 513 of the hard mask etch process may be faster than the etch rate of the dielectric layer 507 of the hard mask etch process. For example, an etch rate ratio of the hard mask layer 513 to the dielectric layer 507 may be between about 100:1 and about 1.05:1, between about 100:1 and about 10:1, between about 50:1 and about 10:1, between about 30:1 and about 10:1, between about 20:1 and about 10:1, or between about 15:1 and about 10:1 during the hard mask etch process.

In some embodiments, a cleaning process and a passivation process may be performed on the slanted recesses O3 after the removal of the hard mask layer 513. The cleaning process may remove oxide. The cleaning process may include applying a mixture of hydrogen and argon as a remote plasma source onto the slanted recesses O3. A process temperature of the cleaning process may be between about 250° C. and about 350° C. A process pressure of the cleaning process may be between about 1 Torr and about 10 Torr. A bias energy may be applied to the equipment performing the cleaning process. The bias energy may be between about 0 W and 200 W.

The passivation process may include soaking the intermediate semiconductor device 2A after the cleaning process with a precursor such as dimethylaminotrimethylsilane, tetramethylsilane, or the like at a process temperature between about 200° C. and about 400° C. An ultraviolet radiation may be used to facilitate the passivation process. The passivation process may passivate the sidewalls of the dielectric layer 507 exposed through the slanted recesses O3 by sealing surface pores thereof. Undesirable sidewall growth, which may affect the electric characteristics of the semiconductor device 2A, may be reduced by the passivation process. As a result, the performance and reliability of the semiconductor device 2A may be increased.

In FIG. 37, a conductive layer 515 is formed to fill the slanted recesses O3. The conductive layer 515 is extended along a direction E1 (shown in FIG. 35). In some embodiments, the conductive layer 515 may be formed of, for example, tungsten, cobalt, zirconium, tantalum, titanium, aluminum, ruthenium, copper, metal carbides (e.g., tantalum carbide, titanium carbide, tantalum magnesium carbide), metal nitrides (e.g., titanium nitride), transition metal aluminides, or combinations thereof. The conductive layers 515 may be formed by a deposition process such as physical vapor deposition, chemical vapor deposition, atomic layer deposition, or sputtering. A planarization process, such as chemical mechanical polishing, may be performed until the top surface of the dielectric layer 507 is exposed to remove excess material and provide a substantially flat surface for subsequent processing steps.

In FIG. 38, a top conductive layer 521 is formed over the conductive layers 515. More specifically, the conductive layers 515 are etched, and the dielectric layer 507 within the conductive polymer materials 511 are etched. Top surfaces of the etched conductive layers 515 and the etched dielectric layer 507 are coplanar with each other. The top conductive layer 521 is then formed over the etched conductive layers 515 and the etched dielectric layer 507. The top conductive layer 521 may be formed by a damascene process. In some embodiments, a planarization process may be performed to level a top surface of the top conductive layer 521, the top surface of the conductive polymer materials 511, and the top surface of the dielectric layer 507.

In FIG. 39A, the first semiconductor die 500 is bonded to the second semiconductor die 600. Similar to the first semiconductor die 500, the second semiconductor die 600 includes a dielectric layer 603 is disposed over a semiconductor substrate 601, a barrier layer 617, a metal layer 619, a dielectric layer 607, a plurality of energy removable materials 653, a plurality of conductive polymer materials 611, a conductive layer 615, and a top conductive layer 621. For the sake of brevity, the details of the configuration of the second semiconductor die 600 are omitted.

The conductive polymer materials 511 and the top conductive layer 521 of the first semiconductor die 500 are bonded to the conductive polymer materials 611 and the top conductive layer 621 of the second semiconductor die 600, respectively. The energy removable materials 553 are bonded to the energy removable materials 633. In some embodiments, the dimensions of the conductive polymer materials 511, the top conductive layer 521, and the energy removable materials 553 are identical to the dimensions of the conductive polymer materials 611, the top conductive layer 621, and the energy removable materials 633. In some embodiments, the top conductive layer 521, the conductive layers 515, and the dielectric layer 507 are configured to be a conductive via of the first semiconductor die 500, and the top conductive layer 621, the conductive layers 615, and the dielectric layer 607 are configured to be a conductive via of the second semiconductor die 600. The conductive via in the first semiconductor die 500 is configured to be electrically connected to the conductive via in the second semiconductor die 600.

After the bonding process, the semiconductor device 2A is formed. In other embodiments, a heat treatment process may be performed to transform the energy removable materials 553 and 653 into energy removable structures G1 enclosing air gaps G2 as illustrated in FIG. 39B.

Reference is made to FIG. 40 to FIG. 49. FIG. 40 to FIG. 48 are schematic diagrams of intermediate semiconductor device 2B according to some embodiments of the present disclosure. FIG. 49 is a schematic diagram of the semiconductor device 2B according to some embodiments of the present disclosure.

The semiconductor device 2B includes a bottom portion BT and an upper portion UT. The bottom portion BT includes a first stack structure 1S on a substrate 701, a middle insulation layer 723 over the first stack structure 1S, and inner spacers 709 disposed on the opposite sides of the first stack structure 1S. The upper portion UT includes a second stack structure 2S on the middle insulation layer 723. The bottom portion BT further includes a conductive plug 800 along the middle insulation layer 723 and electrically coupled the upper portion UT and the bottom portion BT. In some embodiments, the semiconductor device 2B applies the semiconductor devices 1A to be the conductive plug 800. In various embodiments, the semiconductor device 2B applies one of the semiconductor devices 1B to 1H to be the conductive plug 800.

Figure 41:
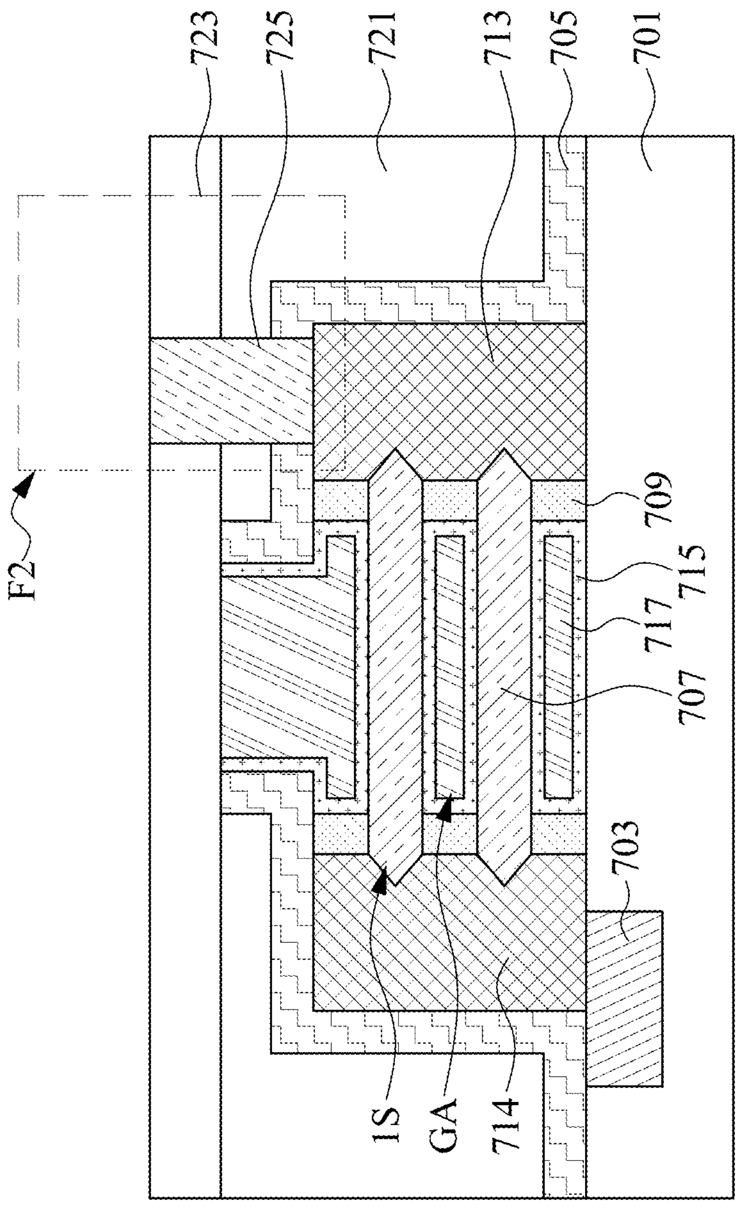

In FIG. 41, the bottom portion BT is provided. The bottom portion BT includes first stack structure 1S on a substrate 701, a first impurity region 713, a second impurity region 714, a buried bit line 703, a first insulation material 705, and a first insulation layer 721.

The buried bit line 703 is formed in the substrate 701. The first stack structure 1S is formed on the substrate 701. The first stack structure 1S is not overlapped with the buried bit line 703. The first impurity region 713 and a second impurity region 714 are formed on the opposite sides of the first stack structure 1S, and the second impurity region 714 is electrically connected to the buried bit line 703.

The first insulation material 705 is formed to cover the substrate 701, the first impurity region 713, the second impurity region 714, and the first stack structure 1S.

The first stack structure 1S includes a plurality of gate assemblies GA, and each of gate assembly GA includes a gate dielectric 715, a gate electrode 717, and a semiconductor layer 707. The first impurity region 713 and the second impurity region 714 are electrically connected to the semiconductor layers 707. More specifically, two ends of each semiconductor layers 707 protrude from the inner spacer 709, therefore, the ends of the semiconductor layers 707 are able to electrically couple to the first impurity region 713 and the second impurity region 714.

In FIG. 41, a dielectric layer 725 penetrates through the middle insulation layer 723, the first insulation layer 721, and the first insulation material 705, and is in contact with the first impurity region 713.

Figure 42:
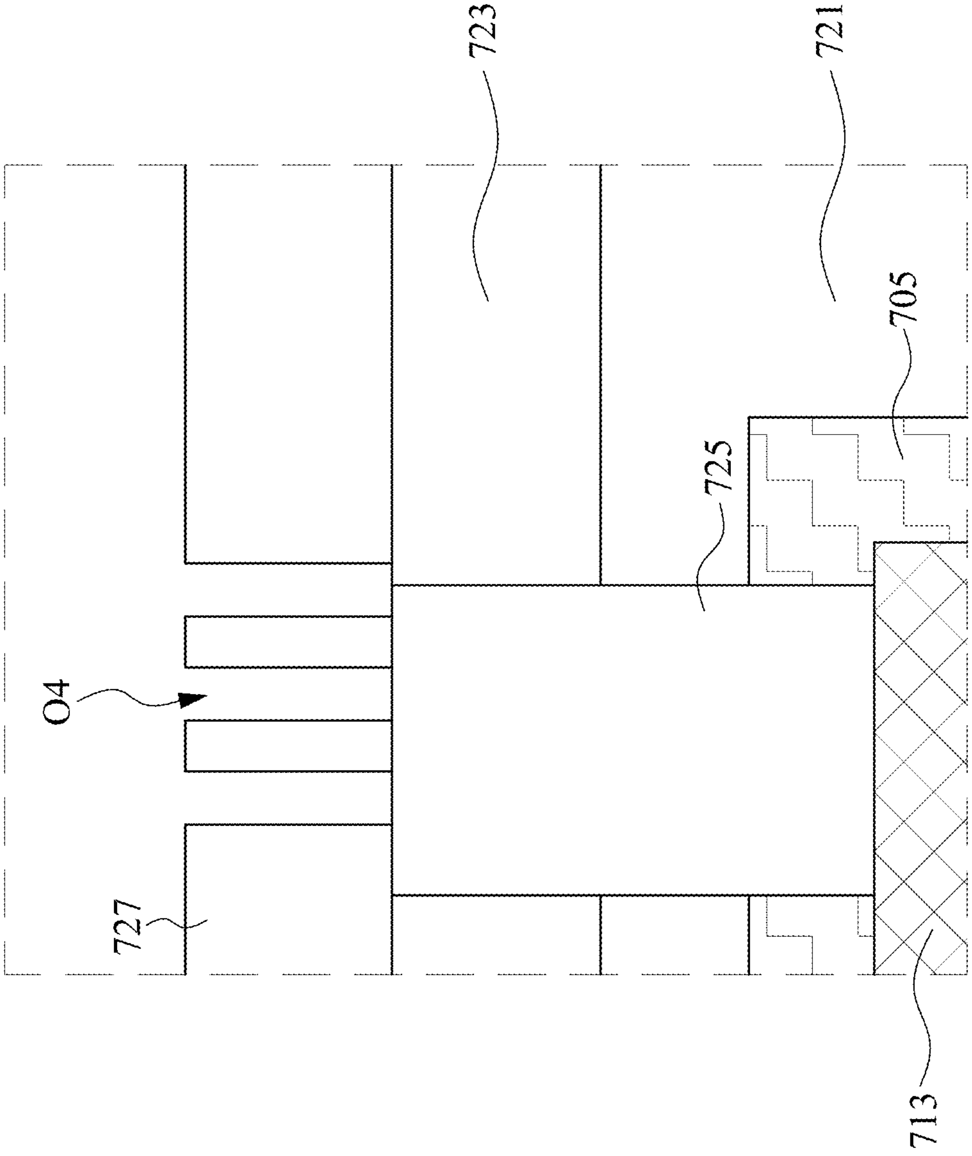

In FIG. 42, a region enclosed by a virtual frame F2 shown in FIG. 41 is illustrated. In the virtual frame F2, a hard mask layer 727 is disposed over the bottom portion BT of the semiconductor device 2B. The hard mask layer 727 is patterned to have openings O4 over the dielectric layer 725. A portion of the dielectric layer 725 is exposed by the opening O4.

Figure 43:
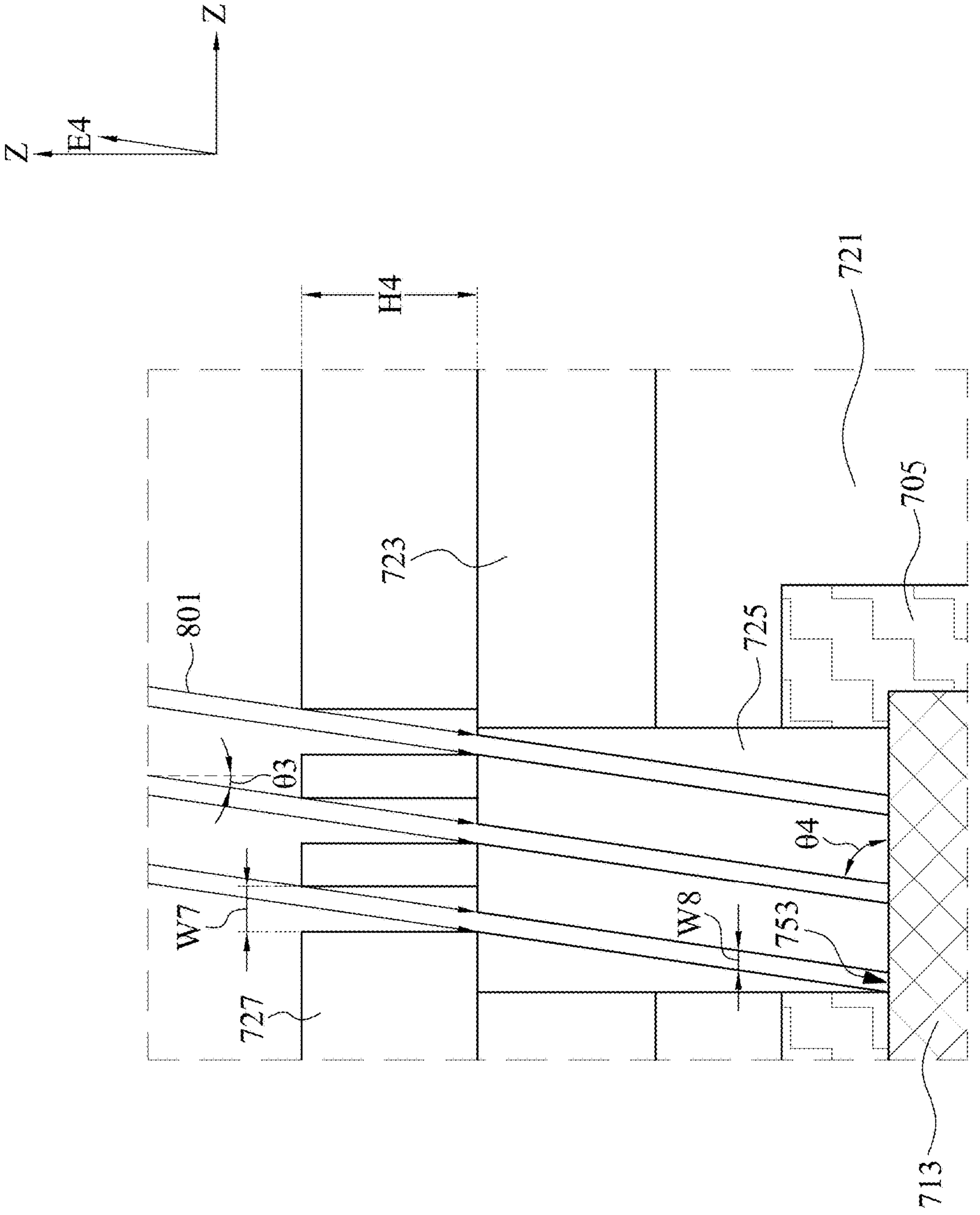

In FIG. 43, a slanted etch process 801 is performed to form slanted recesses O5 (shown in FIG. 44) in the dielectric layer 725. The slanted etch process 801 may use the hard mask layer 727 as pattern guides to remove portions of the dielectric layer 725 and concurrently form the slanted recesses O5 along the dielectric layer 725. The angle of incidence O3 of the slanted etch process 801 may be define by a width W7 of the openings O4 and a height H4 of the dielectric layer 725.

In some embodiments, the angle of incidence O3 of the slanted etch process 801 may be between about 5 degrees and about 80 degrees. In some embodiments, the angle of incidence O3 may be between about 20 degrees and about 60 degrees. In some embodiments, the angle of incidence O3 may be between about 20 degrees and about 40 degrees.

In some embodiments, the slanted etch process 801 may be an anisotropic etch process such as a reactive ion etching process. The reactive ion etching process may include etchant gases and passivation gases which may suppress the isotropic effect to limit the removal of material in the horizontal direction. The etchant gases may include chlorine gas and boron trichloride. The passivation gases may include fluoroform or other suitable halocarbons. In some embodiments, the hard mask layer 727 formed of carbon film may serve as a halocarbon source for the passivation gases of the reactive ion etching process.

In some embodiments, the etch rate of the dielectric layer 725 of the slanted etch process 801 may be faster than the etch rate of the hard mask layer 727 of the slanted etch process 801. For example, an etch rate ratio of the dielectric layer 725 to the hard mask layer 727 may be between about 100:1 and about 1.05:1, between about 100:1 and about 10:1, between about 50:1 and about 10:1, between about 30:1 and about 10:1, between about 20:1 and about 10:1, or between about 15:1 and about 10:1 during the slanted etch process 801.

A width W8 of the slanted recesses O5 is less than the width W7 of the openings O4. The acute angles θ4 between a bottom surface 735 and a sidewall of the slanted recesses O5 may be between about 10 degrees and about 85 degrees, between about 20 degrees and about 80 degrees, between about 45 degrees and about 80 degrees, between about 60 degrees and about 80 degrees, and between about 70 degrees and about 80 degrees. In some embodiments, the bottom surface 735 is also a top surface of the first impurity region 713.

Figure 44:
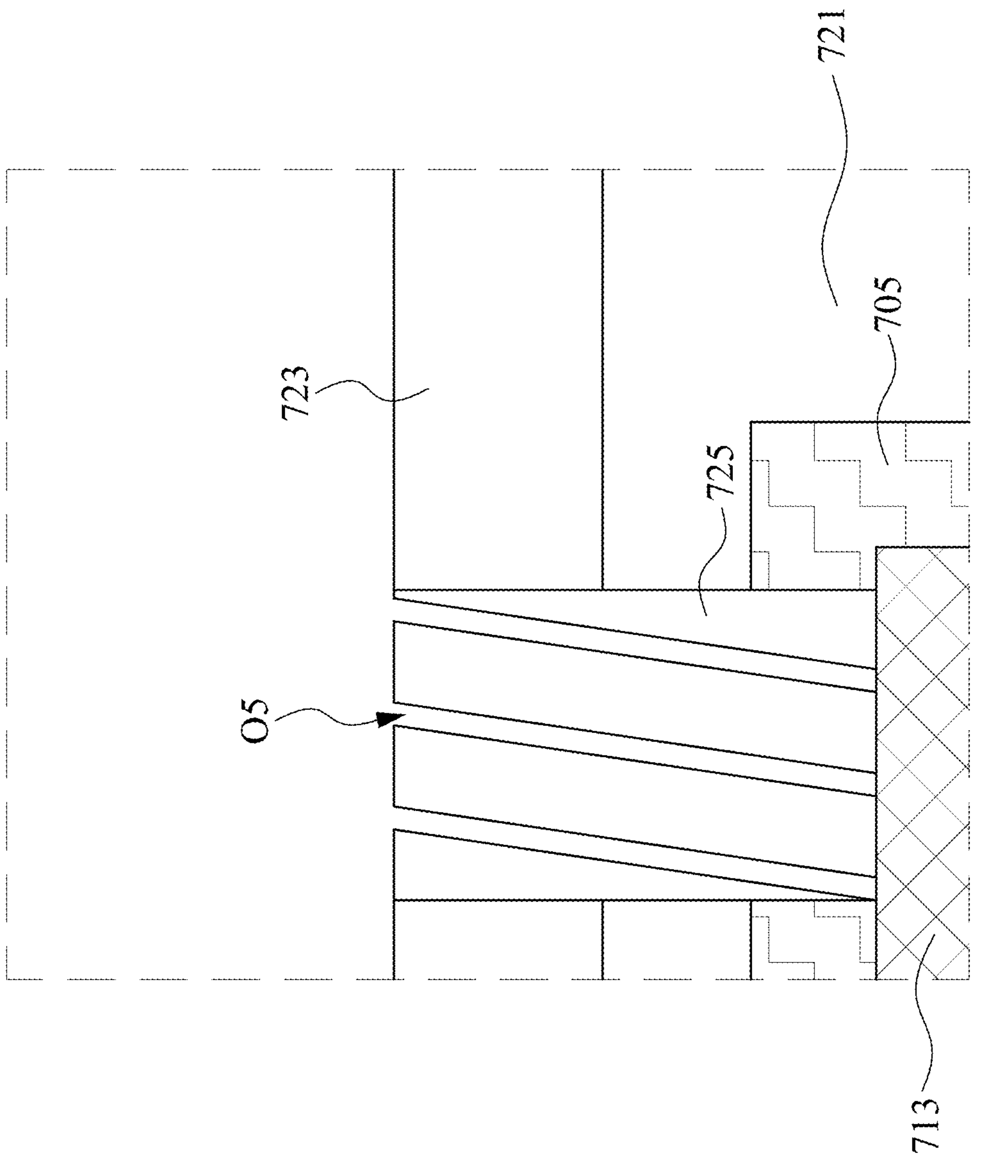

In FIG. 44, the hard mask layer 727 is removed by a hard mask etch process. The hard mask etch process may be an anisotropic dry etch process or a wet etch process. In some embodiments, the etch rate of the hard mask layer 727 of the hard mask etch process may be faster than the etch rate of the dielectric layer 725 and the middle insulation layer 723 of the hard mask etch process. For example, an etch rate ratio of the hard mask layer 727 to the dielectric layer 725 may be between about 100:1 and about 1.05:1, between about 100:1 and about 10:1, between about 50:1 and about 10:1, between about 30:1 and about 10:1, between about 20:1 and about 10:1, or between about 15:1 and about 10:1 during the hard mask etch process.

In some embodiments, a cleaning process and a passivation process may be performed on the slanted recesses O5 after the removal of the hard mask layer 727. The cleaning process may remove oxide. The cleaning process may include applying a mixture of hydrogen and argon as a remote plasma source onto the slanted recesses O5. A process temperature of the cleaning process may be between about 250° C. and about 350° C. A process pressure of the cleaning process may be between about 1 Torr and about 10 Torr. A bias energy may be applied to the equipment performing the cleaning process. The bias energy may be between about 0 W and 200 W.

The passivation process may include soaking the intermediate semiconductor device 2B after the cleaning process with a precursor such as dimethylaminotrimethylsilane, tetramethylsilane, or the like at a process temperature between about 200° C. and about 400° C. An ultraviolet radiation may be used to facilitate the passivation process. The passivation process may passivate the sidewalls of the dielectric layer 725 exposed through the slanted recesses O5 by sealing surface pores thereof. Undesirable sidewall growth, which may affect the electric characteristics of the semiconductor device 2B, may be reduced by the passivation process. As a result, the performance and reliability of the semiconductor device 2B may be increased.

Figure 45:
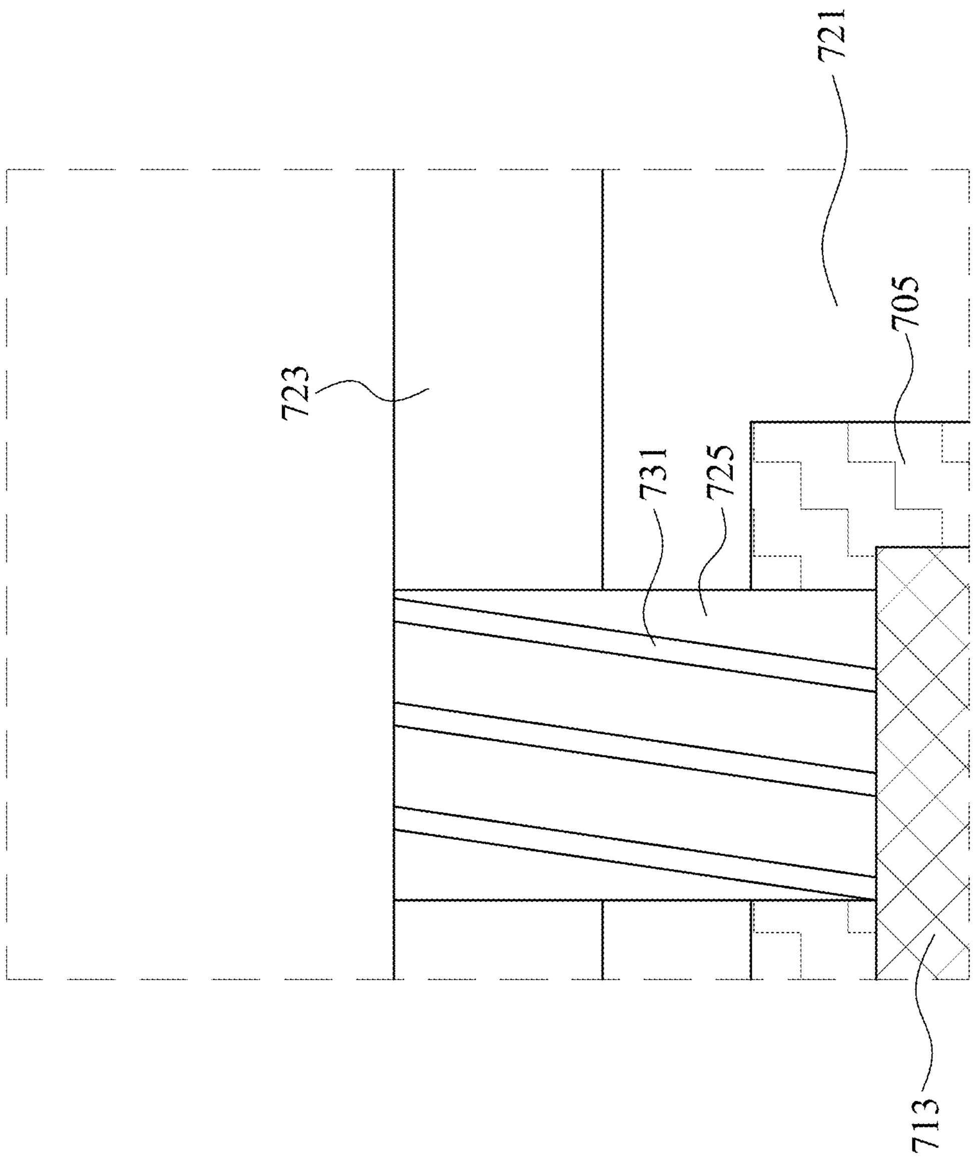

In FIG. 45, a conductive layer 731 is formed to fill the slanted recesses O5. The conductive layer 731 is extended along a direction E4 (shown in FIG. 43). In some embodiments, the conductive layer 731 may be formed of, for example, tungsten, cobalt, zirconium, tantalum, titanium, aluminum, ruthenium, copper, metal carbides (e.g., tantalum carbide, titanium carbide, tantalum magnesium carbide), metal nitrides (e.g., titanium nitride), transition metal aluminides, or combinations thereof. The conductive layers 731 may be formed by a deposition process such as physical vapor deposition, chemical vapor deposition, atomic layer deposition, or sputtering. A planarization process, such as chemical mechanical polishing, may be performed until the top surface of the dielectric layer 725 is exposed to remove excess material and provide a substantially flat surface for subsequent processing steps.

Figure 46:
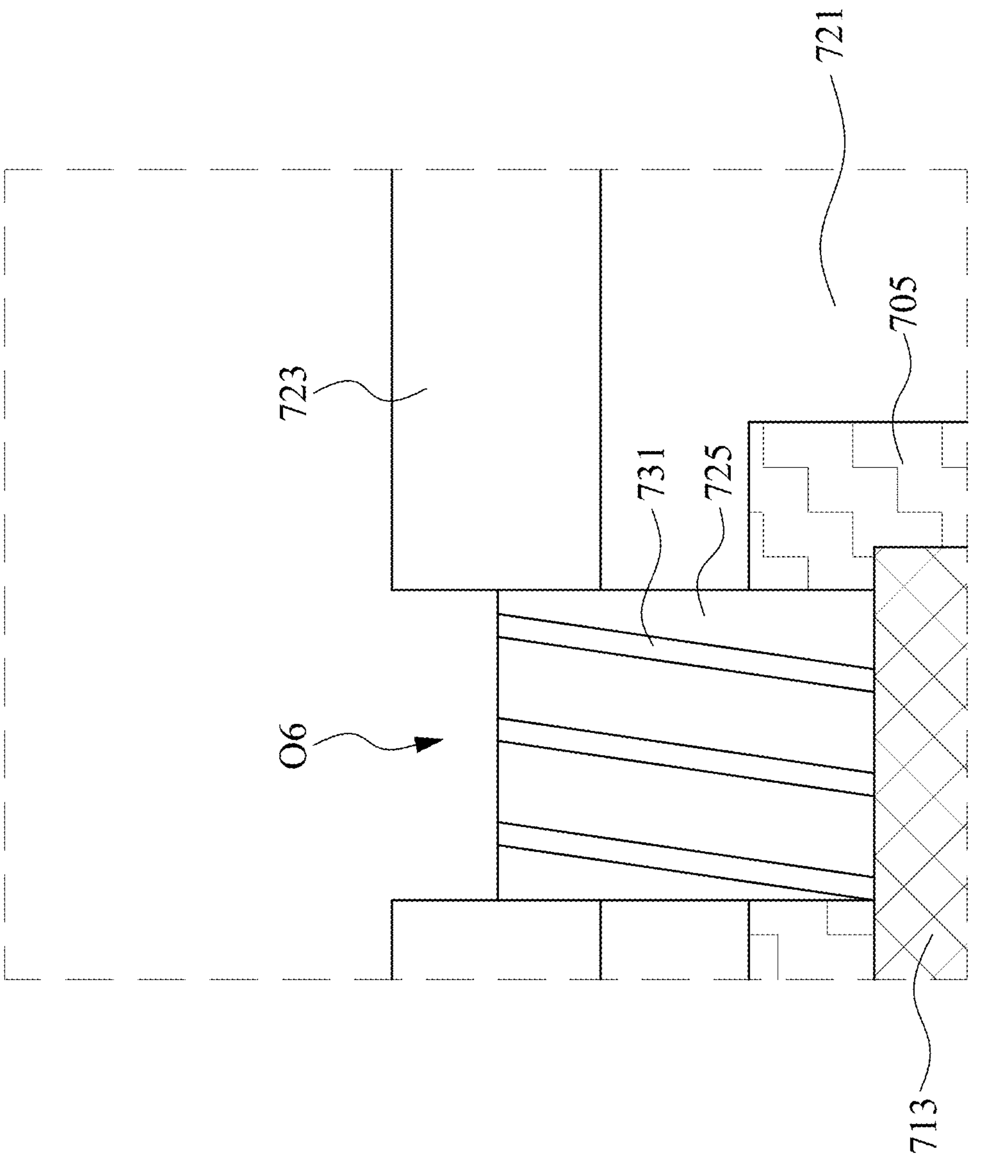

In FIG. 46, the dielectric layer 725 and the conductive layers 731 are etched to form an opening O6. In some embodiments, a bottom end of the opening O6 is higher than a bottom surface of the middle insulation layer 723.

Figure 47:
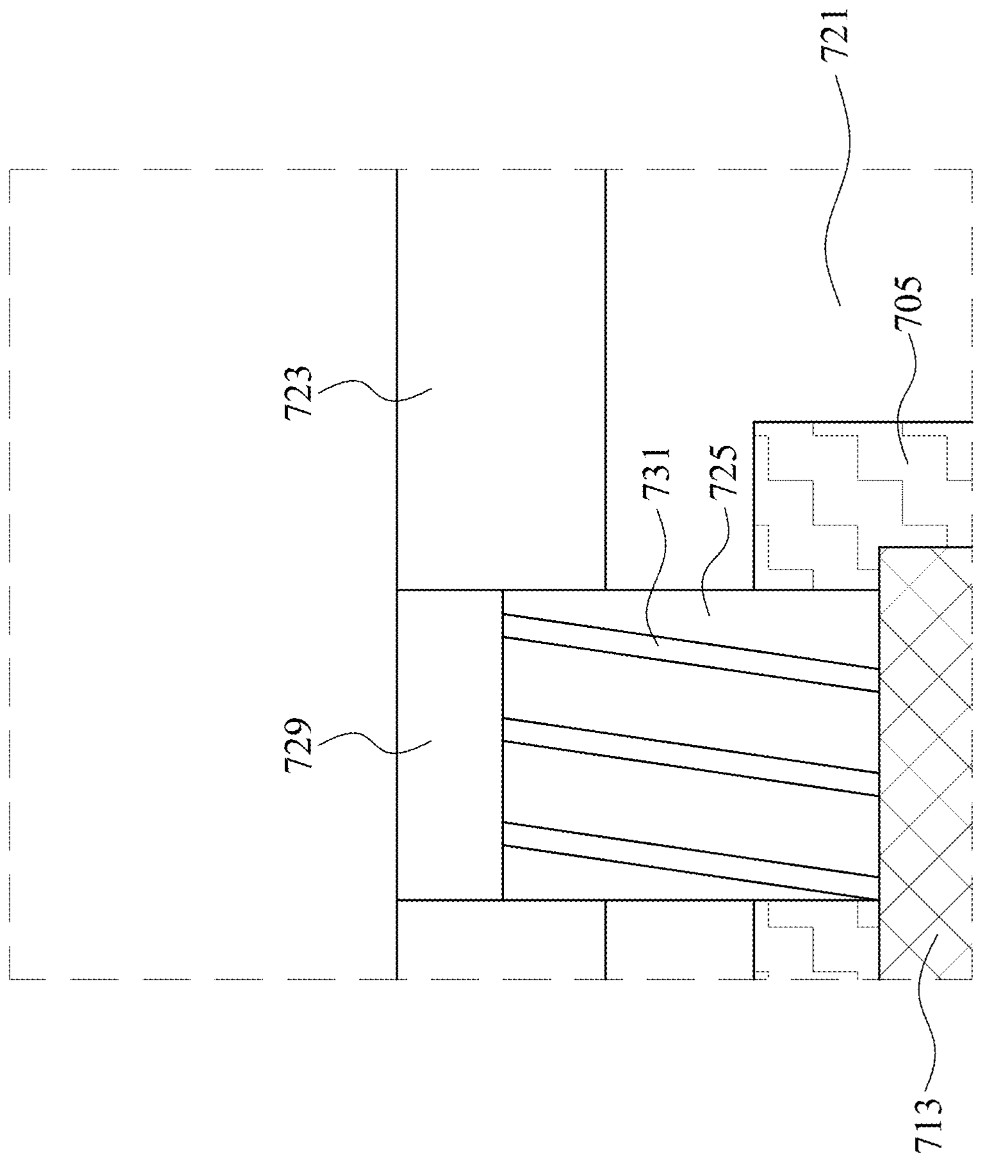

In FIG. 47, a top conductive layer 729 is formed over the conductive layers 731. In some embodiments, the top conductive layer 729 is formed by a damascene process. In some embodiments, a planarization process may be performed to level a top surface of the top conductive layer 927 and a top surface of the middle insulation layer 723.

Figure 48:
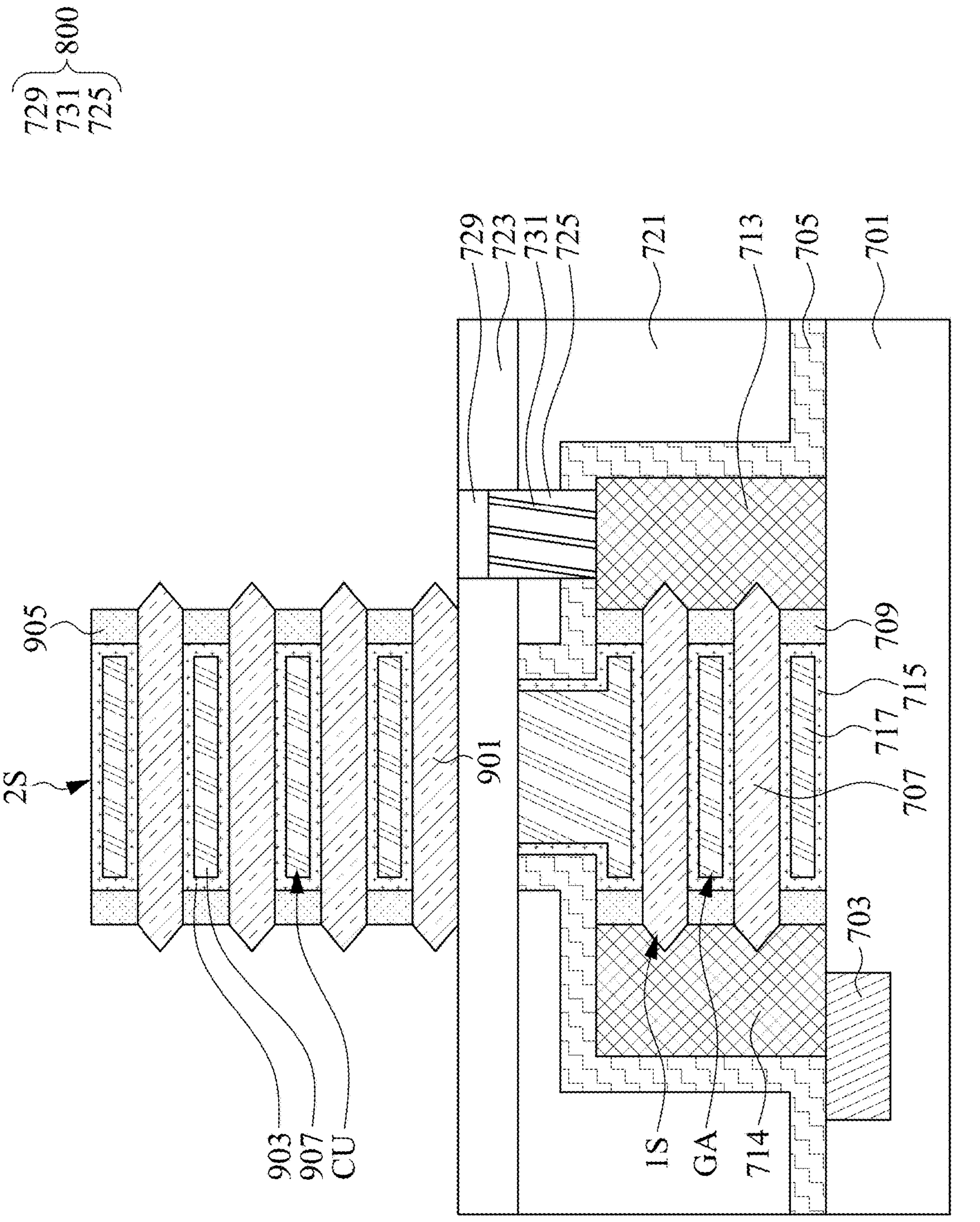

In FIG. 48, the upper portion UT of the semiconductor device 2B is disposed over the bottom portion BT of the semiconductor device 2B. The upper portion UT of the semiconductor device 2B includes the second stack structure 2S, a third impurity region 909, and a fourth impurity region 911 (shown in FIG. 49).

A capacitor dielectric 903 and a capacitor electrode 907 together configure a capacitor sub-unit CU. The second stack structure 2S includes a plurality of capacitor sub-units CU, a plurality semiconductor layers 901, and inner spacers 905 disposed on the opposite sides of the second stack structure 2S. Adjacent capacitor sub-units CU may be separated by the corresponding semiconductor layer 901 interposed therebetween.

It should be noted that the bottommost semiconductor layer 901 is not in contact with the top conductive layer 729. In other words, the second stack structure 2S is not in direct contact with the top conductive layer 729.

In FIG. 49, the third impurity region 909 and the fourth impurity region 911 are formed on opposite sides of the second stack structure 2S. The third impurity region 909 may be electrically connected to the top conductive layer 729. Because two ends of each semiconductor layers 901 protrude from the inner spacer 905, therefore, the ends of the semiconductor layers 901 are able to electrically couple to the third impurity region 909 and the fourth impurity region 911. In some embodiments, the third impurity region 909 and the fourth impurity region 911 may be operatively associated with the plurality of semiconductor layers 901.

In some embodiments, the second stack structure 2S may serve as a memory to storage binary information such as "1" or "0". The second stack structure 2S may be referred to as dielectric-all-around type capacitor. The plurality of semiconductor layers 707 may be serve as one electrode of a capacitor structure. The capacitor electrode 907 may be serve as the other electrode of the capacitor structure. The capacitor dielectric 903 may be serve as the insulation layer to separate the two electrodes of the capacitor structure.

One aspect of the present disclosure provides a semiconductor device including a first die and a second die. The first die includes a first dielectric layer disposed over a first substrate, a second dielectric layer disposed over the first dielectric layer, a first metal layer disposed in the first dielectric layer, and a first conductive via disposed in the second dielectric layer. The firs conductive via includes conductive layers and a top conductive layer electrically coupled to the conductive layers. Each of the plurality of conductive layers are extended along a direction. The direction and a top surface of the first die form an acute angle greater than 0 degrees. The second die is bonded to the first die by bonding the second conductive via to the first conductive via.

Another aspect of the present disclosure provides a semiconductor device including a bottom portion and an upper portion. The bottom portion includes a first stack structure, a first impurity region, and a conductive plug. The upper portion is disposed over the bottom portion, and includes a second stack structure and a second impurity region. The first stack structure includes gate assemblies coupled to the first impurity region, and the second stack structure includes capacitor sub-units coupled to the second impurity region. The first impurity region is electrically coupled to the second impurity region through the conductive plug. The conductive plug includes conductive layer and a top conductive layer electrically coupled to the conductive layers. Each of the plurality of conductive layers are extended along a direction. The direction and a top surface of the top conductive layer form an acute angle.

Another aspect of the present disclosure provides a method for fabricating a semiconductor device including: forming a first die, forming a second die; and bonding the second die to the first die. Forming the first die includes: forming a first dielectric layer over a first substrate; forming a first metal layer in the first dielectric layer; forming a second dielectric layer over the first dielectric; and forming a first conductive via in the second dielectric layer. Forming the first conductive via in the second dielectric layer includes: forming a third dielectric layer in the second dielectric layer; performing a first slanted etch process to form a plurality of first openings in the third dielectric; forming a plurality of first conductive layers in the plurality of first openings; and forming a first top conductive layer over the plurality of first conductive layers and the third dielectric layer. The first conductive layers are extended along a first direction, wherein the first direction and a top surface of the first die form a first acute angle greater than 0 degrees.

Due to the design of the semiconductor device of the present disclosure, the first slanted conductive layers 201 may provide more contact surface to the substrate 101. Therefore, the electrical characteristics of the semiconductor device 1A may be improved. That is, the performance of the semiconductor device 1A may be improved. In addition, the narrower first slanted recesses 305 may be formed using first hard mask layer 301 having wider first hard mask openings 303. In other words, the requirements of photolithography process for forming the narrower first slanted recesses 305 may be alleviated. As a result, the yield of the semiconductor device 1A may be improved.

Although the present disclosure and its advantages have been described in detail, it should be understood that various changes, substitutions and alterations can be made herein without departing from the spirit and scope of the disclosure as defined by the appended claims. For example, many of the processes discussed above can be implemented in different methodologies and replaced by other processes, or a combination thereof.

Moreover, the scope of the present application is not intended to be limited to the particular embodiments of the process, machine, manufacture, composition of matter, means, methods and steps described in the specification. As one of ordinary skill in the art will readily appreciate from the disclosure of the present disclosure, processes, machines, manufacture, compositions of matter, means, methods, or steps, presently existing or later to be developed, that perform substantially the same function or achieve substantially the same result as the corresponding embodiments described herein may be utilized according to the present disclosure. Accordingly, the appended claims are intended to include within their scope such processes, machines, manufacture, compositions of matter, means, methods, and steps.

What is claimed is:

1. A semiconductor device, comprising:

a bottom portion, comprising a first stack structure, a first impurity region adjacent to the first stack structure, and a conductive plug; and an upper portion, disposed over the bottom portion, comprising a second stack structure on top of the first stack structure and a second impurity region which is positioned adjacent to the second stack structure and on top of the first impurity region, wherein the first stack structure comprises a plurality of gate assemblies coupled to the first impurity region, and the second stack structure comprises a plurality of capacitor sub-units coupled to the second impurity region, wherein the conductive plug is upwardly extended from the first impurity region to the second impurity region, wherein the first impurity region is electrically coupled to the second impurity region through the conductive plug, wherein the conductive plug comprises:

a plurality of conductive layer;

a dielectric layer surrounding the plurality of conductive layers; and a top conductive layer, electrically coupled to the plurality of conductive layers, wherein the second stack structure is not in direct contact with the top conductive layer;

wherein each of the plurality of conductive layers are extended along a direction, wherein the direction and a top surface of the first impurity region form an acute angle.

2. The semiconductor device of claim 1, wherein the bottom portion further comprises:

a substrate; and a middle insulation layer, wherein the first stack structure is disposed over the substrate, and the middle insulation layer is disposed over the first stack structure, wherein the second stack structure is stacked on the middle insulation layer, such that the middle insulation layer is positioned between the first stack structure and the second stack structure;

wherein the conductive plug penetrates through the middle insulation layer to be in contact with the first impurity region.

3. The semiconductor device of claim 2, wherein the bottom portion further comprises:

a buried bit line, buried in the substrate;

a third impurity region, wherein the first impurity region and the third impurity region are disposed on opposite sides of the first stack structure;

wherein the first stack structure is not overlapped with the buried bit line;

wherein the third impurity region is in contact with and electrically connect to the buried bit line;

a insulation material, disposed over the first stack structure, the first impurity region, the third impurity region, and the substrate; and an insulation layer, disposed over the insulation material, wherein the middle insulation layer is in contact with the insulation layer, the insulation material, and the first stack structure.

4. The semiconductor device of claim 3, wherein the conductive plug further penetrates the insulation layer and insulation material.

5. The semiconductor device of claim 1, wherein each of the plurality of conductive layers are separated from each other by the dielectric layer, wherein the dielectric layer has a plurality of slanted recesses extended from a top surface of the dielectric layer to a bottom surface thereof to receive the plurality of conductive layers in the slanted recesses respectively, wherein the top surface of the dielectric layer is in direct contact with the top conductive layer while the bottom surface of the dielectric layer is in direct contact with the first impurity region.

6. The semiconductor device of claim 5, wherein the first impurity region is in contact with the plurality of conductive layers and the dielectric layer, the second impurity region is in contact with the top conductive layer, wherein the top surface of the dielectric layer is coplanar with top surfaces of the plurality of conductive layers.

7. The semiconductor device of claim 1, wherein the upper portion further comprises a fourth impurity region on top of the second impurity region, wherein the second impurity region and the fourth impurity region are disposed on opposite sides of the second stack structure.

8. The semiconductor device of claim 3, wherein each of the plurality of gate assemblies comprises:

a gate electrode;

a gate dielectric, enclosing the gate electrode; and a first semiconductor layer having two ends extended to the first impurity region and the third impurity region respectively to electrically connect the first impurity region with the third impurity region via the first semiconductor layer.

9. The semiconductor device of claim 8, wherein the first stack structure further comprises:

a first inner spacer positioned between the first impurity region and the first stack structure; and a second inner spacer positioned between the third impurity region and the first stack structure, wherein the first inner spacer and the second inner spacer are disposed on opposite sides of the first stack structure, wherein the first semiconductor layer of plurality of gate assemblies protrudes from the first inner spacer and the second inner spacer, and protruding portions of the first semiconductor layer at the two ends thereof are electrically coupled to the first impurity region and the third impurity region.

10. The semiconductor device of claim 7, wherein each of the plurality of capacitor sub-units comprises:

a capacitor electrode; and a capacitor dielectric, enclosing the capacitor electrode, wherein the second stack structure further comprises a plurality of second semiconductor layers, wherein the plurality of second semiconductor layers and the plurality of capacitor sub-units are interposed;

wherein each of the second semiconductor layers has two ends extended to the second impurity region and the fourth impurity region respectively to electrically connect the second impurity region with the fourth impurity region via the second semiconductor layer;

wherein the second semiconductor layers are not in contact with the top conductive layer.

11. The semiconductor device of claim 10, wherein the second stack structure further comprises:

a third inner spacer positioned between the second impurity region and the second stack structure; and a fourth inner spacer positioned between the fourth impurity region and the second stack structure, wherein the third inner spacer and the fourth inner spacer are disposed on opposite sides of the second stack structure, wherein each of the second semiconductor layers protrudes from the third inner spacer and the fourth inner spacer, and protruding portions of the each of the second semiconductor layers at the two ends thereof are electrically coupled to the second impurity region and the fourth impurity region.

* * * * *